US012430477B2

(12) United States Patent
Bandara et al.

(10) Patent No.: US 12,430,477 B2
(45) Date of Patent: Sep. 30, 2025

(54) TECHNIQUES FOR AUTOMATICALLY DESIGNING STRUCTURAL SYSTEMS FOR ARBITRARILY SHAPED BUILDINGS

(71) Applicant: AUTODESK, INC., San Francisco, CA (US)

(72) Inventors: Konara Mudiyanselage Kosala Bandara, Beckenham (GB); Musabbir Abdul Majeed, Milton Keynes (GB); Jayamal Bandara Wijeratne Rajapakse Konara Mudiyanselage, Brentwood (GB)

(73) Assignee: AUTODESK, INC., San Francisco, CA (US)

( * ) Notice: Subject to any disclaimer, the term of this patent is extended or adjusted under 35 U.S.C. 154(b) by 805 days.

(21) Appl. No.: 17/324,920

(22) Filed: May 19, 2021

(65) Prior Publication Data
US 2022/0198083 A1    Jun. 23, 2022

Related U.S. Application Data

(63) Continuation-in-part of application No. 17/127,479, filed on Dec. 18, 2020, now Pat. No. 12,197,822.

(60) Provisional application No. 63/171,018, filed on Apr. 5, 2021.

(51) Int. Cl.
*G06F 30/13* (2020.01)
(52) U.S. Cl.
CPC .................................. *G06F 30/13* (2020.01)
(58) Field of Classification Search
CPC ........... G06F 30/00; G06F 30/13; G06F 30/20

USPC .............................................................. 703/1
See application file for complete search history.

(56) References Cited

U.S. PATENT DOCUMENTS

| 5,815,394 | A  | 9/1998 | Adeli et al. |
| 7,321,364 | B2 | 1/2008 | Manson |
| 8,825,458 | B2 | 9/2014 | Bumbalough et al. |
| 11,080,438 | B2 | 8/2021 | Gao et al. |

(Continued)

FOREIGN PATENT DOCUMENTS

| AU | 2020200358 B2 | 4/2022 |
| CN | 101144711 A | 3/2008 |

(Continued)

OTHER PUBLICATIONS

Laignel, Graziella et al., "Floor Plan Generation Through a Mixed Constraint Programming-Genetic Optimization Approach", Dec. 15, 2020, Automation in Construction, Elsevier L.V. (Year: 2020).*

(Continued)

*Primary Examiner* — Cedric Johnson
(74) *Attorney, Agent, or Firm* — Artegis Law Group, LLP

(57) ABSTRACT

In various embodiments, a grid-based design application automatically generates a design for a structural system of a building. In operation, the grid-based design application generates a structural grid based on a region within a computer-aided design of the building. Subsequently, the grid-based design application applies the structural grid to the region to generate a gridded region. The grid-based design application computes a set of spanning directions based on the gridded region. The grid-based design application then generates at least a portion of the design for the structural system based on the set of spanning directions and the gridded region.

20 Claims, 20 Drawing Sheets

Non-Load Bearing Walls 1696 = ------

(56) References Cited

U.S. PATENT DOCUMENTS

| | | |
|---|---|---|
| 2002/0009223 A1 | 1/2002 | Wong |
| 2004/0073410 A1 | 4/2004 | Maly et al. |
| 2009/0073160 A1 | 3/2009 | Wong et al. |
| 2010/0014716 A1 | 1/2010 | Chae et al. |
| 2013/0185026 A1 | 7/2013 | Vanker et al. |
| 2014/0144102 A1 | 5/2014 | Chen |
| 2016/0275209 A1 | 9/2016 | Kelly et al. |
| 2016/0350444 A1 | 12/2016 | Sarao et al. |
| 2017/0084077 A1 | 3/2017 | Liu et al. |
| 2018/0032645 A1 | 2/2018 | Wright et al. |
| 2018/0032647 A1 | 2/2018 | Wright et al. |
| 2019/0266293 A1 | 8/2019 | Ishida et al. |
| 2021/0056242 A1 | 2/2021 | De Zaeytijd et al. |
| 2021/0287138 A1 | 9/2021 | Chang et al. |
| 2021/0383034 A1 | 12/2021 | Jo |
| 2021/0407111 A1 | 12/2021 | Lee et al. |
| 2022/0198081 A1 | 6/2022 | Bandara |
| 2022/0198082 A1 | 6/2022 | Bandara |
| 2022/0198083 A1 | 6/2022 | Bandara et al. |
| 2022/0198092 A1 | 6/2022 | Bandara |
| 2022/0198095 A1 | 6/2022 | Bandara |

FOREIGN PATENT DOCUMENTS

| | | |
|---|---|---|
| CN | 102938066 A | 2/2013 |
| CN | 108920765 A | 11/2018 |
| CN | 109670469 A | 4/2019 |
| CN | 110189412 A | 8/2019 |
| CN | 110335282 A | 10/2019 |
| CN | 111382755 A | 7/2020 |
| CN | 111508074 A | 8/2020 |
| CN | 111598972 A | 8/2020 |
| CN | 111859502 A | 10/2020 |
| CN | 112017199 A | 12/2020 |
| CN | 112037224 A | 12/2020 |
| CN | 115107280 A | 9/2022 |
| JP | H11250118 A | 9/1999 |
| JP | 2002-021176 A | 1/2002 |
| JP | 2004-318311 A | 11/2004 |

OTHER PUBLICATIONS

Nimtawat, Anan et al., "Automated Layout Design of Beam-Slab Floors using a Genetic Algorithm", 2009, Computers and Structures 87, Elsevier. Ltd. (Year: 2009).*

Collins, Ethan et al., "Proposed Design for the WPI Foisie Innovation Studio", Mar. 23, 2016. (Year: 2016).*

Sherif, Mohamed et al., "Automated BIM-Based Structural Design and Cost Optimization Model for Reinforced Concrete Buildings", 2022, Department of Construction Engineering, The American University in Cairo, New Cairo, Egypt, Scientific Reports, Nature Portfolio. (Year: 2022)*

Extended European Search Report for Application No. 22165427.0 dated Sep. 2, 2022.

Nimtawat et al., "Automated Layout Design of Beam-Slab Floors using a Genetic Algorithm", doi: 10.1016/j.compstruc.2009.06.007, Computers and Structures, vol. 87, Nov. 1, 2009, pp. 1308-1330.

Laignel et al., "Floor plan Generation through a Mixed Constraint Programming-Genetic Optimization Approach", DOI:10.1016/J.AUTCON.2020.103491, vol. 123, Dec. 15, 2020, 21 pages.

Final Office Action received for U.S. Appl. No. 17/127,533 dated Aug. 16, 2023, 37 pages.

Specification for Structural Steel Buildings, American Institute of Steel Construction, vol. 16, No. 1, Jul. 7, 2016, Revised Version, 2019, 680 pages.

Final Office Action received for U.S. Appl. No. 17/127,500 dated Jul. 24, 2023, 58 pages.

Zalka, Karoly A., "Global Structural Analysis of Buildings", First published 2000 by E & FN Spon, 2000, 335 pages.

Smith et al., "Tall Buildings Structures : Analysis and Design", A Wiley-Interscience Publication, Jan. 1991, 289 pages.

Gustafson, Michael, "Re-engineering structural analysis for the future", Engineering And Design structural Analysis, Retrieved from https://blogs.autodesk.com/bim-and-beam/2017/05/16/autodesk-structural-analysis/, on Sep. 6, 2021, May 16, 2017, 7 pages.

The European Union, "Eurocode 1: Actions on structures—Part 1-1: General actions—Densities, self-weight, imposed oads for buildings", ICS 91.010.30, Retrieved from https://www.phd.eng.br/wp-content/uploads/2015/12/en.1991.1.1.2002.pdf, Apr. 2002, 47 pages.

Tomasetti, Thornton, "Asterisk", Retrieved from https://asterisk.thorntontomasetti.com/, on Sep. 6, 2021, 2019, 9 pages.

Preplan, "Optimal concrete structure | Automated design", Retrieved from https://www.structure-pal.com/preplan, on Sep. 6, 2021, 3 pages.

Hypar, "Features", Retrieved from https://hypar.io/about/features, on Sep. 7, 2021, 1 page.

Maher et al., "Expert Systems for Structural Design", Journal of Computing in Civil Engineering, vol. 1, No. 4, Oct. 1987, pp. 270-283.

Sriram et al., "Knowledge-Based Expert Systems in Structural Design", Trends In Engineering Software And Hardware, Computers & Structures, vol. 20, No. 1-3, 1985, pp. 1-9.

Nimtawat et al., "A genetic algorithm for beam-slab layout design of rectilinear floors", Engineering Structures, vol. 32, DOI:10.1016/j.engstruct.2010.07.018, 2010, pp. 3488-3500.

Riad, Johanna, "Conceptual High-Rise Design: A design tool combining stakeholders and demands with design", Chalmers University of Technology Gothenburg, Sweden, ISSN 1652-8557, 2016, 100 pages.

Jayachandran, P., "Design of Tall Buildings", Preliminary Design and Optimization, International Conference on Tall Buildings, Worcester Polytechnic Institute, Worcester, Massachusetts, 2003, 20 pages.

Extended European Search Report for Application No. 21213434.0 dated May 16, 2022.

Non Final Office Action received for U.S. Appl. No. 17/127,500 dated Feb. 16, 2023, 67 pages.

Han, Jiawei, "CS 412 Intro. to Data Mining Chapter 10. Cluster Analysis: Basic Concepts and Methods", Computer Science, 2017, 97 pages.

Lu et al., "A Semi-Automatic Approach to Detect Structural Components from CAD Drawings for Constructing As-Is BIM Objects", Computing in Civil Engineering, 2017, pp. 84-91.

Boonstra et al., "Conceptual Structural System Layouts via Design Response Grammars and Evolutionary Algorithms", Automation in Construction, vol. 116, May 23, 2020, pp. 1-20.

Martin et al., "Methods To Process Low-Level Cad Plans and Create Building Information Models (BIM)", PhD Dissertation, Dec. 17, 2014, 312 pages.

Manrique et al., "Automated Generation of Shop Drawings in Residential Construction", Automation in Construction, vol. 55, 2015, pp. 15-24.

An, Shi, "A Design Support System to Determine The Machine Eligibility For Manufacturing Frame Assemblies", Master's Thesis, University of Alberta, 2019, 106 pages.

Lin, Chieh-Jen, "Topology Pattern Mining: A visual Approach for Detecting and Retrieving Design Patterns of Spatial Topology in a Case Library", Computer-Aided Design and Applications, DOI: 10.3722/cadaps.2012.199-205, vol. 9, No. 2, 2012, pp. 199-205.

O'Hanlon, Kenneth, "Building Recognition using Computer Vision", A Dissertation Submitted to the University of Dublin in Partial Fulfilment of the requirement for the Degree of Master of Science in Computer Science, 2005, 72 pages.

Deng et al., "Automatic Generation of Fabrication Drawings for Facade Mullions and Transoms Through BIM Models", Advanced Engineering Informatics, vol. 42, 2019, 14 pages.

Bhattacharya et al., "Hough-Transform Detection of Lines in 3-D Space", Pattern Recognition Letters, vol. 21, 2000, pp. 843-849.

Yang et al., "Semiautomatic Structural BIM-Model Generation Methodology Using CAD Construction Drawings", Journal of Computing in Civil Engineering, vol. 34, No. 3, 2020, 17 pages.

Whitehead, YouTube Video: "Designing a Structural Grid, Part One", URL: www(dot)youtube(dot)com/watchv=8VvbcRa776g, Mar. 25, 2020, 29 pages.

(56) References Cited

OTHER PUBLICATIONS

Sacks et al., "Parametric 3D Modeling in Building Construction with Examples from Precast Concrete", Automation in Construction, vol. 13, 2004, pp. 291-312.
Badvelu, Jaswanth, "Determining Optimal Distribution Centers locations using Weighted K-Means", Published in Towards Data Science, Retrieved from URL: towardsdatascience.com/determining-optimal-distribution-centers-locations-using-weighted-k-means-1dd099726307, Sep. 25, 2020, 8 pages.
Byun et al., "ABGS: A System for the Automatic Generation of Building Information Models From Two-Dimensional CAD Drawings", vol. 12, Aug. 19, 2020, pp. 1-19.
Ndarjo, Pararawendy, "Using Weighted K-Means Clustering to Determine Distribution Centres Locations", Published in Towards Data Science, Retrieved from URL: towardsdatascience.com /using-weighted-k-means-clustering-to-determine-distribution-centres-locations-2567646fc31d, Jan. 24, 2020, 10 pages.
Nair, Amal, "Beginner's Guide To K-Means Clustering", Retrieved from URL: analyticsindiamag.com/beginners-guide-to-k-means-clustering/, Aug. 16, 2019, 12 pages.
Advisory Action received for U.S. Appl. No. 17/127,533 dated Nov. 8, 2023, 8 pages.
MATLAB & Simulink, "What is genetic algorithm?", Matlab definition, 2023, 2 pages.
Non Final Office Action received for U.S. Appl. No. 17/127,533 dated May 5, 2023, 46 pages.
Balogh et al., "Genetic Algorithm Based Optimization of Regular Steel Building Structures Subjected To Seismic Effects", In Proceedings 15th World Conference on Earthquake Engineering, Sep. 2012, 10 pages.
Non Final Office Action received for U.S. Appl. No. 17/127,557 dated May 11, 2023, 88 pages.
Wolfe, Catherine, "Performance-Based Engineering and The Building Code", 2019, 149 pages.
Ozcelik et al., "Seismic Design and Performance of SPSWs With Beam-Connected Web Plates", Journal of Constructional Steel Research, vol. 142, 2018, pp. 55-67.
Ley, Tyler, "Lateral Loads for Concrete Design", Youtube.com, https://www.youtube.com/watch?v=DXDAxb6EpZk, Apr. 3, 2020, 1 page.
Radu et al., "Structural Analysis Programme Based on the Equivalent Column's Method", Journal of Civil Engineering and Architecture, vol. 6, No. 2, Feb. 2012, pp. 244-250.
Gelle et al., "Structural Engineering Design Support by Constraint Satisfaction", Artificial Intelligence in Design, 2000, pp. 311-331.
Chan et al., "Automatic Optimal Design of Tall Steel Building Frameworks", Journal Of Structural Engineering, May 1995, pp. 838-847.
Yang, Haibo, "Performance Analysis of Semi-Rigid Connections in Prefabricated High-Rise Steel Structures", vol. 28, Sep. 14, 2020, pp. 837-846.
Non Final Office Action received for U.S. Appl. No. 17/127,479 dated Nov. 24, 2023, 38 pages.
Liew et al., "Steel Concrete Composite Systems for Modular Construction of High-Rise Buildings", Structures, https://doi.org/10.1016/j.istruc.2019.02.010, vol. 21, 2019, pp. 135-149.
Final Office Action received for U.S. Appl. No. 17/127,557 dated Nov. 29, 2023, 69 pages.
Non Final Office Action received for U.S. Appl. No. 17/324,935 dated Feb. 29, 2024, 44 pages.
Notice of Allowance received for U.S. Appl. No. 17/127,479 dated Jun. 17, 2024, 18 pages.
Non Final Office Action received for U.S. Appl. No. 17/127,500 dated May 7, 2024, 74 pages.
Non Final Office Action received for U.S. Appl. No. 17/127,557 dated May 7, 2024, 68 pages.
Yin et al., "Automatic Layer Classification Method-Based Elevation Recognition In Architectural Drawings for Reconstruction of 3D BIM Models", Automation in Construction, https://doi.org/10.1016/j.autcon.2020.103082, vol. 113, Jan. 6, 2020, pp. 1-19.
Filipski et al., "Automated Conversion of Engineering Drawings to CAD Form", Proceedings Of the IEEE vol. 80, No. 7, Jul. 1992, pp. 1195-1209.
Company et al., "An Algorithm for Grouping Lines Which Converge to Vanishing Points in Perspective Sketches of Polyhedra", DOI: 10.1007/97 8-3-662-44854-07, 2014, pp. 77-95.
Autodesk, "Video: Add Grid Lines", https://help.autodesk.com/view/RVT/2022/EN U/?guid=GU I D-A529C 1 OA-F22F-4919-A 783-B 1847 A498004, retrieved on May 2, 2024, 2 pages.
Barfield, Rose, "Grids in BricsCAD", https://www.bricsys.com/en-us/blog/grids-in-bricscad-bim, Jan. 15, 2019, pp. 1-8.
Wrzesniak et al., "Connection Systems in Multi Storey Timber Buildings Under Seismic Action", Universita' Degli Studi di Trieste, retrieved on May 1, 2024, 207 pages.
Final Office Action received for U.S. Appl. No. 17/127,557 dated Nov. 29, 2024, 68 pages.
Notice of Allowance received for U.S. Appl. No. 17/324,935 dated Dec. 23, 2024, 12 pages.
Final Office Action received for U.S. Appl. No. 17/324,935 dated Sep. 16, 2024, 25 pages.
Final Office Action received for U.S. Appl. No. 17/127,500 dated Oct. 7, 2024, 39 pages.
Gross, Mark D., "Grids in Design and CAD", Proceedings of Association for Computer Aided Design in Architecture, 1991, 11 pages.
Fletcher, Rachel, "An American Vision of Harmony", Nexus Network Journal, vol. 5, No. 2, 2003, pp. 7-47.
Non Final Office Action received for U.S. Appl. No. 17/127,500 dated May 2, 2025, 48 pages.
Non Final Office Action received for U.S. Appl. No. 17/127,557 dated May 15, 2025, 57 pages.
Mangal et al., "Automated Optimization of Steel Reinforcement in RC Building Frames Using Building Information Modeling and Hybrid Genetic Algorithm", Automation in Construction, vol. 90, 2018, pp. 39-57.
Kwak et al., "An Integrated Genetic Algorithm Complemented with Direct Search for Optimum Design of RC Frames", Computer-Aided Design, vol. 41, 2009, pp. 490-500.
Caldas et al., "A Design Optimization Tool Based on A Genetic Algorithm", Automation in Construction, vol. 11, 2002, pp. 173-184.
ES-Haghi et al., "Evaluation of A Novel Asymmetric Genetic Algorithm to Optimize the Structural Design of 3D Regular and Irregular Steel Frames", Frontiers of Structural and Civil Engineering, vol. 14, No. 5, 2020, pp. 1110-1130.
Turrin et al., "Design Explorations of Performance Driven Geometry in Architectural Design Using Parametric Modeling and Genetic Algorithms", Advanced Engineering Informatics, vol. 25, No. 4, 2011, pp. 656-675.
Edwards, Amy H, "The Washington National Monument—A National Contest for a National Monument", The Unwritten Record, Retrieved from https://unwritten-record.blogs.archives.gov/2020/11/24/the-washington-national-monument-a-national-contest-for-a-national-monument/#:~:text=Work%20began%20on%20the%20project,the%20end%20of%20the%20story%E2%80%A6, Nov. 24, 2020, 7 pages.
Cheng, Guo, "A Framework For Life-Cycle Cost Optimization of Buildings Under Seismic and Wind Hazards", Department of Civil and Environmental Engineering, 2014, 122 pages.
Non Final Office Action received for U.S. Appl. No. 17/127,533 dated Aug. 7, 2025, 67 pages.

\* cited by examiner

TECHNIQUES FOR AUTOMATICALLY DESIGNING STRUCTURAL SYSTEMS FOR ARBITRARILY SHAPED BUILDINGS

CROSS-REFERENCE TO RELATED APPLICATIONS

The present application is a continuation-in-part of co-pending U.S. patent application titled, "Techniques for Automatically Designing Structural Systems for Buildings," filed on Dec. 18, 2020 and having Ser. No. 17/127,479. The present application also claims the priority benefit of the U.S. Provisional Patent Application titled, "Machine Learning Techniques For Designing Residential Structures," having Ser. No. 63/171,018 and filed on Apr. 5, 2021. The subject matter of these related application is hereby incorporated herein by reference.

BACKGROUND

Field of the Various Embodiments

The various embodiments relate generally to structural engineering and computer-aided design and, more specifically, to techniques for automatically designing structural systems for arbitrarily shaped buildings.

Description of the Related Art

In a typical design process for a building, an architect generates a building plan that specifies an outline for the building, one or more outlines for each floor of the building, and any number of architectural elements that are going to be included in the building. Some examples of architectural elements include, without limitations walls, elevators, and stairs. Once the building plan is completed, a structural engineer then designs the structural system for the building based on the building plan, various design constraints placed on the building, different design objectives for the building, and various design variables. The structural system includes any number of structural members that, together, enable the building to resist various loads as per the design constraints. For example, the structural system of a given building could include slabs, beams, and columns that enable the building to resist vertical loads attributable to gravity and lateral loads attributable to hurricane force winds without exceeding allowable stresses. To the extent any changes are made to the building plan, the design constraints, the design objectives, the design variables, or loads during the design process, the structural engineer has to redesign the structural system to account for those changes.

In one approach to designing a structural system of a building, a structural engineer independently generates different designs for the structural system using a conventional computer-aided design ("CAD") application, where each design satisfies the various design constraints placed on the building To generate a given design for the structural system, the structural engineer typically generates a baseline design based on the building plan, structural engineering fundamentals, building regulations and engineering codes of practice, local government laws, and the structural engineer's professional experience. The baseline design specifies, among other things, a layout for the structural members of the building as well as the sizes used for the structural members. Using the CAD application, the structural engineer then incrementally refines the baseline design, typically implementing a finite element analysis solver to evaluate design decisions and validate the resulting final design. After the structural engineer generates multiple finalized designs for the structural system, the designs are compared based on the different design objectives for the building, and a single finalized design for the structural system is selected.

One drawback of the above approach to generating a finalized design for the structural system of a building is that conventional CAD applications are not configured to effectively explore the overall design space for a given structural system. Consequently, the finalized design for a structural system generated using a conventional CAD application usually is not properly optimized for the different design objectives for the relevant building. In that regard, because evaluating design decisions involves executing computationally complex finite element analysis operations for numerous refined designs, the process of refining a baseline design is normally very time-consuming. Accordingly, in a typical design process, only a handful of baseline designs for a given structural system can be generated and refined. Further, a structural engineer may make conservative design decisions in order to reduce the time required to generate the finalized designs at the expense of any number of the design objectives. For example, a structural engineer could overestimate the sizes required for some of the structural members to increase the likelihood that these structural members are included in the finalized design without further modification. In such a situation, the structural engineer would intentionally neglect to explore and evaluate structural system designs that are more convergent with respect to a design objective of minimizing weight.

The above problems are exacerbated as the complexity and size of a building increase. For example, for a typical multi-story building, the total number of different combinations of values for the relevant design variables, where each combination results in different design for the structural system of the building, could be over half a million. With a conventional CAD application, there is no way to ensure that a structural engineer has accounted for all of these different combinations and resulting designs when generating the finalized design for the structural system of the building. In fact, as noted above, the structural engineer most likely would account for only a handful of the total number of possible designs in such a situation, which substantially reduces the likelihood that the finalized design is properly optimized.

As the foregoing illustrates, what is needed in the art are more effective techniques for generating designs for the structural systems of buildings.

SUMMARY

One embodiment of the present invention sets forth a computer-implemented method for automatically generating a design for a structural system of a building. The method includes generating a first structural grid based on a first region within a computer-aided design of the building; applying the first structural grid to the first region to generate a first gridded region; computing a set of spanning directions based on the first gridded region; and generating at least a portion of the design for the structural system based on the set of spanning directions and the first gridded region.

At least one technical advantage of the disclosed techniques relative to the prior art is that the disclosed techniques can be incorporated into a CAD application to enable the CAD application to automatically explore a design space to identify regions where the structural system of a building is optimized for any number of design objectives. In that regard, with the disclosed techniques, a CAD application is able to break a complex overall design optimization problem into simpler optimization problems involving different aspects of a structural system design. Accordingly, the CAD application is able to explore the overall design in a far more efficient and systematic fashion. This functionality, which is not available in conventional CAD applications, increases the likelihood that an optimized design for the structural system that is convergent with building design objectives can be identified and generated. These technical advantages provide one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
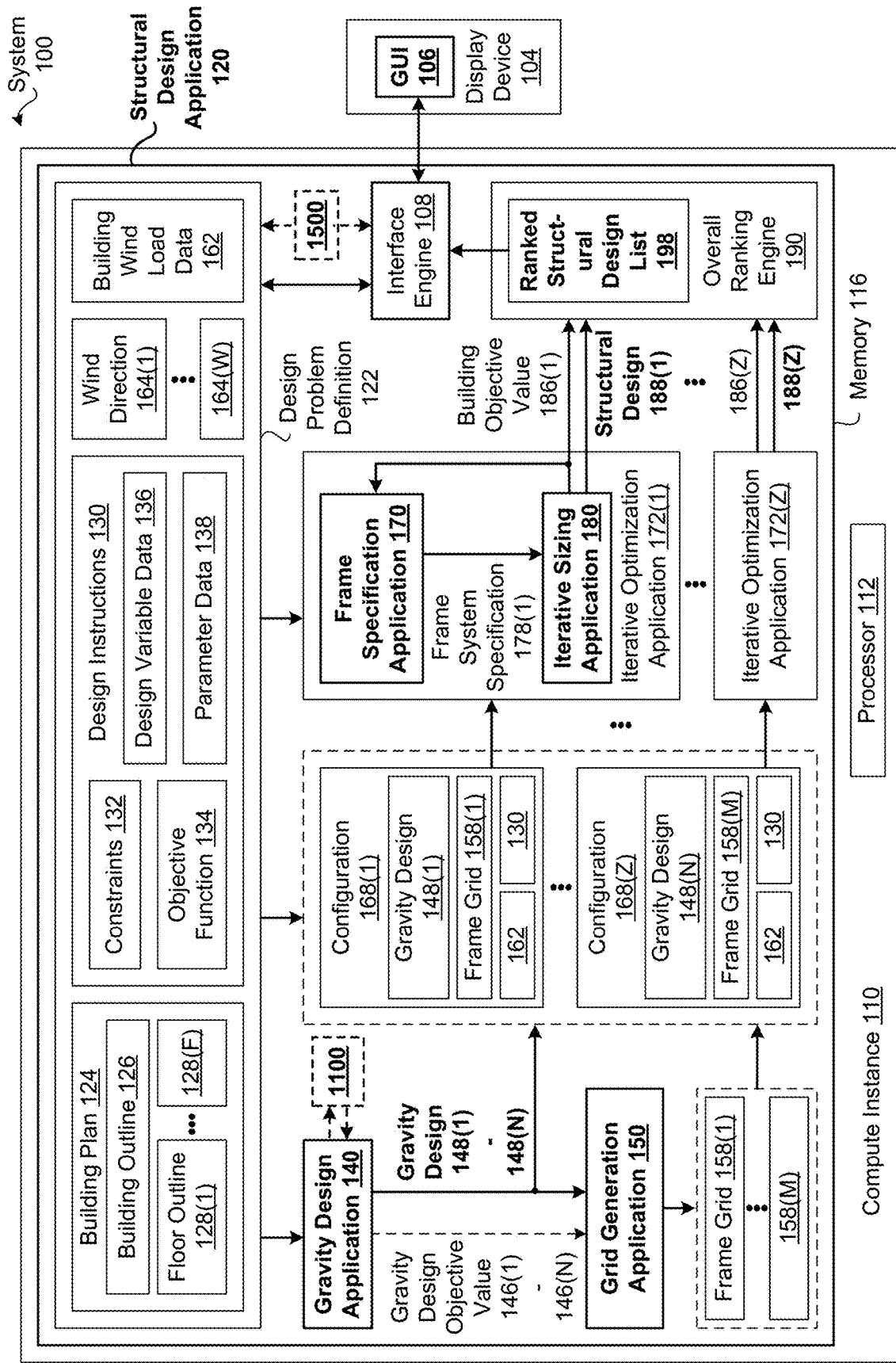
FIG. 1 is a conceptual illustration of a system configured to implement one or more aspects of the various embodiments.

FIG. 1 is a conceptual illustration of a system 100 configured to implement one or more aspects of the various embodiments. As shown, the system 100 includes, without limitation, a display device 104 and a compute instance 110. For explanatory purposes, multiple instances of like objects are denoted with reference numbers identifying the object and parenthetical alphanumeric character(s) identifying the instance where needed.

Any number of the components of the system 100 can be distributed across multiple geographic locations or implemented in one or more cloud computing environments (i.e., encapsulated shared resources, software, data, etc.) in any combination. In some embodiments, the system 100 can include, without limitation, any number (including zero) of instances of the display device 104 and any number of instances of the compute instance 110. In the same or other embodiments, each instance of the compute instance 110 can be implemented in a cloud computing environment, implemented as part of any other distributed computing environment, or implemented in a stand-alone fashion.

As shown, the compute instance 110 includes, without limitation, a processor 112 and a memory 116. The processor 112 can be any instruction execution system, apparatus, or device capable of executing instructions. For example, the processor 112 could comprise a central processing unit, a graphics processing unit, a controller, a micro-controller, a state machine, or any combination thereof. The memory 116 stores content, such as software applications and data, for use by the processor 112. In some alternate embodiments, each of any number of instances of the compute instance 110 can include any number of instances of the processor 112 and any number of instances of the memory 116 in any combination. In particular, any number of instances of the compute instance 110 (including one) can provide a multi-processing environment in any technically feasible fashion.

The memory 116 can be one or more of a readily available memory, such as random-access memory, read only memory, floppy disk, hard disk, or any other form of digital storage, local or remote. In some embodiments, a storage (not shown) can supplement or replace the memory 116. The storage can include any number and type of external memories that are accessible to the processor 112. For example, and without limitation, the storage can include a Secure Digital Card, an external Flash memory, a portable compact disc read-only memory, an optical storage device, a magnetic storage device, or any suitable combination of the foregoing.

As shown, in some embodiments, the compute instance 110 is associated with the display device 104. The display device 104 can be any device that is capable of displaying an image and/or any other type of visual content. For example, the display device 104 could be, without limitation, a liquid crystal display, a light-emitting diode display, a projection display, a plasma display panel, etc. In some embodiments, the display device 104 is a touchscreen that is capable of displaying visual content and receiving input (e.g., from a user).

In some embodiments, the compute instance 110 can be integrated with any number and/or types of other devices (e.g., other instances of the compute instance 110, input devices, output devices, input/output devices, etc.) into a user device. Some examples of user devices include, without limitation, desktop computers, laptops, smartphones, smart televisions, game consoles, tablets, etc.

In general, each instance of the compute instances 110 is configured to implement one or more software applications. For explanatory purposes only, each software application is described as residing in the memory 116 of the compute instance 110 and executing on the processor 112 of the compute instance 110. However, in some embodiments, the functionality of any number of software applications can be distributed across any number of other software applications that reside in instances of the memory 116 of any number of instances of the compute instance 110 and execute on any number of instances of the processor 112 of any number of instances of the compute instance 110 in any combination. Further, the functionality of any number of software applications can be consolidated into a single software application.

In particular, the compute instance 110 is configured to implement one or more computer-aided design ("CAD") applications that can be used to automatically design structural systems of buildings. As described previously herein, in one conventional approach to designing a structural system of a building, a structural engineer uses one or more conventional CAD applications to independently generate multiple baseline designs based on a building plan, design and structural engineering fundamentals, and design insight stemming from the structural engineer's overall design experience. The structural engineer then uses the conventional CAD application(s) to incrementally refine the baseline designs, typically executing a finite element analysis solver to evaluate design decisions and validate the resulting final designs. After the structural engineer generates multiple finalized designs for the structural system, the designs are compared based on the different design objectives for the building, and a single finalized design for the structural system is selected.

One drawback of the above approach to generating a finalized design for the structural system of a building is that conventional CAD applications are not configured to effectively explore the overall design space for a given structural system. In particular, because evaluating design decisions involves executing computationally complex finite element analysis operations for numerous refined designs, the process of refining a baseline design is normally very time-consuming. Accordingly, in a typical design process, only a handful of baseline designs for a given structural system can be generated and refined. As a result, the finalized design for a structural system generated using conventional CAD application(s) usually is not properly optimized for the different design objectives for the associated building.

Generative Design Techniques for Designing a Structural System of a Building

To address the above problems, in some embodiments, the compute instance 110 includes, without limitation, a structural design application 120. The structural design application 120 is a CAD application that implements generative design techniques to generate designs for a structural system of a building based on any number and/or type of design objectives and any and/or types of design constraints. As described in greater detail below, the structural design application 120 defines an overall optimization design problem and then breaks the overall optimization design problem into multiple layers of less complex optimization problems referred to herein as constituent optimization problems. Each of the constituent optimization problems is associated with a different aspect of structural system design. To solve the overall optimization design problem, the structural design application 120 executes an overall design flow that dynamically self-adjusts based on results generating while solving the constituent optimization problems.

In some embodiments, the structural design application 120 resides in the memory 116 of the compute instance 110 and executes on the processor 112 of the compute instance 110. In general, the functionality of the structural design application 120 can be distributed across any number of software applications. Each of the software applications can reside in any number of instances of the memory 116 of any number of instances of the compute instances 110 and execute on any number of instances of the processor 112 of any number of instances of the compute instances 110 in any combination.

As shown, in some embodiments, the structural design application 120 includes, without limitation, an interface engine 108, a gravity design application 140, a grid generation application 150, any number of instances of an iterative optimization application 172 (not explicitly shown), and an overall ranking engine 190. In the same or other embodiments, the iterative optimization application 172 includes, without limitation, a frame specification application 170 and an iterative sizing application 180.

In some embodiments, the interface engine 108 displays a graphical user interface ("GUI") 106 via the display device 104. The interface engine 108 can receive number and/or types of inputs via the GUI 106 and can display any number and/or types of outputs via the GUI 106. In some embodiments, the interface engine 108 receives any number and/or types of design constraints (not shown) and/or any number and/or types of design objectives (not shown) via the GUI 106. In the same or other embodiments, the interface engine 108 displays a portion (including none or all) of any number of solutions of the overall optimization design problem and/or any number of solutions of the constituent optimization problems via the GUI 106.

In some embodiments, the structural design application 120 generates a design problem definition 122 that describes the overall design optimization problem and specifies, without limitation, any amount and/or types of ancillary data. The structural design application 120 can generate the design problem definition 122 in any technically feasible fashion based on any amount and/or type of input data. As shown, in some embodiments, the structural design application 120 generates the design problem definition 122 based, at least in part, on input received via the GUI 106. In the same or other embodiments, the interface engine 108 can display a portion (including none or all) of the design problem definition 122 via the GUI 106.

The overall design optimization problem is to generate any number of designs for a structural system of a building based on any number and/or types of design objectives and any number and/or type of design constraints. In some embodiments, the design problem definition 122 includes, without limitation, a building plan 124 that is included in a computer-aided design of a building (not shown), design instructions 130, wind directions 164(1)-164(W), and building wind load data 162, where W can be any positive integer.

In some embodiments, the building plan 124 includes, without limitation, a building outline 126, and floor outlines 128(1)-128(F), where F can be any positive integer. The building outline 126 is an outline of a building that has F floors. For explanatory purposes only, "the building" as used subsequently herein refers to the building associated with the building plan 124. Each of the floor outlines 128(1)-128 (F) is an outline of a different floor of the building. For explanatory purposes only, the floor outlines 128(1)-128(F) are also referred to individually as "floor outline 128" and collectively as "the floor outlines 128."

In the same or other embodiments, the building plan 124 can include any amount and/or type of data that is relevant to the designing the structural system for the building instead of or in addition to the building outline 126 and/or the floor outlines 128. For instance, in some embodiments, the building plan 124 includes, without limitation, floorplans (not shown) for each of the floors, where each of the floorplans specifies the floor outline 128, any number of rooms, occupancy type for each room, and/or any number of walls. In the same or other embodiments, the building plan 124 includes, without limitation, a pre-defined column grid (not shown), where the locations of frames are restricted to grid lines included in the pre-defined column grid.

As shown, in some embodiments the design instructions 130 include, without limitation, constraints 132, an objective function 134, design variable data 136, and parameter data 138. The constraints 132 can specify any amount and/or types of restrictions associated with the building. For instance, in some embodiments, the constraints 132 include, without limitation, any number of design constraints that are specified at a high level by a user (e.g., via the GUI 106), any number of restrictions derived based on the design constraints and/or any other types of user input, any number and/or types of restrictions associated with the building plan 124, any number and/or types of restrictions associated with any number and/or types of building codes and/or zoning regulations, and/or any number and/or types of restrictions associated with any aspect(s) of construction.

The structural design application 120 can generate the constraints 132 in any technically feasible fashion. For instance, in some embodiments, the user specifies a pre-defined column grid via the GUI 106. Based on the pre-defined column grid, the structural design application 120 generates any number of the constraints 132 that restrict the locations of columns in accordance to the pre-defined column grid and/or adds the pre-defined column grid to the design instructions 130.

In the same or other embodiments, the structural design application 120 generates any number of the constraints 132 that specify, without limitation, any number of design safety factors associated with any number and/or type of building codes. In some embodiments, each of the design safety factors specifies, without limitation, a maximum allowable stress (e.g., a shear stress, a bending stress, etc.) for a type of structural member under one or more types of loads. Some examples of design safety factors include, without limitation, bending and vertical deflection safety factors for beams and slabs, shear safety factors for beams and slabs, a vibration safety factor for slabs, and lateral deflection limits on frames. In some embodiments, design safety factors can be defined separately for serviceability limit states and ultimate limit states.

The objective function 134 encapsulates any number and/or types of design objectives in any technically feasible fashion. Some examples of design objectives include, without limitation, minimizing total weight, minimizing embodied carbon, minimizing material cost, and minimizing material waste, to name a few. In some embodiments, the structural design application 120 receives the objective function 134 as a user input (e.g., via the GUI 106). In other embodiments, the structural design application 120 can generate the objective function 134 in any technically feasible fashion.

In some embodiments, the objective function 134 quantifies degrees of convergence of designs or any portions thereof with the design objectives. The objective function 134 can be expressed in any technically feasible fashion. In some embodiments, the objective function 134 is a composite function. In the same or other embodiments, the objective function 134 is an aggregation of metrics that are each associated with one or more of the design objectives.

Values of the objective function 134 are also referred to herein collectively as "objective values" and individually as an "objective value." In some embodiments, the structural design application 120 attempts to maximize the objective function 134. In some other embodiments, the structural design application 120 attempts to minimize the objective function 134. In some embodiments, the structural design application 120 incorporates any number and/or type of the constraints 132 into the objective function 134 as penalties in any technically feasible fashion. In the same or other embodiments, any number of penalties are disregarded during different optimization operations depending on the design variable(s) that are optimized during the optimization operations. For instance, in some embodiments, the iterative sizing application 180 disregards any penalties associated with grid spacing.

The design variable data 136 includes, without limitation, any amount and/or type of data that defines, at least in part, the design space of the structural system that is associated with the design problem definition 122. For instance, in some embodiments, the design variable data 136 includes, without limitation, any number of cross-section databases for any number of types of structural members, any number and/or types of allowed dimension ranges for any number of types of structural members, local availability and relative and/or actual cost of each material (reinforced concrete, precast concrete, reinforced masonry, structural steel, cold-formed steel, wood, etc.), embodied carbon, or any combination thereof.

The parameter data 138 includes, without limitation, values for any number and/or types of parameters that are relevant to the structural design application 120, the gravity design application 140, the grid generation application 150, the iterative optimization application 172, the frame specification application 170, the iterative sizing application 180, or any combination thereof. In some embodiments, the parameter data 138 includes, without limitation, a maximum variation count (not shown), denoted herein as N, that limits the total number of options that are retained at any number of points in the overall design flow and/or any number of points in any number of design flows associated with any number of the constituent optimization problems. In the same or other embodiments, the parameter data 138 includes, without limitation, any number and/or type of completion criteria associated with any number of iterative portions of the overall design flow and/or any number of design flows associated with any number of the constituent optimization problems. In some embodiments, the parameter data 138 can include any number and/or types of groups of setting based on tradeoff between accuracy and speed.

The wind directions 164(1)-164(W) specify any number of directions associated with wind loads that the structural design application 120 is to take into account. In some embodiments, each of the wind loads is a load imparted by wind of the building. For explanatory purposes only, the wind directions 164(1)-164(W) are also referred to herein individually as "the wind direction 164" and collectively as "the wind directions 164." In some embodiments, the structural design application 120 determines the wind directions 164 based on user input (e.g., received via the GUI 106). In the same or other embodiments, the structural design application 120 can determine the wind directions 164 in any technically feasible fashion.

The building wind load data 162 specifies, without limitation, any amount and/or type of lateral loads attributable to wind that the building is to be designed to resist. In some embodiments, the building wind load data 162 includes, without limitation, a different building wind load (not shown) for each of the wind directions 164(1)-164(W). The structural design application 120 or the iterative sizing application 180 can determine the building wind load data 162 in any technically feasible fashion. For instance, in some embodiments, the structural design application 120 or the iterative sizing application 180 computes the building wind load data 162 based on the building outline 126, locations of walls, the structural system being created, and user input (e.g., received via the GUI 106) that specifies, without limitation, a mean wind speed, a structural factor, a terrain category, an orography factor. or any combination thereof.

In some embodiments, after generating the design problem definition 122, the structural design application 120 defines the overall design optimization problem as generating any number of designs of the structural system of the building based on the objective function 134 and the constraints 132 while taking into account gravity and the building wind load(s). The structural design application 120 then breaks the overall design problem into the constituent optimization problems. In some embodiments, the structural design application 120 breaks the overall design problem into a layout and gravity design optimization problem, a frame grid optimization problem, a frame system definition optimization problem, a vertical and lateral load design optimization problem, or any combination thereof.

In some embodiments, to initiate the overall design flow, the structural design application 120 configures the gravity design application 140 to solve the layout and gravity design optimization problem. More specifically, in some embodiments, the structural design application 120 configures the gravity design application 140 to generate gravity designs 148(1)-148(N) and optionally evaluate gravity design objective values 146(1)-146(N) based on the building plan 124 and the design instructions 130, where N can be any positive integer. For explanatory purposes only, the gravity designs 148(1)-148(N) are also referred to herein individually as "the gravity design 148" and collectively as "the gravity designs 148." Similarly, the gravity design objective values 146(1)-146(N) are also referred to herein individually as "the gravity design objective value 146" and collectively as "the gravity designs objective values 146."

Each of the gravity designs 148 is a different CAD design for the structural system of the building that is optimized based on the objective function 134 and the constraints 132 while taking into account gravity but not the building wind load(s). A "CAD design" is also referred to herein as a "design." In some embodiments, a design of any portion (including all) of the structural system specifies, without limitation, a CAD layout (not shown in FIG. 1) for the portion of the structural system and any amount and/or types of sizing data (not shown in FIG. 1). In the same or other embodiments, each design for any portion (including all) of the structural system can additionally specify, without limitation, any amount and/or types of connection data (not shown in FIG. 1), a frame system (not shown in FIG. 1), any amount and/or types of load data (not shown in FIG. 1), or any combination thereof.

A "CAD layout" is also referred to herein as a "layout." In some embodiments, a "layout" of any portion (including all) of the structural system specifies, without limitation, locations, types, and materials for each of any number of structural members included in the portion of the structural system. In some embodiments, the structural members specified in each of the layouts include, without limitation, any number of slabs, beams, and columns in any combination.

In some embodiments, the sizing data includes, without limitation, sizing of any number and/or types of the structural members specified in the layout. As referred to herein, the sizing of a given structural member can specify, without limitation, any amount and/or types of data that impact the size of the structural member. For instance, in some embodiments, the sizing of a reinforced concrete flat slab specifies the grade of concrete, thickness of the slab and a thickness and distribution of the reinforcement. In the same or other embodiments, the sizing of a steel column specifies a cross-section profile.

In some embodiments, the connection data specifies, without limitation, any number and/or types of joints. Some examples of types of joints include, without limitation, rigid joints, semi-rigid joints, hinged joints, pin joints, etc. In the same or other embodiments, the frame system includes, without limitation, any number and/or types of frames (not shown in FIG. 1), where each of the frames resists both vertical and lateral loads. In some embodiments, each of the frames includes, without limitation, any number and/or types of beams and any number and/or types of columns that are interconnected via moment-resisting joints. In some embodiments, to specify a frame system, a design includes, without limitation, any number of frame specifications (not shown in FIG. 1), where each of the frame specifications specifies a different frame in the frame system.

Because the gravity design application 140 does not take any lateral loads (e.g., the building wind loads) into account when generating the gravity designs 148, the gravity designs 148 do not necessarily include frame system specifications. The gravity design objective values 146(1)-146(N) are objective values for the gravity designs 148(1)-148(N), respectively. The gravity design application 140 can generate the gravity design 148 in any technically feasible fashion.

As described in greater detail below in conjunction with FIG. 2, in some embodiments, the gravity design application 140 implements a branch-merge design flow to generate the gravity designs 148. During a branching phase, the gravity design application 140 partitions each floor of the structural system into multiple segments (not shown in FIG. 1). In some embodiments, the gravity design application 140 implements a rule-based expert system to generate multiple segments layouts (not shown in FIG. 1) for each of the segments. In the same or other embodiments, the rule-based expert system is based on domain knowledge. For explanatory purposes only, rules included in rule-based expert systems that are based on domain knowledge are also referred to herein as "domain knowledge-based rules." Each of the segment layouts specifies, without limitation, locations, types, and materials for any number of slabs, any number of beams, and any number of columns.

In some embodiments, the gravity design application 140 independently initializes and optimizes sizing data for each of the segment layouts to generate optimized segment designs (not shown in FIG. 1). Prior to optimizing the sizing data, the gravity design application 140 can determine any amount (including none) and/or types of relevant data in any technically feasible fashion. For instance, in some embodiments, the gravity design application 140 determines the slab spanning type (e.g., one-way spanning, two-way spanning, cantilever, etc.) using domain knowledge-based rules. In the same or other embodiments, the gravity design application 140 selects any number of continuous beam systems (e.g., groupings of multiple aligned edges) to be treated as a single beam using domain knowledge-based rules. To optimize the sizing data for a given segment design, the gravity design application140 sequentially optimizes the sizing data for the constituent slabs, beams, and columns based on the constraints 132 and the objective function 134 while taking into account gravity but not the building wind load(s). The gravity design application 140 also computes objective values for the optimized segment designs.

During a merging phase, in some embodiments, the gravity design application 140 generates multiple optimized floor designs (not shown) for each floor. To generate the optimized floor designs for a given floor, the gravity design application 140 performs per-segment, incremental merging based on the optimized segment designs and the associated objective values. After each incremental merge, the gravity design application optimizes the sizing data for the merged designs (not shown) and computes the associated objective value.

In some embodiments, the gravity design application 140 determines different combinations of the optimized floor designs to generate the gravity designs 148. The gravity design application 140 can determine the different combinations of the optimized floor designs in any technically feasible fashion. In some embodiments, the gravity design application 140 implements a genetic algorithm to combine the optimized floor designs based on the associated objective values to generate the gravity designs 148. For instance, some embodiments, the gravity design application 140 executes the genetic algorithm on an objective value associated with a first set of values specifying one combination of the optimized floor designs to determine a second set of values specifying another combination of the optimized floor designs that is more convergent with respect to the design objectives. The gravity design application 140 then computes the gravity design objective values 146(1)-146(N) based on the objective function 134 and the gravity designs 148(1)-148(N), respectively.

Although not shown, in some embodiments, the structural design application 120 does not necessarily solve the frame grid optimization problem and/or the frame optimization problem. The structural design application can determine whether to solve the frame grid optimization problem and/or the frame optimization problem in any technically feasible fashion. In some embodiments, the structural design application 120 solves the frame grid optimization problem and the frame optimization problem by default. In the same or other embodiments, if the design instructions 130 include the pre-defined column grid, then the structural design application 120 does not solve the frame grid optimization problem. Instead, the structural design application 120 uses the pre-defined column grid lines to determine one or more frame grids instead of solving the frame grid optimization problem, and the techniques described herein are modified accordingly.

As persons skilled in the art will recognize, the beams and columns in a reinforced concrete frame structural system are typically connected via rigid joints and therefore the frame system is inherently defined. For this reason, in some embodiments, if the gravity designs 148 specify reinforced concrete frame structural systems, then the structural design application 120 solves neither the frame grid optimization problem nor the frame optimization problem. Instead, the structural design application configures the iterative sizing application 180 to generate frame specifications specifying frames at all possible locations while solving the vertical and lateral load design optimization problem. The techniques described herein are modified accordingly.

As shown, in some embodiments, the structural design application 120 configures the grid generation application 150 to solve the frame grid optimization problem. More specifically, in some embodiments, the structural design application 120 configures the grid generation application 150 to generate frame grids 158(1)-158(M), where M can be any positive integer, based on the gravity designs 148(1)-148(N) and optionally the gravity design objective values 146(1)-146(N) and/or any amount of the parameter data 138. In some embodiments, each of the frame grids 158(1)-158(N) is associated with each floor of the building. In some other embodiments, different subsets of the frame grids 158(1)-158(N) are associated with different subsets of the floors. For instance, in some embodiments, some of the frame grids 158(1)-158(N) are associated with any number of floors that are intended for parking, while the remainder of the frame grids 158(1)-158(N) are associated with any number of floors that are intended for residential use.

Each of the frame grids 158(1)-158(N) includes, without limitation, any number of sets of grid lines (not shown), where each set of grid lines is associated with a different direction. Together, the grid lines specify the allowed locations of the frames of the structural system of the building. For explanatory purposes only, the frame grids 158(1)-158(M) are also referred to herein individually as "the frame grid 158" and collectively as "the frame grids 158."

As described in greater detail below in conjunction with FIG. 4, in some embodiments, the grid generation application 150 implements any number and/or types of unsupervised clustering techniques to generate the frame grids 158. In some embodiments, the grid generation application 150 determines an edge set (not shown in FIG. 1) based on the gravity designs 148. The edge set includes, without limitation, any number of edges (not shown), where each edge corresponds to a beam that is connected to at least one column. In some embodiments, the grid generation application 150 generates a different group of edges for each of the gravity designs 148 and then determines the edge set based on a union of the groups of edges.

Subsequently, in some embodiments, the grid generation application 150 generates a weighted direction set (not shown in FIG. 1) based on the directions of the edges included in the edge set. The grid generation application 150 then applies any number and/or types of unsupervised clustering techniques to the weighted direction set to generate a base direction set (not shown in FIG. 1) that includes, without limitation, any number of base directions (not shown in FIG. 1).

In the same or other embodiments, the grid generation application 150 generates a weighted equation set (not shown in FIG. 1) based on the equations of the edges included in the edge set and optionally the gravity design objective values 146. For each of the base directions, the grid generation application determines a corresponding weighted equation subset (not shown) of the weighted equation set that includes, without limitation, any number of weighted equations that are approximately parallel to the base direction.

For each of the weighted equation subsets, the grid generation application 150 applies any number and/or types of unsupervised clustering techniques to the weighted equation subset to determine any number of sets of grid lines in the associated base direction. Based on the sets of grid lines for the base directions, the grid generation application 150 generates the frame grids 158. In some embodiments, each of the frame grids 158 includes a different combination of sets of grid lines for each of the base directions.

In some embodiments, the structural design application 120 generates configurations 168(1)-168(Z) based on the gravity designs 148(1)-148(N) and the frame grids 158(1)-158(M), where Z can be any positive integer. As shown, in some embodiments, the configuration 168(1) includes, without limitation, the gravity design 148(1), the frame grid 158(1), the building wind load data 162, and the design instructions 130. As also shown, in some embodiments, the configuration 168(Z) includes, without limitation, the gravity design 148(N), the frame grid 158(M), the building wind load data 162, and the design instructions 130. In general, each of the configurations 168(1)-168(N) represents a different combination of the gravity designs 148(1)-148(N) and the frame grids 158(1)-158(M). The structural design application 120 can generate the configurations 168(1)-168(Z) in any technically feasible fashion. For instance, in some embodiments, the structural design application 120 generates exhaustive combinations of the gravity designs 148(1)-148(N) and the frame grids 158(1)-158(M) and therefore Z is equal to the product of N and M. In some other embodiments, the structural design application 120 generates exhaustive combinations of the best X of the gravity designs 148(1)-148(N) and the best X of the frame grids 158(1)-158(M) and therefore Z is equal to the square of X, where X can be any integer (e.g., X can be N).

In some embodiments, the structural design application 120 configures the iterative optimization application 172 to iteratively and collaboratively solve the frame system optimization problem and the vertical and lateral load design optimization problem independently for each of the configurations 168(1)-168(Z). More specifically, in some embodiments, the structural design application 120 can configure any number of instances of the iterative optimization application 172 to generate the structural designs 188(1)-188(Z) and the building objective values 186(1)-186(Z) based on the configurations 168(1)-168(Z) sequentially, concurrently, or in any combination thereof.

As shown, in some embodiments, the structural design application 120 configures the iterative optimization applications 172(1)-172(Z) to independently generate the structural designs 188(1)-188(Z), respectively, and the building objective values 186(1)-186(Z), respectively, based on the configurations 168(1)-168(Z), respectively. In some other embodiments, the structural design application 120 configures a single instance of the iterative optimization application 172 to sequentially generate the structural designs 188(1)-188(Z) and the building objective values 186(1)-186(Z). For explanatory purposes only, instances of the iterative optimization application 172 are also referred to herein individually as "the iterative optimization application 172" and collectively as "the iterative optimization applications 172."

The structural designs 188(1)-188(Z) are designs for the structural system of the building that the iterative optimization application 172 optimizes based on the objective function 134 and the constraints 132 while taking into account gravity and the building wind load(s). For explanatory purposes only, the structural designs 188(1)-188(Z) are also referred to herein individually as "the structural design 188" and collectively as "the structural designs 188." The building objective values 186(1)-186(Z) are objective values of the structural designs 188(1)-188(Z), respectively. For explanatory purposes only, the building objective values 186(1)-186(Z) are also referred to herein individually as "the building objective value 186" and collectively as "the building objective values 186."

In some embodiments, each instance of the iterative optimization application 172 includes, without limitation, a different instance of the frame specification application 170 and a different instance of the iterative sizing application 180. In operation, the iterative optimization application 172 orchestrates any number of design optimization iterations via the frame specification application 170 and the iterative sizing application 180. The frame specification application 170 is described in greater detail below in conjunction with FIG. 5. The iterative sizing application 180 is described in greater detail below in conjunction with FIG. 6. For explanatory purposes only, the functionality of the iterative optimization application 172 is described in conjunction with FIG. 1 in the context of the iterative optimization application 172(1) that generates the structural design 188(1) and the building objective value 186(1) based on the configuration 168(1).

In some embodiments, to initiate a first design optimization iteration, the iterative optimization application 172(1) inputs the gravity design 148(1), the frame grid 158(1), and the wind directions 164 into the frame specification application 170. In response, the frame specification application 170 determines a different potential frame location set (not shown in FIG. 1) for each of the wind directions 164 based on the gravity design 148(1) and the frame grid 158(1). For each of the wind directions 164, the frame specification application 170 bifurcates the associated potential frame location set into a left frame group (not shown in FIG. 1) and a right frame group (not shown in FIG. 1) based on a building load centroid (not shown in FIG. 1).

In some embodiments, the frame specification application 170 configures a genetic algorithm (not shown in FIG. 1) to iteratively and collectively optimize left frame counts (not shown in FIG. 1) and right frame counts (not shown in FIG. 1) for the left frame groups and the right frame groups, respectively, based on the building objective value 186(1) associated with the prior design optimization iteration (if any). For the first design optimization iteration, in some embodiments, the genetic algorithm randomly determines the left frame counts and the right frame counts. As described in greater detail below, the iterative sizing application 180 generates the structural design 188(1) and computes the building objective value 186(1) to complete each design optimization iteration.

For each of the left frame groups, the frame specification application 170 selects the associated left frame count of locations from the left frame group in order of decreasing distance from the building load centroid. Similarly, for each of the right frame groups, the frame specification application 170 selects the associated right frame count of locations from the right frame group in order of decreasing distance from the building load centroid. The frame specification application 170 then generates a frame system specification 178(1) based on the selected locations. In some embodiments, for each of the selected locations, the frame system specification 178(1) specifies, without limitation, that the structural members included in the gravity design 148(1) that are associated with the selected location are to be interconnected via moment-resisting joints.

To initiate each subsequent design optimization iteration, the iterative optimization application 172(1) inputs the building objective value 186(1) generated by the iterative sizing application 180 during the prior design optimization iteration into the frame specification application 170. In response, the frame specification application 170 inputs the building objective value 186(1) into the genetic algorithm. The genetic algorithm re-determines the left frame counts and the right frame counts. Subsequently, the frame specification application 170 re-generates the frame system specification 178(1) based on the re-determined left frame counts and the re-determined right frame counts.

In some other embodiments, the frame specification application 170 does not bifurcate the potential frame location sets into the left frame groups and the right frame groups. Instead, the frame specification application 170 configures the genetic algorithm to iteratively and collectively optimize Boolean values for each of the potential frame locations across the potential frame locations sets based on the building objective value 186(1) associated with the prior design optimization iteration (if any). During each design optimization iteration, after using the genetic algorithm to determine the Boolean values for the potential frame locations, the frame specification application 170 selects the locations from the potential frame location sets for which the corresponding Boolean values are true. Subsequently, the frame specification application 170 generates the frame system specification 178(1) for the frame system that specifies, without limitation, a different frame at each of the selected locations.

To complete each design optimization iteration (including the first design optimization iteration), the iterative optimization application 172(1) inputs the frame system specification 178(1), the gravity design 148(1), the design instructions 130, and the building wind load data 162 into the iterative sizing application 180. In response, in some embodiments, the iterative sizing application 180 adds frame specifications as per the frame system specification 178(1) to the gravity design 148(1) to generate a current structural design (not shown). In this fashion, the current structural design specifies a frame system that includes, without limitation, any number of frames.

In some embodiments, the iterative sizing application 180 defines and iteratively solves a nested optimization problem to optimize the sizing of the beams and the columns included in the current structural design based on the constraints 132 and the objective function 134 while taking into account gravity and the building wind load(s). To initiate each top level iteration of the nested optimization problem, the iterative sizing application 180 iteratively optimizes the sizing data for the columns based on the constraints 132 and the objective function 134, updating the dead loads after each iteration while keeping the wind loads of the structural members fixed. The iterative sizing application 180 then iteratively executes any number of middle level iterations.

To initiate each middle level iteration, the iterative sizing application 180 distributes the building wind load(s) across the frames corresponding to the frame specifications of the current structural design to generate fixed lateral load(s) for each of the frames. For each of the frames, the iterative sizing application 180 initiates any number of bottom level iterations. During each bottom level iteration for a given frame, the iterative sizing application 180 iteratively optimizes the sizing of the columns and the beams in the frame based on the fixed lateral load(s) associated with the frame. Notably, during each bottom level iteration, the iterative sizing application 180 iteratively re-distributes the fixed lateral load(s) across the structural members within the associated frame.

After the iterative sizing application 180 solves the nested optimization problem, the iterative sizing application 180 sets the structural design 188(1,1) equal to the current structural design. The iterative sizing application 180 then computes the building objective value 186(1) based on the structural design 188(1) and the objective function 134.

The iterative optimization application 172(1) then determines whether to initiate another design optimization iteration. The iterative optimization application 172(1) can determine whether to initiate another design optimization iteration in any technically feasible fashion. In some embodiments, the iterative optimization application 172(1) determines whether to imitate another design optimization iteration based on any number and/or types of completion criteria specified via the parameter data 138. In some embodiments, if the iterative optimization application 172(1) determines to initiate another design optimization iteration, then the iterative optimization application 172(1) inputs the building objective value 186(1) into the frame specification application 170. Otherwise, the iterative optimization application 172(1) transmits the structural design 188(1) and the building objective value 186(1) to the overall ranking engine 190.

In some embodiments, after the overall ranking engine 190 receives the structural designs 188(1)-188(Z) and the building objective values 186(1)-186(Z), the overall ranking engine 190 generates a ranked structural design list 198. The ranked structural design list 198 includes, without limitation, the structural designs 188 and the building objective values 186 associated with the structural designs 188. In some embodiments, the overall ranking engine 190 specifies structural designs 188 in the ranked structural design list 198 in order of decreasing convergence with the design objectives as per the building objective values 186.

As shown, in some embodiments, the overall ranking engine 190 transmits the ranked structural design list 198 to the interface engine 108 for display via the GUI 106. In the same or other embodiments, the structural design application 120 stores any portions (including none or all) of the ranked structural design list 198 and/or any number of solutions of any number of the constituent optimization problems in any memory that is available to at least one other software application. In some embodiments, the structural design application 120 transmits any portions (including none or all) of the ranked structural design list 198 and/or any number of solutions of any number of the constituent optimization problems to any number of other software applications in any technically feasible fashion.

In some embodiments, the structural design application 120, the gravity design application 140, the grid generation application 150, the iterative optimization application 172, the frame specification application 170, the iterative sizing application 180, or any combination thereof use any number and/or types of trained machine learning models to design, optimize, and/or analyze any number and/or types of structural members, layouts, designs, frame systems, frames, or any combination thereof. In the same or other embodiments, the structural design application 120, the gravity design application 140, the grid generation application 150, the iterative optimization application 172, the frame specification application 170, the iterative sizing application 180, or any combination thereof store any amount of training data for use in training and/or re-training any number and/or types of machine learning models.

Notably, in some embodiments, the structural design application 120, the gravity design application 140, the grid generation application 150, the iterative optimization application 172, the frame specification application 170, the iterative sizing application 180, or any combination thereof apply any number and/or type of design and/or structural engineering fundamentals to design, optimize, and/or analyze any number and/or types of structural members, layouts, designs, frame systems, frames, or any combination thereof.

Some examples of design and structural engineering fundamentals include, without limitation, the compatibility of displacement concept, structural idealization, the principle of superposition, the portal method, and the method of sections. For instance, in some embodiments, the structural design application 120, the gravity design application 140, and the iterative sizing application 180 generate idealized structures for slabs, beams, columns, frames, and/or frame systems to simplify the analysis and/or design of different portions (including all) of the structural system.

Advantageously, incorporating any amount (including all) of the functionality described herein in the context of the structural design application 120, the gravity design application 140, the grid generation application 150, the iterative optimization application 172, the frame specification application 170, and the iterative sizing application 180 into a CAD application can increase the likelihood that the CAD application can generate an optimized design for the structural system that is convergent with the design objectives. In that regard, using trained machine learning models and/or design and structural engine fundamentals to evaluate design decisions can substantially reduce the time required to optimize designs relative to prior art techniques that use finite element analysis to evaluate designs manually created based on designer intuition. Furthermore, relative to conventional CAD applications, because the structural design application 120 decomposes the overall optimization design problem into multiple constituent optimization problems, the structural design application 120 can more efficiently and systematically explore the design space of the structural system. In the same or other embodiments, because any number of the interface engine 108, the gravity design application 140, the grid generation application 150, the frame specification application 170, and the iterative sizing application 180 can be configured to retain only the best solutions, the design space of the structural system can be explored in a more directed and therefore efficient fashion.

Note that the techniques described herein are illustrative rather than restrictive and can be altered without departing from the broader spirit and scope of the invention. Many modifications and variations on the functionality provided by the structural design application 120, the interface engine 108, the gravity design application 140, the grid generation application 150, the iterative optimization application 172, the frame specification application 170, the iterative sizing application 180, and the overall ranking engine 190 will be apparent to those of ordinary skill in the art without departing from the scope and spirit of the described embodiments. For instance, in some embodiments, the functionality of any number of the structural design application 120, the grid generation application 150, the iterative optimization application 172, the frame specification application 170, and the iterative sizing application 180 can be modified to perform optimization operations based on any number and/or types of lateral loads in addition or instead of the building wind load(s).

It will be appreciated that the system 100 shown herein is illustrative and that variations and modifications are possible. For example, the functionality provided by the structural design application 120, the interface engine 108, the gravity design application 140, the grid generation application 150, the iterative optimization application 172, the frame specification application 170, the iterative sizing application 180, and the overall ranking engine 190 as described herein may be integrated into or distributed across any number of software applications (including one), and any number of components of the system 100. Further, the connection topology between the various units in FIG. 1 can be modified as desired.

In some embodiments, any number of the gravity design application 140, the grid generation application 150, the iterative optimization application 172, the frame specification application 170, and the iterative sizing application 180 can be executed in a stand-alone fashion by any number of software applications and/or users in any technically feasible fashion.

Generating Gravity Designs Via a Branch-Merge Design Flow

Figure 2:
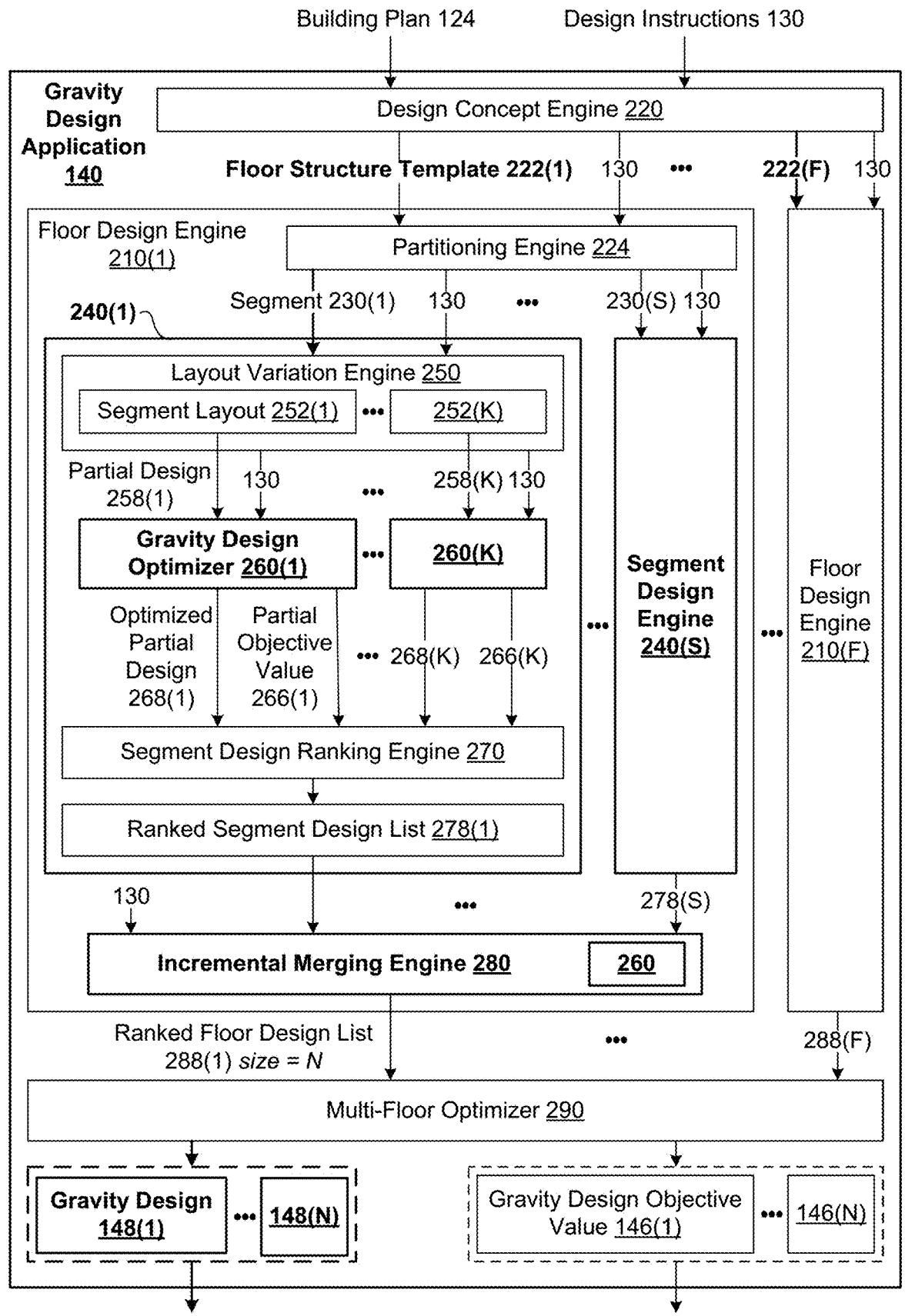
FIG. 2 is a more detailed illustration of the gravity design application of FIG. 1, according to various embodiments.

FIG. 2 is a more detailed illustration of the gravity design application 140 of FIG. 1, according to various embodiments. As described previously herein in conjunction with FIG. 1, the gravity design application 140 solves the layout and gravity design optimization problem. In some embodiments, to solve the layout and gravity design optimization problem, the gravity design application 140 generates the gravity designs 148 and the gravity design objective values 146 based on the building plan 124 and the design instructions 130.

As described previously herein in conjunction with FIG. 1, each of the gravity designs 148 is a different design for the structural system that is optimized based on the constraints 132 and the objective function 134 without taking into account the building wind load(s). In some embodiments, the gravity design application 140 implements a branch-merge design flow to generate the gravity designs 148. In the same or other embodiments, the gravity design application 140 includes, without limitation, a design concept engine 220, any number of instances of a floor design engine 210 (not explicitly shown), and a multi-floor optimizer 290.

In some embodiments, the design concept engine 220 branches the layout and gravity design optimization problem into a different floor optimization problem for each of the floors of the building. As shown, in some embodiments, the design concept engine 220 generates floor structure templates 222(1)-222(F) based on the floor outlines 128(1)-128(F), respectively, and the design instructions 130. For explanatory purposes only, the floor structure templates 222(1)-222(F) are also referred to herein individually as "the floor structure template 222" and collectively as "the floor structure templates 222."

Each of the floor structure templates 222 is a template for layouts of a portion of the structural system corresponding to a different floor. The portions of the structural system corresponding to each of the floors in the building are also referred to herein individually as a "floor structure" and collectively as "floor structures." In some embodiments, each layout of a given floor structure includes, without limitation, any number and/or types of horizontal structural members associated with the corresponding floor and any number and/or types of vertical structural members that are designed as part of the floor structure. In the same or other embodiments, the vertical structural members that are designed as part of a given floor structure include, without limitation, any number and/or type of vertical members that extend down from the floor to an immediately lower floor (if one exists) or a foundation. In some embodiments, each layout of a given floor structure specifies, without limitation, locations, types, and materials for a slab, any number of beams, and any number of columns.

The design concept engine 220 can generate the floor structure templates 222 in any technically feasible fashion. In some embodiments, the design concept engine 220 generates the floor structure templates 222(1)-222(W) that each specify, without limitation, a slab (not shown) that is characterized by a slab material/type (not shown) and has a location that specifies dimensions associated with the dimensions of the floor outlines 128(1)-128(W), respectively. In the same or other embodiments, horizontal cross-sections of the slabs specified in the floor structure templates 222(1)-222(W) match the floor outlines 128(1)-128(W), respectively.

One example of a slab material/type is a two-way reinforced concrete slab with reinforced concrete beams that is constructed using square panels having an aspect ratio of 1.0. Another example of a slab material/type is a precast hollow core slab with precast beams that is constructed using rectangular panels having an aspect ratio of 1.25. Yet another example of a slab material/type is post-tensioned flat slab that is constructed using rectangular panels having an aspect ratio of 1.5. The design concept engine 220 can determine the slab material/type in any technically feasible fashion.

In some embodiments, the slab material/type is specified in the design instructions 130. In some other embodiments, the design concept engine 220 implements any number of expert system techniques to determine the slab material/type. For instance, in some embodiments, the design concept engine 220 determines the slab material/type based on the dimensions of the floor outlines 128, the constraints 132, the objective function 134, the design variable data 136, or any combination thereof based on one or more rules included in a knowledge base (not shown).

In some embodiments, the design concept engine 220 configures the floor design engine 210 to solve the floor optimization problem for each of the floor structures independently. More precisely, the design concept engine 220 configures the floor design engine 210 to generate ranked floor design lists 288(1)-288(F) based on the floor structure templates 222(1)-222(F), respectively, and the design instructions 130. For explanatory purposes only, the ranked floor design lists 288(1)-288(F) are also referred to herein individually as "the ranked floor design list 288" and collectively as "the ranked floor design lists 288."

Although not shown, each of the ranked floor design lists 288 is associated with a different floor structure and specifies, without limitation, any number of instances of an optimized partial design 268 (not explicitly shown in FIG. 2) and corresponding instances of a partial objective value 266 (not explicitly shown in FIG. 2). For explanatory purposes only, instances of the optimized partial design 268 are also referred to herein individually as "the optimized partial design 268" and collectively as "the optimized partial designs 268." Further, instances of the partial objective value 266 are also referred to herein individually as "the partial objective value 266" and collectively as "the partial objective values 266."

Each of the optimized partial designs 268 is a design for at least a portion of the structural system and specifies, without limitation, sizing data of the constituent structural members that is optimized based on the constraints 132 and the objective function 134 without taking lateral loads into account. Each of the partial objective values 266 corresponds to different one of the optimized partial designs 268 and is a value of the objective function 134 for the optimized partial design 268.

Each of the optimized partial designs 268 that is included in the ranked floor design list 288 associated with a given floor structure is a different design for the floor structure. For explanatory purposes only, the optimized partial designs 268 that correspond to a given floor structure are also referred to herein individually as "the optimized partial design 286 of the floor structure" and collectively as "the optimized partial designs 268 of the floor structure."

The design concept engine 220 can configure any number of instances of the floor design engine 210 to generate the ranked floor design lists 288(1)-288(F) sequentially, concurrently, or in any combination thereof in any technically feasible fashion. For explanatory purposes only, instances of the floor design engine 210 are also referred to herein individually as "the floor design engine 210" and collectively as "the floor design engines 210."

As shown, in some embodiments, the gravity design application 140 configures the floor design engines 210(1)-210(F) to concurrently generate the ranked floor design lists 288(1)-288(F), respectively, based on the floor structure templates 222(1)-222(F), respectively, and the design instructions 130. In some other embodiments, the design concept engine 220 configures a single instance of the floor design engine 210 to sequentially generate the ranked floor design lists 288(1)-288(F).

The floor design engine 210 can generate the ranked floor design list 288 for a given floor structure based on the floor structure template 222 for the floor structure and the design instructions 130 in any technically feasible fashion. For explanatory purposes only, the functionality of the floor design engine 210 in some embodiments is described in greater detail below in the context of the floor design engine 210(1) depicted in FIG. 2 that generates the ranked floor design list 288(1) based on the floor structure template 222(1) and the design instructions 130. For explanatory purposes only, the floor structure template 222(1) and the floor structure template 222(1) are both associated with a first floor structure.

In some embodiments, the floor design engine 210(1) includes, without limitation, a partitioning engine 224, any number of instances of a segment design engine 240 (not explicitly shown), and an incremental merging engine 280. The partitioning engine 224 branches the floor optimization problem associated with a given floor structure into multiple different segment optimization problems. In some embodiments, the partitioning engine 224 can branch each of the floor optimization problems into a different number of segment optimization problems.

In some embodiments, for each of the floor structures, each of the segment optimization problems is associated with a different portion of the floor structure that is represented as a different instance of a segment 230 (not explicitly shown). For explanatory purposes only, instances of the segments 230 are also referred to herein individually as "the segment 230" and collectively as "the segments 230." The partitioning engine 224 can generate the segments 230 associated with a given floor structure in any technically feasible fashion.

As shown, in some embodiments, the partitioning engine 224 generates the segments 230(1)-230(S) based on the floor structure template 222(1) and the design instructions 130, where S can be any positive integer. In the same or other embodiments, each of the segments 230(1)-230(S) associated with the floor structure template 222(1) is associated with a different portion of the slab specified in the floor structure template 222(1). In some embodiments, the partitioning engine 224 determines the value of S prior to generating the segments 230(1)-230(S). For instance, in some embodiments, the partitioning engine 224 sets S equal to the maximum variation count (denoted as N) that is specified in the parameter data 138. In some other embodiments, the value of S is defined indirectly by the number of the segments 230 that the partitioning engine 224 generates based on the floor structure template 222(1).

In some embodiments, the partitioning engine 224 implements a rule-based expert system to partition the floor structure template 222(1) into the segments 230(1)-230(S) based on any amount and/or type of data included in the design instructions 130. In the same or other embodiments, the partitioning engine 224(1) partitions the floor structure template 222(1) into the segments 230(1)-230(S) based, at least in part, on the shape of the floor structure template 222 and/or the associated slab material/type.

For instance, in some embodiments, if the floor is U-shaped, then the partitioning engine 224 partitions the floor structure template 222 into at least one or more east wings, one or more central wings, and one or more west wings. In the same or other embodiments, if the slab material/type corresponding to the floor structure template 222 specifies that the slab is constructed of panels, then the partitioning engine 224 partitions the floor structure template 222 into the segments 230(1)-230(S) based, at least in part, on the dimensions of each of the panels.

The partitioning engine 224 configures the segment design engine 240 to independently solve the segment optimization problem for each of the segments 230(1)-230(S). In some embodiments, to solve the segment optimization problems for the segments 230(1)-230(S), the partitioning engine 224 configures the segment design engine 240 to generate ranked segment design lists 278(1)-278(S) based on the segments 230(1)-230(S) respectively, and the design instructions 130.

The ranked segment design lists 278(1)-278(S) are a subset of instances of the ranked segment design list 278 (not explicitly shown) that are associated with the floor structure template 222(1). In general, each instance of the segment design list 278 is associated with a different instance of the segment 230. For explanatory purposes only, the instances of the ranked segment design list 278 are also referred to herein individually as "the ranked segment design list 278" and collectively as "the ranked segment design lists 278." Although not shown, each of the ranked segment design lists 278 specifies, without limitation, any number of the optimized partial designs 268 of the associated segment 230 and the corresponding instances of the partial objective value 266.

The partitioning engine 224 can configure any number of instances of the segment design engine 240 to generate the ranked segment design lists 278(1)-278(S) sequentially, concurrently, or in any combination thereof in any technically feasible fashion. For explanatory purposes only, instances of the segment design engine 240 are also referred to herein individually as "the segment design engine 240" and collectively as "the segment design engines 240."

As shown, in some embodiments, the partitioning engine 224(1) configures the segment design engines 240(1)-240(S) to concurrently generate the ranked segment design lists 278(1)-278(S), respectively, based on the segments 230(1)-230(S), respectively, and the design instructions 130. In some other embodiments, the partitioning engine 224(1) configures a single instance of the segment design engine 240 to sequentially generate the ranked segment design lists 278(1)-278(S).

The segment design engine 240 can generate each of the ranked segment design lists 278 in any technically feasible fashion. For explanatory purposes only, the functionality of the segment design engine 240 in some embodiments is described in greater detail below in the context of the segment design engine 240(1) depicted in FIG. 2 that generates the ranked segment design list 278(1) based on the segment 230(1) and the design instructions 130. As shown, in some embodiments, the segment design engine 240 includes, without limitation, a layout variation engine 250, any number of instances of a gravity design optimizer 260, and a segment design ranking engine 270.

In some embodiments, the layout variation engine 250 generates partial design 258(1)-258(K) based on the segment 230(1) and the design instructions 130, where K can be any positive integer. The partial designs 258(1)-258(K) are a subset of instances of a partial design 258 (not explicitly shown in FIG. 2) that are associated with the segment 230(1). In some embodiments, the layout variation engine 250 can generate a different number of instances of the partial designs 258 for each of the segments 230.

For explanatory purposes only, instances of the partial design 258 are also referred to herein individually as "the partial design 258" and collectively as "the partial designs 258." Each of the partial designs 258 is a design for at least a portion of the structural system. For each of the segments 230, the partial designs 258 that are generated by the layout variation engine 250 based on the segment 230 are different designs of the segment 230 and are also referred to herein as "the partial designs 258 of the segment 230."

The layout variation engine 250 can determine the value of K in any technically feasible fashion. For instance, in some embodiments, the layout variation engine 250 sets K equal to the maximum variation count (denoted as N) that is specified in the parameter data 138. In some other embodiments, the value of K is defined indirectly by the number of the partial designs 258 that the layout variation engine 250 generates for the segment 230(1). The layout variation engine 250 can generate any number of the partial designs 258 for each of the segments 230 in any technically feasible fashion.

In some embodiments, the layout variation engine 250 includes, without limitation, any number of instances of a segment layout 252 (not explicitly shown), and the layout variation engine 250 generates the partial designs 258 of the segment 230 based on the instances of the segment layout 252 For explanatory purposes only, instances of the segment layout 252 are also referred to herein individually as "the segment layout 252" and collectively as "the segment layouts 252." Each of the segment layouts 252 is a layout of one of the segments 230. Each of the segment layouts 252 generated by the layout variation engine 250 based on the segment 230 is a different layout of the segment 230. The layout variation engine 250 can generate the segment layouts 252 in any technically feasible fashion.

In some embodiments, the layout variation engine 250 implements any number and/or types of expert system techniques to generate any number of the segment layouts 252 based on the segment 230 and optionally any amount (including none) of the design instructions 130. For instance, in some embodiments, the layout variation engine 250 generates any number of the segments layouts 252 based on the segment 230, any number of rules included in a knowledge database (not shown), and any amount (including none) of the design instructions 130.

In the same or other embodiments, the layout variation engine 250 uses a "filtering" trained machine learning model to predict which (if any) of the segment layouts 252 are subpar. The layout variation engine 250 then discards any of the segment layouts 252 that are predicted to be subpar. In some embodiments, the layout variation engine 250 and/or the gravity design application 140 store any amount and/or types of training data for use in re-training the filtering trained machine learning model.

For explanatory purposes only, in some embodiments, the layout variation engine 250 generates and does not subsequently discard, the segment layouts 252(1)-252(K) based on the segment 230(1). The layout variation engine 250 initializes each of the partial designs 258(1)-258(K) to an empty design. The layout variation engine 250 then copies the segment layouts 252(1)-252(K) to the partial designs 258(1)-258(K), respectively. In some embodiments, the layout variation engine 250 specifies defaults for any amount and/or type of sizing data and/or any amount and/or types of connection data in the segment layouts 252. For instance, in some embodiments, the layout variation engine 250 specifies that each of the connections between the structural members of each of the partial designs 258 is a rigid joint. In some other embodiments, for each of the partial designs 258, the layout variation engine 250 specifies that each of the connections that are on the outer perimeter of the building is a rigid joint and that other connections are hinged joints or pin joints.

As shown, in some embodiments, the layout variation engine 250 configures the gravity design optimizer 260 to generate the optimized partial designs 268(1)-268(K) and the partial objective values 266(1)-266(K) based on the partial designs 258(1)-258(K) and the design instructions 130. The layout variation engine 250 can configure any number of instances of the gravity design optimizer 260 to generate the optimized partial design 268(1)-268(K) and the partial objective values 266(1)-266(K) sequentially, concurrently, or in any combination thereof in any technically feasible fashion. For explanatory purposes only, instances of the gravity design optimizer 260 are also referred to herein individually as "the gravity design optimizer 260" and collectively as "the gravity design optimizers 260."

As shown, in some embodiments, the layout variation engine 250 configures the gravity design optimizers 260(1)-260(K) to concurrently generate the optimized partial design 268(1)-268(K), respectively, and the partial objective values 266(1)-266(K), respectively, based on the partial designs 258(1)-258(K), respectively, and the design instructions 130. In some other embodiments, the layout variation engine 250 configures a single instance of the gravity design optimizer 260 to sequentially generate the optimized partial design 268(1)-268(K) and the partial objective values 266(1)-266(K).

The gravity design optimizer 260 can perform any number and/or types of optimization operations on the sizing of the structural members included in the partial design 258 to generate the optimized partial design 268. As described in greater detail below in conjunction with FIG. 3, in some embodiments, the gravity design optimizer 260 sequentially optimizes the sizing of the slab, the beams, and the columns included in the partial design 258 to generate the optimized partial design 268.

As shown, in some embodiments, the segment design ranking engine 270 generates the ranked segment design list 278(1) based on the optimized partial designs 268(1)-268(K) and the partial objective values 266(1)-266(K). The segment design ranking engine 270 can generate the ranked segment design list 278(1) in any technically feasible fashion. For instance, in some embodiments, the segment design ranking engine 270 ranks the optimized partial designs 268(1)-268(K) based on the partial objective values 266(1)-266(K).

In some embodiments, the segment design ranking engine 270 filters out any number of the optimized partial designs 268(1)-268(K) when generating the ranked segment design list 278(1) based on any number and/or type of filtering criteria. Consequently, in such embodiments, the total number of the optimized partial designs 268 specified in the ranked segment design list 278(1) is less than K. The optimized partial designs 268(1)-268(K) are also referred to herein as "potential segment designs," and the optimized partial designs 268 specified in the ranked segment design list 178(1) are also referred to herein as "segment designs." For instance, in some embodiments, the filtering criteria is to specify the N best of the partial objective values 266(1)-266(K) and the associated optimized partial designs 268(1)-268(K) via the ranked segment design list 278(1), where N is the maximum variation count. The segment design ranking engine 270 discards the remainder of the partial objective values 266(1)-266(K) and the associated optimized partial designs 268(1)-268(K).

In some embodiments, for each of the floors, the floor design engine 210 configures the incremental merging engine 280 to generate the ranked floor design list 288 associated with the floor based on the ranked segment design lists 278 associated with the floor and the design instructions 130 In the same or other embodiments, the incremental merging engine 280 includes, without limitation, any number of instances of the gravity design optimizer 260. The incremental merging engine 280 can generate the ranked floor design lists 288(1)-288(S) in any technically feasible fashion.

In some embodiments, the floor design engine 210(1) configures the incremental merging engine 280 to generate the ranked floor design list 288(1) based on the ranked segment design lists 278(1)-278(S) and the design instructions 130. Each of the optimized partial designs 268 included in the ranked floor design list 288(1) is a design for the first floor structure that is optimized based on the constraints 132 and the objective function 134 without taking into account lateral loads. In some embodiments, each of the optimized partial designs 268 included in the ranked floor design list 288(1) is generated based on a different set of S instances of the optimized partial design 268. Each set of S instances includes, without limitation, one of the optimized partial designs 268 from each of the ranked segment design lists 278(1)-278(S) associated with the first floor structure.

In some embodiments, the incremental merging engine 280 executes (S−1) different expansion iterations to generate the ranked floor design list 288(1). During the first expansion iteration, the incremental merging engine 280 sets a segment ranking value for each of the segments 230(1)-230(S) equal to the best of the partial objective values 266 that are included in the ranked segment design lists 278(1)-278(S), respectively. The incremental merging engine 280 selects the segment 230 having the worst segment ranking value from the segments 230(1)-230(S) as a first merge participant. In some embodiments, the structural design application 120 attempts to maximize the objective function 134, and the worst segment ranking value is the lowest of the segment ranking values. In some other embodiments, the structural design application 120 attempts to minimize the objective function 134, and the worst segment ranking value is the highest of the segment ranking values. The incremental merging engine 280 then selects the segment having the worst segment ranking from the subset of the segments 230(1)-230(S) that are adjacent to the first merge participant as a second merge participant.

The incremental merging engine 280 performs any number of merging operations between the optimized partial designs 268 of the first merge participant and the optimized partial designs 268 of the second merge participant to generate any number of new instances of the partial design 258. Each new instance of the partial design 258 represents both of the merge participants and is also referred to herein as a "partial floor design." The incremental merging engine 280 then configures the gravity design optimizer 260 to generate new instances of the optimized partial design 268 and new instances of the partial objective values 266 based on the new instances of the partial designs 258 and the design instructions 130. The incremental merging engine 280 generates a ranked merged design list (not shown) that includes, without limitation, the N new instances of the optimized partial design 268 corresponding to the N best new partial objective values.

For each of the subsequent expansion iterations, the incremental merging engine 280 selects a new merge participant having the worst segment ranking value from the subset of the segments 230(1)-230(S) that are adjacent to one of the previously selected merge participants and have not yet been selected as a merge participant. The incremental merging engine 280 then performs any number of merging operations between the optimized partial designs 268 of the new merge participant and the ranked merged design list to generate any number of the new instances of the partial design 258. The incremental merging engine 280 re-generates the ranked merged design list based on the new instances of the partial design 258. After completing the (S−1) expansion iteration, the incremental merging engine 280 sets the ranked floor design list 288(1) equal to the ranked merged design list.

In some other embodiments, the incremental merging engine 280 executes any number and/or type of search algorithms and/or optimization algorithms to generate the ranked floor design list 288(1), For instance, in some embodiments, the incremental merging engine 280 can execute any number and/or types of genetic algorithms, any number and/or types of harmony search algorithms, any number and/or types of integer optimization algorithms, the gravity design optimizer 260, or any combination thereof to generate the ranked floor design list 288(1).

As shown, in some embodiments, the gravity design application 140 configures the multi-floor optimization 290 to generate the gravity designs 148(1)-148(N) and the gravity design objective values 146(1)-146(N) based on the ranked floor design lists 288(1)-288(F). In some embodiments, the gravity design application 140 generates each of the gravity designs 148(1)-148(N) based on a different set of F of the optimized partial designs 268. Each set of F of the optimized partial designs 268 includes, without limitation, one of the optimized partial designs 268 from each of the ranked floor design lists 288(1)-288(F).

In some embodiments, the multi-floor optimizer 290 executes any number and/or types of incremental merging operations and/or aggregation operations based on the ranked floor design lists 288(1)-288(F) to generate the gravity designs 148(1)-148(N). In the same or other embodiments, the multi-floor optimizer 290 executes any number and/or type of search algorithms in any combination to generate the gravity designs 148. For instance, in some embodiments, the multi-floor optimizer 290 executes any number and/or types of genetic algorithms, any number and/or types of harmony search algorithms, any number and/or types of integer optimization algorithms, or any combination thereof to generate the gravity designs 148.

The multi-floor optimizer 290 compute the gravity design objective values 146(1)-146(N) corresponding to the gravity designs 148(1)-148(N) in any technically feasible fashion. For instance, in some embodiments, the multi-floor optimizer 290 applies the objective function 134 to the gravity designs 148(1)-148(N) to compute the gravity design objective values 146(1)-146(N), respectively. Because the multi-floor optimizer 290 merges combinations of the optimized partial designs 268 that correspond to different floor structures, and the optimized partial designs 268 are not necessarily optimized for lateral loads, the multi-floor optimizer 290 does not optimize the sizing of any of the structural members in some embodiments.

In the same or other embodiments, the multi-floor optimizer 290 computes and specifies any number of vertical loads for each of the gravity designs 148 based on any number of vertical loads specified in the optimized partial designs 268 associated with the gravity design 148. For instance, in some embodiments, the multi-floor optimizer 290 sums the vertical loads of the optimized partial designs 268 associated with the gravity design 148 at the interfaces of the columns to determine the corresponding vertical loads for the gravity design 148. In the same or other embodiments, for the optimized partial design 268 corresponding to a given floor structure, the multi-floor optimizer 290 uses transfer beams when there is no column in the optimized partial design 268 corresponding to the floor structure that is one level below the floor structure. A transfer beam takes the loading from such "orphan" columns and transfers the load onto one or more existing columns and/or beams in the optimized partial design 268 corresponding to the floor structure that is one level below the floor structure.

Figure 3:
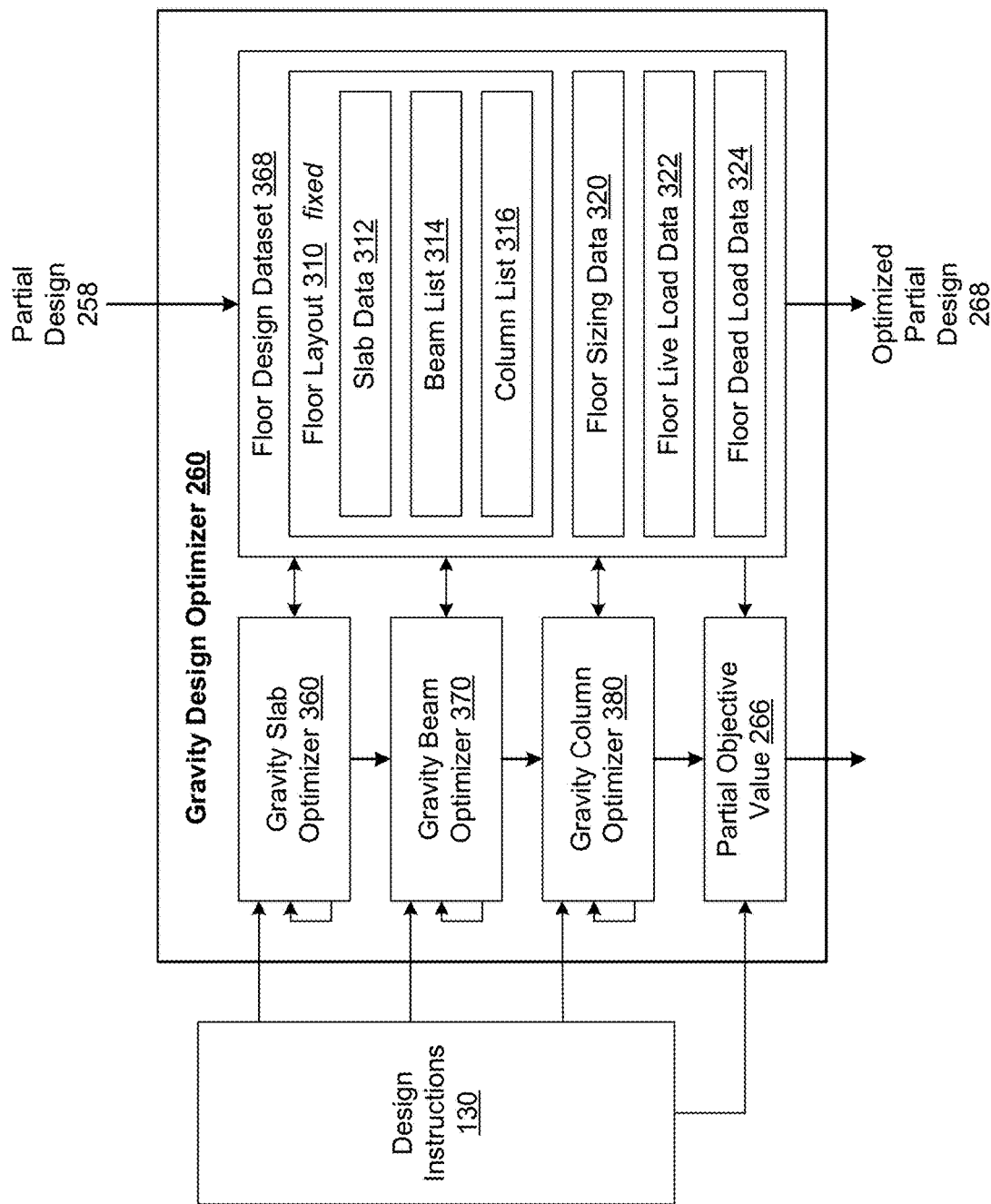
FIG. 3 is a more detailed illustration of the gravity design optimizer of FIG. 2, according to various embodiments.

FIG. 3 is a more detailed illustration of the gravity design optimizer 260 of FIG. 2, according to various embodiments. As shown, in some embodiments, the gravity design optimizer 260 generates the optimized partial design 268 and the partial objective value 266 based on the partial design 258 and the design instructions 130. As described previously herein in conjunction with FIG. 1, each instance of the partial design 258 is a design for at least a portion of the structural system. More specifically, in some embodiments, each instance of the partial design 258 that the gravity design optimizer 260 receives is a design for at least a portion of one of the floor structures.

As shown, in some embodiments, the gravity design optimizer 260 generates a floor design dataset 368 based on the partial design 258. In the same or other embodiments, the floor design dataset 368 includes, without limitation, a floor layout 310, floor sizing data 320, floor live load data 322, and floor dead load data 324. In some embodiments, the floor layout 310 includes, without limitation, slab data 312, a beam list 314, and a column list 316. The slab data 312 specifies, without limitation, a location, material, and type of a slab (not shown). The beam list 314 specifies, without limitation, locations, materials, and types of any number of beams (not shown). The column list 316 specifies, without limitation, locations, materials, and types any number of columns (not shown). As depicted in italics, in some embodiments, the floor layout 310 is fixed.

The floor sizing data 320 specifies, without limitation, any amount and/or types of sizing data for the slab, beams, and columns specified in the floor layout 310. In some embodiments, the floor live load data 322 includes, without limitation, any number and/or types of live loads for each of the rooms included in the floor layout 310. The floor dead load data 324 includes, without limitation, any number and/or types of dead loads associated with the floor layout 310.

Although not shown, in some embodiments, the floor design dataset 368 specifies any number and/or type of default connections between the structural members specified in the floor layout 310. For instance, in some embodiments, the floor design dataset 368 specifies that each of the connections between the structural members specified in the floor layout 310 is a rigid joint. Notably, the floor design dataset 368 does not specify any lateral loads, and the gravity design optimizer 260 does not take any lateral loads (e.g., the building wind load(s)) into account.

As shown, in some embodiments, the gravity design optimizer 260 includes, without limitation, a gravity slab optimizer 360, a gravity beam optimizer 370, and a gravity column optimizer 380. In some embodiments, the gravity design optimizer 260 configures the gravity slab optimizer 360 to optimize the sizing of the slab specified in the slab data 312 based on the constraints 132 and the objective function 134 without taking any lateral loads into account. The gravity slab optimizer 360 can optimize the sizing of the slab in any technically feasible fashion.

In some embodiments, the gravity slab optimizer 360 sorts different design options from best to worst based on corresponding objective values. The gravity slab optimizer 360 then executes a bisection algorithm to find the design option having the best objective value that satisfies constraints 132. In some other embodiments, the gravity slab optimizer 360 iteratively optimizes the sizing of the slab via a non-gradient based optimization algorithm. For instance, in some embodiments, the gravity slab optimizer 360 determines the available thicknesses of the slab and the available thicknesses of the reinforcement based on the design variable data 136 and the type of the slab. The gravity slab optimizer 360 uses structural engineering fundamentals to determine the smallest thickness and the smallest reinforcement for the smallest thickness that satisfies the constraints 132.

In some embodiments, prior to modifying the sizing of the slab, the gravity slab optimizer 360 computes the live load and an initial value for the dead load. As the gravity slab optimizer 360 iteratively modifies the sizing of the slab, the gravity slab optimizer recomputes the associated dead load.

In some embodiments, the initial value for the dead load includes, without limitation, contributions from surface finishes (e.g., floor tiles) that the gravity slab optimizer 360 does not subsequently change in addition to contributions from the self-weight of the slab that the gravity slab optimizer 360 recomputes as the gravity slab optimizer modifies the sizing of the slab. In some embodiments, after the gravity slab optimizer 360 finishes modifying the sizing of the slab, the gravity slab optimizer 360 updates the floor sizing data 320, the floor live load data 322, and the floor dead load data 324. In the same or other embodiments, the gravity design application 140 determines the slab spanning type (e.g., one-way spanning, two-way spanning, cantilever, etc.) using domain knowledge-based rules.

Subsequently, in some embodiments, the gravity design optimizer 260 distributes the dead loads and the live loads across a subset of the beams specified in the beam list 314 based on the slab spanning type. The gravity design optimizer 260 updates the floor live load data 322 and the floor dead load data 324 accordingly. The gravity design optimizer 260 then configures the gravity beam optimizer 370 to optimize the sizing of the beams specified in the beam list 314 based on the constraints 132 and the objective function 134 without taking any lateral loads into account. The gravity beam optimizer 370 can optimize the sizing of the beams in any technically feasible fashion. For instance, in some embodiments, the gravity beam optimizer 370 can use a bisection algorithm to optimize the sizing of the beams.

For instance, in some embodiments, the gravity beam optimizer 370 iteratively optimizes the sizing of the beams via a bisection algorithm and any number and/or type of structural engineering fundamentals. In the same or other embodiments, the gravity beam optimizer 370 optimizes the sizing of the beams via any number and/or type of expert systems and/or trained machine learning models. In some embodiments, after the gravity beam optimizer 370 finishes modifying the sizing of the beams, the gravity beam optimizer 370 updates the floor sizing data 320 and the floor dead load data 324.

Subsequently, in some embodiments, the gravity design optimizer 260 distributes the dead loads and the live loads across the columns specified in the column list 316 and updates the floor live load data 322 and the floor dead load data 324 accordingly. The gravity design optimizer 260 then configures the gravity column optimizer 380 to optimize the sizing of the columns specified in the column list 316 based on the constraints 132 and the objective function 134 without taking any lateral loads into account. The gravity column optimizer 380 can optimize the sizing of the columns in any technically feasible fashion.

For instance, in some embodiments, the gravity column optimizer 380 iteratively optimizes the sizing of the columns via a bisection algorithm and any number and/or type of structural engineering fundamentals. In the same or other embodiments, the gravity column optimizer 380 optimizes the sizing of the columns via any number and/or type of expert systems and/or trained machine learning models. In some embodiments, after the gravity column optimizer 380 finishes modifying the sizing of the columns, the gravity column optimizer 380 updates the floor sizing data 320 and the floor dead load data 324.

As shown, in some embodiments, the gravity design optimizer 260 then generates the optimized partial design 268 based on the floor design dataset 368. In some embodiments, the gravity design optimizer 260 computes the partial objective value 266 based on the floor design dataset 368 and the objective function 134. In some other embodiments, the gravity design optimizer 260 computes the partial objective value 266 based on the optimized partial design 268 and the objective function 134.

In some embodiments, the gravity design optimizer 260 transmits the optimized partial design 268 and/or the partial objective value 266 to any number of other software applications in any technically feasible fashion. In the same or other embodiments, the gravity design optimizer 260 stores the optimized partial design 268 and/or the partial objective value 266 in a memory that is accessible to at least one other software application. In some embodiments, the gravity design optimizer 260 stores the optimized partial design 268 and the partial objective value 266 in a memory that is accessible to the gravity design application 140.

Note that the techniques described herein are illustrative rather than restrictive and can be altered without departing from the broader spirit and scope of the invention. For instance, in some embodiments, the gravity design optimizer 260 omits the floor design dataset 368 and configures the gravity slab optimizer 360, the gravity beam optimizer 370, and the gravity column optimizer 380 to modify the partial design 258 in any technically feasible fashion.

Using Unsupervised Clustering to Generate Frame Grids

Figure 4:
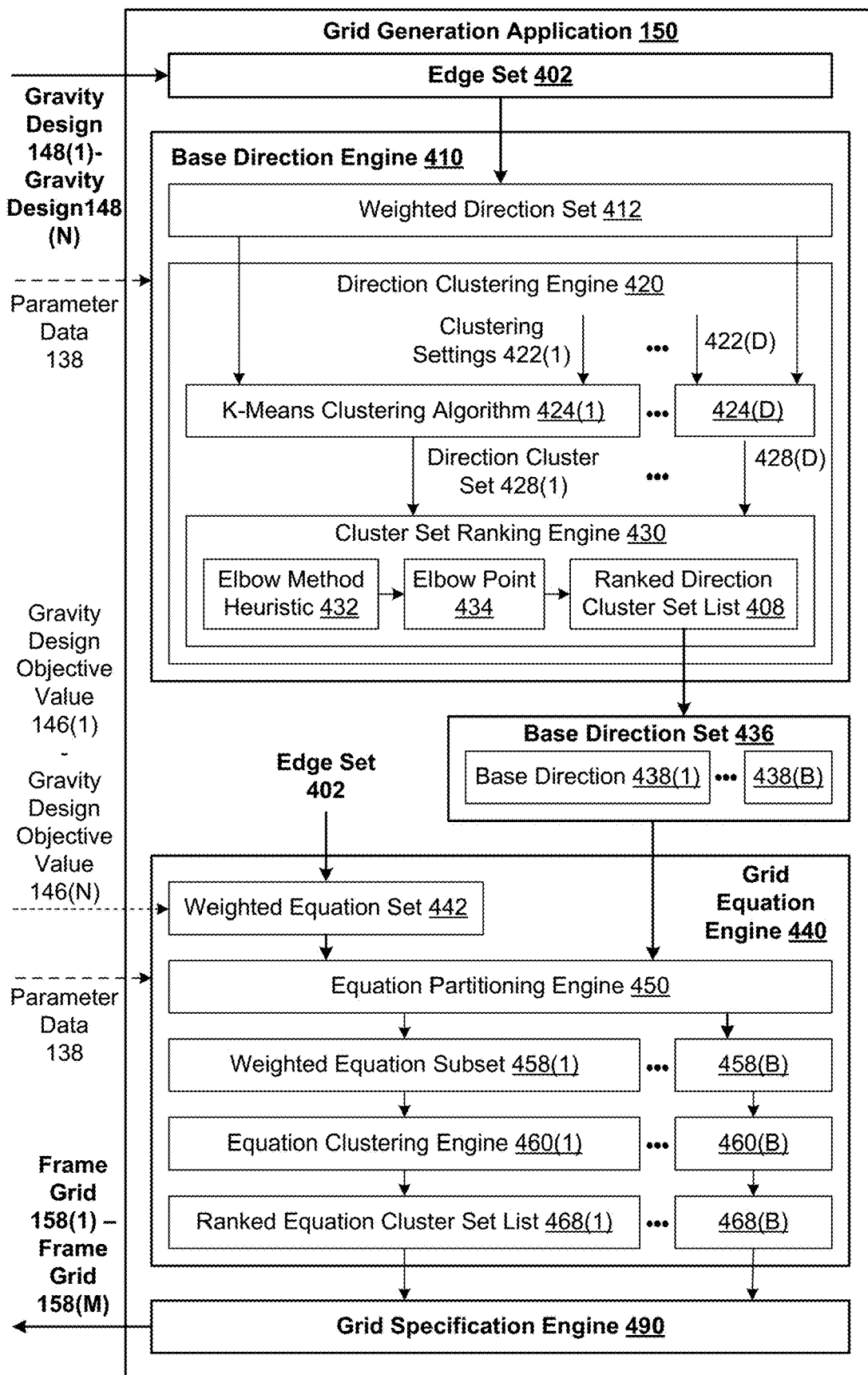
FIG. 4 is a more detailed illustration of the grid generation application of FIG. 1, according to various embodiments.

FIG. 4 is a more detailed illustration of the grid generation application 150 of FIG. 1, according to various embodiments. For explanatory purposes only, in the embodiment depicted in FIG. 4, the functionality of the grid generation application 150 is described in the context of solving the frame grid optimization problem described previously herein in conjunction with FIG. 1.

In some embodiments, the structural design application 120 inputs the gravity designs 148(1)-148(N) and optionally the gravity design objective values 146(1)-146(N), and/or any amount of the parameter data 138 into the grid generation application 150. In response, the grid generation application 150 generates and outputs the frame grids 158(1)-158(M). In some other embodiments, the grid generation application 150 can be configured to generate any number and/or types of grids for any type of lateral load resisting structural members based, at least in part, on any number and/or types of designs for structural systems that resist vertical loads.

As described previously herein, each of the gravity designs 148 specifies, without limitation, the positions, types, and materials of any number of structural members that, together, resist vertical loads. In some embodiments, the gravity design objective value 146(x), where x is an integer between 1 and N, correlates to a degree of convergence between the gravity design 148(x) and the design objectives. The portion of the parameter data 138 that is inputted into the grid generation application 150 specifies, without limitation, parameter values for any number and/or type of parameters that are relevant to generating the frame grids 158.

As shown, in some embodiments, the grid generation application 150 includes, without limitation, a base direction engine 410, a grid equation engine 440, and a grid specification engine 490. Upon receiving the gravity designs 148, the grid generation application 150 generates an edge set 402. To generate the edge set 402, the grid generation application 150 initializes the edge set 402 to an empty list. For each of the gravity designs 148, the grid generation application 150 adds the beams (not shown) that are attached to at least one of the columns (not shown) to the edge set 402 as edges (not shown). Accordingly, the edge set 402 includes, without limitation, any number of edges that each corresponds to a different beam. Each of edges is associated with both a direction and a length.

In some embodiments, the grid generation application 150 associates each of the edges with the gravity design 148 that includes the corresponding beam. In the same or other embodiments, the grid generation application 150 denotes each edge that is on the boundary of the gravity design 148 that includes the corresponding beam as a boundary edge. The grid generation application 150 can associate the edges with the gravity designs 148 and/or denote the edges that are also boundary edges in any technically feasible fashion.

In some embodiments, the grid generation application 150 inputs the edge set 402 and optionally any portion of the parameter data 138 into the base direction engine 410. In response, the base direction engine 410 generates a ranked direction cluster set list 408. The ranked direction cluster set list 408 is described in greater detail below. As shown, the base direction engine 410 includes, without limitation, a direction clustering engine 420.

In some embodiments, the base direction engine 410 generates a weighted direction set 412 based on the edge set 402. To generate the weighted direction set 412, the base direction engine 410 determines the unique directions of the edges included in the edge set 402. The base direction engine 410 then weights each of the directions based on the total length of the non-boundary edges in the direction and the total length of the boundary edges in the direction to generate a corresponding weighted direction (not shown). Subsequently, the base direction engine 410 generates the weighted direction set 412 that includes, without limitation, the weighted directions. In some other embodiments, the base direction engine 410 can determine and weight the directions in any technically feasible fashion based on any amount and/or types of criteria that are relevant to generating the frame grids 158.

The base direction engine 410 then inputs the weighted direction set 412 and optionally any portion of the parameter data 138 into the direction clustering engine 420. The direction clustering engine 420 performs any number and/or types of unsupervised clustering operations based on the weighted direction set 412 to generate direction cluster sets 428(1)-428(D), where D can be any positive integer. The direction cluster sets 428(1)-428(D), are also referred to herein individually as "the direction cluster set 428" and collectively as "the direction cluster sets 428." Each of the direction cluster sets 428 specifies, without limitation, a different distribution of the weighted directions included in the weighted direction set 412 across any number of direction clusters (not shown). Notably, the number of direction clusters included in any given pair of the direction cluster sets 428 can be the same or different.

Subsequently, the direction clustering engine 420 can perform any number and/or types of ranking and/or filtering operations on the direction cluster sets 428 to generate the ranked direction cluster set list 408. The direction clustering engine 420 and/or the base direction engine 410 can determine the total number of the direction cluster sets 428 (denoted herein as D) in any technically feasible fashion based on any amount and/or type of data. For instance, in some embodiments, the base direction engine 410 determines a value for D based on the parameter data 138 and the configures the direction clustering engine 420 to generate D of the direction cluster sets 428. In some other embodiments, the direction clustering engine 420 implements a default value for D.

More specifically, in some embodiments, the direction clustering engine 420 includes, without limitation, K-means clustering algorithms 424(1)-424(D) and a cluster set ranking engine 430. Each of the K-means clustering algorithms 424(1)-424(D) is a different instance of a K-means clustering algorithm 424 (not explicitly shown) that implements K-means clustering. As persons skilled in the art will recognize, K-means clustering refers to a type of well-known unsupervised learning algorithms that generate a pre-determined number of clusters. The K-means clustering algorithms 424(1)-424(D) are also referred to herein individually as "the K-means clustering algorithm 424" and collectively as "the K-means clustering algorithms 424." In some embodiments, the base direction engine 410 configures the K-means clustering algorithms 424(1)-424(D) to concurrently generate the direction cluster sets 428(1)-428(D), respectively.

In some other embodiments, the base direction engine 410 configures less than D instances of the K-means clustering algorithm 424 to generate the direction cluster sets 428(1)-428(D) sequentially, concurrently, or in any combination thereof in any technically feasible fashion. For instance, in some embodiments, the base direction engine 410 configures a single instance of the K-means clustering algorithm 424 to sequentially generate the direction cluster sets 428(1)-428(D).

The direction clustering engine 420(0) can configure any number of instances of the K-means clustering algorithm 424 to generate the direction cluster sets 428(1)-428(D), respectively, in any technically feasible fashion. For instance, in some embodiments, the direction clustering engine 420(0) inputs the clustering setting 422(1)-422(D), respectively, into the K-means clustering algorithms 424(1)-424(D), respectively. In response, the K-means clustering algorithms 424(1)-424(D) output the direction cluster sets 428(1)-428(D), respectively.

The clustering settings 422(1)-422(D) are also referred to herein individually as "the clustering setting 422," and collectively as "the clustering settings 422." Each of the clustering settings 422 includes, without limitation, a different combination of values for any number and/or types of settings that are relevant to the K-means clustering algorithm 424. In some embodiments, each of the clustering settings 422 specifies a different combination of a value of K (i.e., the number of the clusters to generate) and seeding.

The direction clustering engine 420 can determine the clustering settings 422 in any technically feasible fashion. For instance, in some embodiments, the direction clustering engine 420 randomly generates the value of K and the seeding for each of the clustering settings 422. In some other embodiments, the direction clustering engine 420 determines an allowable range for the value of K and any number and/or types of seeding heuristics based on the parameter data 138. In yet other embodiments, the base direction engine 410 determines the clustering settings 422 based on the parameter data 138 and then inputs the clustering settings 422 into the direction clustering engine 420.

As shown, in some embodiments, the direction clustering engine 420 inputs the direction cluster sets 428(1)-428(D) into the cluster set ranking engine 430. In response, the cluster set ranking engine 430 performs any number and/or type of ranking and/or filtering operations on the direction cluster sets 428(1)-428(D) to generate the ranked direction cluster set list 408. The ranked direction cluster set list 408 includes, without limitation, any number of the direction cluster sets 428(1)-428(D) that are ranked in any technically feasible fashion based on any number and/or types of criteria.

In some embodiments, the cluster set ranking engine 430 includes, without limitation, an elbow method heuristic 432. The elbow method heuristic 432 is based on the elbow method. As persons skilled in the art will recognize, the elbow method refers to a well-known type of technique for determining an optimal number of clusters (i.e., value of K) into which a set of points can be clustered. As shown, in some embodiments, the elbow method heuristic 432 determines an elbow point 434 based on the direction cluster sets 428. In some embodiments, for each of the direction cluster sets 428, the elbow method heuristic 432 determines a value for a variance-based metric. The elbow method heuristic 432 clusters values of K vs values of the variance-based metric for the direction cluster sets 428 into two groups and then sets the elbow point 434 equal to the intersection point between the two groups.

In some embodiments, for each of the direction cluster sets 428, the cluster set ranking engine 430 computes a distance to the elbow point 434 based on the associated values of K and the variance-based metric. The cluster set ranking engine 430 then ranks the direction cluster sets 428 based on increasing distance to the elbow point 434 to generate the ranked direction cluster set list 408. In some embodiments, the cluster set ranking engine 430 can filter out any number of the direction cluster sets 428 included in the ranked direction cluster set list 408 based on any technically feasible criteria. For instance, in some embodiments, the cluster set ranking engine 430 determines a minimum value of variance needed in the ranked direction cluster set list 408 based on the parameter data 138. If the ranked direction cluster set list 408 includes those with variance greater than the minimum needed, then the cluster set ranking engine 430 removes them. For instance, in some embodiments, the cluster set ranking engine 430 determines a maximum allowed value for the variance-based metric based on the parameter data 138. For each of the direction cluster sets 428 included in the ranked direction cluster set list 408, if the associated value for the variance-based metric is higher than the maximum allowed value, then the cluster set ranking engine 430 removes the direction cluster set 428 from the ranked direction cluster set list 408.

In some embodiments, the grid generation application 150 generates a base direction set 436 based on the direction cluster set 428 having the highest ranking as per the ranked direction cluster set list 408. As shown, the base direction set 436 includes, without limitation, base directions 438(1)-438(B), where B is the total number of direction clusters included in the direction cluster set 428 having the highest ranking and can therefore be any positive integer. The base directions 438(1)-438(B) are also referred to herein individually as "the base direction 438," and collectively as "the base directions 438." Each of the base directions 438 corresponds to a different direction cluster included in the direction cluster set 428 having the highest ranking. In some embodiments, the grid generation application 150 sets each of the base directions 438 equal to the direction associated with the centroid of the corresponding direction cluster.

Subsequently, in some embodiments, the grid generation application 150 inputs the base direction set 436, the edge set 402, and optionally the gravity design objective values 146(1)-146(N) and/or any portion of the parameter data 138 into the grid equation engine 440. In response, the grid equation engine 440 generates the frame grids 158(1)-158(M).

Although not depicted in FIG. 4, in some other embodiments, the grid generation application 150 generates a different instance of the base direction set 436 for each of any number of the direction cluster sets included in the ranked direction cluster set list 408. The instances of the base direction set 436 are also referred to herein collectively as "the base direction sets 436." Each of the base direction sets 436 can include, without limitation, a different total number of the base directions 438. The grid generation application 150 inputs each of the base direction sets 436 into a different instance of the grid equation engine 440 to generate one or more of the frame grids 158 for each of the base direction sets 436.

As shown, in some embodiments, the grid equation engine 440 includes, without limitation, an equation partitioning engine 450 and equation clustering engines 460(1)-460(B), where B is the total number of the base directions 438 included in the base direction set 436 and can therefore be any positive integer. The equation clustering engines 460(1)-460(B) are different instances of an equation clustering engine 460 (not explicitly shown). For explanatory purposes only, the equation clustering engines 460(1)-460(B) are also referred to herein individually as "the equation clustering engine 460" and collectively as "the equation clustering engines 460."

In some embodiments, the grid equation engine 440 generates a weighted equation set 442 based on the edge set 402 and optionally the gravity design objective values 146(1)-146(N). The weighted equation set 442 includes, without limitation, a different weighted equation (not shown) for each of the edges included in the edge set 402. The weighted equations can be specified in any technically feasible fashion. For instance, in some embodiments, each of the weighted equations is specified in the format of "$Ax+By+C=0$." To generate the weighted equation set 442, the grid equation engine 440 can determine and weight the weighted equations in any technically feasible fashion based on any amount and/or types of criteria that are relevant to generating the frame grids 158.

In some embodiments, the grid equation engine 440 weights each equation based on a combination of an architectural weight attributable to architectural features and a solution weight. For instance, in some embodiments, the grid equation engine 440 sets the architectural weights for equations corresponding to boundary edges to higher values than the architectural weights for equations corresponding to other edges. In the same or other embodiments, the grid equation engine 440 assigns higher solution weights to equations corresponding to better solutions as per the gravity design objective values 146 for the gravity designs 148 that include the corresponding edges.

As shown, in some embodiments, the equation partitioning engine 450 generates weighted equations subsets 458(1)-458(B) based on the weighted equation set 442 and the base directions 438(1)-438(B), respectively. For explanatory purposes only, the weighted equations subsets 458(1)-458(B) are also referred to herein individually as "the weighted equations subset 458" and collectively as "the weighted equations subsets 458." The weighted equation subsets 458(1)-458(B) represent different subsets of the weighted equation set 442 that are associated with the base directions 438(1)-438(B), respectively. The equation partitioning engine 450 can generate the weighted equation subsets 458(1)-458(B) in any technically feasible fashion.

In some embodiments, the equation partitioning engine 450 generates the weighted equation subsets 458(1)-458(B) based on the base directions 438(1)-438(B), and a tolerance amount (e.g., 3 degrees). For each of the base directions 438, the equation partitioning engine 450 selects the subset of the weighted equations included in the weighted equation set 442 that are approximately parallel to the base direction 438. As used herein, a weighted equation is approximately parallel to the base direction 438 when the angle between the line represented by the weighted equation and the base direction 438 is within the tolerance amount of zero degrees (e.g., between −3 and 3 degrees). The equation partitioning engine 450 can determine the tolerance amount in any technically feasible fashion. In some instance, in some embodiments, the equation partition engine 450 implements a default tolerance amount.

In some other embodiments, the equation partitioning engine 450 is replaced with an edge partitioning engine (not shown) and an equation engine (not shown). For each of the base directions 438(1)-438(B), the edge partitioning engine determines a different subset of the edges included in the edge set 402 that are approximately parallel to the base direction 438. As used herein, an edge is approximately parallel to the base direction 438 when a direction associated with the edge is within a tolerance amount of the base direction 438 (e.g., within 3 degrees of the base direction 438. For each of the base directions 438, the equation engine generates the weighted equation subset 458 that is associated with the base direction 438 based on the subset of the edges that is associated with the base direction and optionally the gravity design objective values 146(1)-146(N).

As shown, in some embodiments, the grid equation engine 440 inputs any portion (including none) of the parameter data 138 and the weighted equation subsets 458(1)-458(B) into the equation clustering engines 460(1)-460(B), respectively. In response, the equation clustering engines 460(1)-460(B) generate ranked equation cluster set lists 468(1)-468(B). For explanatory purposes only, the ranked equation cluster set lists 468(1)-468(B) are also referred to herein individually as "the ranked equation cluster set list 468" and collectively as "the ranked equation cluster set lists 468."

In some other embodiments, the grid equation engine 440 inputs any portion (including none) of the parameter data 138 and the weighted equation subsets 458(1)-458(B) into any number of instances of the equation clustering engine 460 sequentially, concurrently, or in any combination thereof. For instance, in some embodiments, the grid equation engine 440 sequentially inputs the weighted equation subsets 458(1)-458(B) into a single instance of the equation clustering engine 460. In response, the single instance of the equation clustering engine 460 sequentially outputs the ranked equation cluster set lists 468(1)-468(B).

Upon receiving one of the weighted equation subsets 458, the grid equation engine 440 performs any number and/or types of unsupervised clustering operations based on the weighted equations included in the weighted equation subsets 458 to generate any number of equation cluster sets (not shown). Each of the equation cluster sets specifies, without limitation, a different distribution of the weighted equations across any number of equation clusters (not shown). Notably, the number of equation clusters included in any given pair of the equation cluster sets can be the same or different.

Subsequently, the grid equation engine 440 can perform any number and/or types of ranking and/or filtering operations on the equation cluster sets to generate the ranked equation cluster set list 468. Accordingly, in some embodiments, the ranked equation cluster set list 468 specifies, without limitation, one or more of the equation cluster sets. More precisely, the ranked equation cluster set list 468($b$), where b is an integer from 1 to B, specifies, without limitation, one or more equation cluster sets that are associated with the base direction 438($b$).

The equation clustering engine 460 can acquire (e.g., receive or determine) any amount and/or types of configuration data in any technically feasible fashion. Some examples of configuration data are, without limitation, the total number of equation cluster sets, any number and/or type of settings associated with generating each of the equation cluster sets, any number and/or types of ranking criteria, and any number and/or types of filtering criteria. For instance, in some embodiments, the grid equation engine 440 determines any amount and/or type of configuration data based on the parameter data 138.

Although not depicted, in some embodiments, the equation clustering engine 460 performs the same type of clustering, ranking, and filtering operations on the weighted equation subset 458 that the direction clustering engine 420 performs on the weighted direction set 412. For instance, in some embodiments, the equation clustering engine 460 includes, without limitation, any number of instances of the K-means clustering algorithm 424 and the elbow method heuristic 432. The equation clustering engine 460 configures each instance of the K-means clustering algorithm 424 to execute clustering operations on the weighted equations included in the weighted equation subset 458 based on different instances of the clustering settings 422 (not explicitly shown). In response, each instance of the K-means clustering algorithm 424 generates one of the equation cluster sets, In the same or other embodiments, the equation clustering engine 460 then uses the elbow method heuristic 432 to determine a new instance of the elbow point 434. The equation clustering engine 460 then ranks the equation cluster sets based on increasing distance to the elbow point 434 to generate the ranked equation cluster set list 468. In some embodiments, the equation clustering engine 460 can perform any number and/or type of filtering operations on the ranked equation cluster set list 468.

As shown, in some embodiments, the grid specification engine 490 generates the frame grids 158(1)-158(M), where M can be any positive integer, based on the ranked equation cluster set lists 468(1)-468(B). Each of the frame grids 158 includes, without limitation, a different combination of B sets of grid lines, where each combination of B sets of grid lines includes a set of grid lines for each of the base directions 438(1)-438(B). The grid specification engine 490 can generate the frame grids 158 in any technically feasible fashion.

In some embodiments, to generate the frame grid 158($m$), where m is an integer between 1 and M, the grid specification engine 490 selects one of the equation cluster sets from each of the ranked equation cluster set lists 468(1)-468(B). The grid specification engine 490 then generates a different set of grid lines for each of the B selected equation cluster sets. Subsequently, the grid specification engine 490 aggregates the B sets of grid lines to generate the frame grid 158($m$).

The grid specification engine 490 can generate the set of grid lines for each of the selected equation cluster sets in any technically feasible fashion. In some embodiments, for a given equation cluster set, the grid specification engine 490 generates the set of grid lines that includes, without limitation, a different grid line for each of the equation clusters included in the equation cluster set. In the same or other embodiments, the grid specification engine 490 generates the grid line for a given cluster based on the equation associated with the centroid of the cluster. In some embodiments, after generating the grid lines, the grid specification engine 490 snaps each of the grid lines to any nearby architectural features (e.g., the boundary edges) and extends each of the grid lines beyond the boundary edges associated with the nearest floor.

In some embodiments the set of grid lines for each of the B selected equation cluster sets specifies one or more equations that are approximately parallel to the base direction 438 associated with the selected equation cluster set. Accordingly, for each of the base directions 438(1)-438(B), each of the frame grids 158(1)-158(M) includes, without limitation, one or more grid lines that are parallel to the base direction 438.

The grid specification engine 490 can select the M different combinations of B equation cluster sets for the frame grids 158(1)-158(M) in any technically feasible fashion. In some embodiments, the grid specification engine 490 selects the r equation cluster sets that are the highest ranked in each of the ranked equation cluster set lists 468(1)-468(B), where r can be any positive integer. The grid specification engine 490 then generates all possible combinations of a single selected equation cluster sets from each of the ranked equation cluster set lists 468(1)-468(B). For each of the resulting B^r combinations of the equation cluster sets, the grid specification engine 490 generates a different one of the frame grids 158.

In some other embodiments, the grid specification engine 490 implements a genetic algorithm to iteratively determine different combinations of the equation cluster sets. For instance, in some embodiments, the grid specification engine 490 implements the genetic algorithm that includes, without limitation, B different design variables representing the ranked equation cluster set lists 468. In the same or other embodiments, the genetic algorithm determines the fitness of each combination of the design variables based on the building objective values 186 associated with the structural designs 188 generated based on the combination of the design variables.

In some embodiments, after the grid specification engine 490 generates the frame grids 158, the grid generation application 150 transmits one or more of the frame grids 158 to any number of other software applications in any technically feasible fashion. In the same or other embodiments, the grid generation application 150 stores the frame grids 158 in a memory that is accessible to at least one other software application. In some embodiments, the grid generation application 150 stores the frame grids 158 in a memory that is accessible to the structural design application 120.

Defining a Frame System Via a Genetic Algorithm

Figure 5:
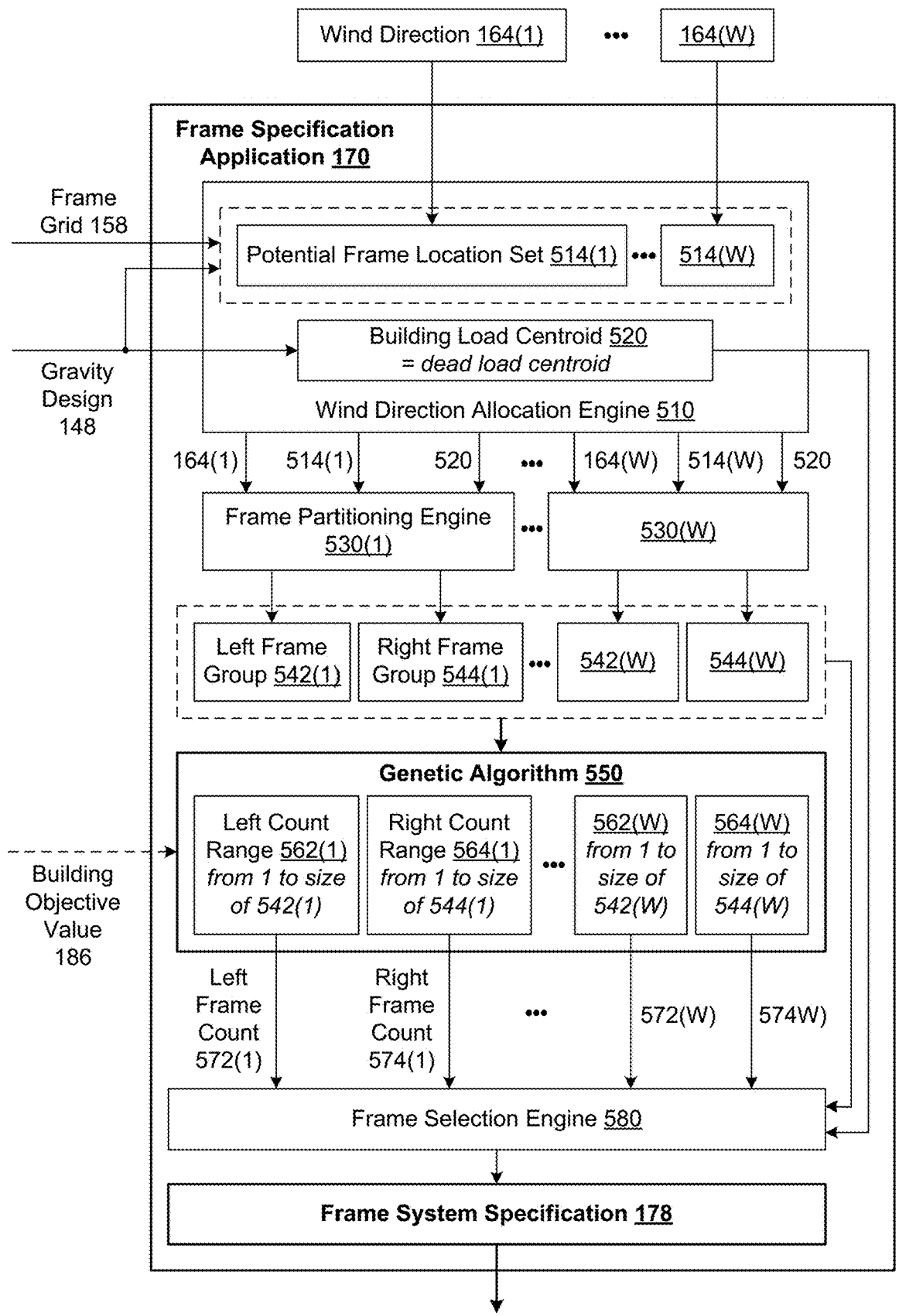
FIG. 5 is a more detailed illustration of the frame specification application of FIG. 1, according to various embodiments.

FIG. 5 is a more detailed illustration of the frame specification application 170 of FIG. 1, according to various embodiments. For explanatory purposes only, in the embodiment depicted in FIG. 4, the functionality of the frame specification application 170 is described in the context the frame grid optimization problem described previously herein in conjunction with FIG. 1. More specifically, the functionality of the frame specification application 170 is described in the context of an iterative design optimization portion of the overall design flow that the iterative optimization application 172 executes to generate the structural design 188 that resists both vertical and lateral loads.

As described previously herein in conjunction with FIG. 1, in some embodiments, to initiate a first design optimization iteration, the iterative optimization application 172 inputs the wind directions 164(1)-164(W), the frame grid 158 and the gravity design 148 into the frame specification application 170. In response, the frame specification application 170 generates the frame system specification 178 that specifies, without limitation, locations for at least one frame (not shown in FIG. 5) in each of the wind directions 164.

To complete the first design optimization iteration, the iterative optimization application 172 configures the iterative sizing application 180 to generate the structural design 188 and compute the building objective value 186 based, at least in part, on the frame system specification 178. The structural design 188 is a design for a structural system of the building that includes, without limitation, the frames at the locations specified in the frame system specification 178 and is optimized based on the constraints 132 and the objective function 134 while taking both vertical and lateral loads into account. In some embodiments, the building objective value 186 correlates to the degree of convergence between the structural design 188 and the design objectives associated with the building.

To initiate each of any number of subsequent design optimization iterations, the iterative optimization application 172 inputs the building objective value 186 into the frame specification application 170. In response, the frame specification application 170 generates a new version of the frame system specification 178 based on the building objective value 186. To complete the design optimization iteration, the iterative optimization application 172 configures the iterative sizing application 180 to re-generate the structural design 188 and re-compute the building objective value 186 based, at least in part, on the new version of the frame system specification 178.

Note that the techniques described herein are illustrative rather than restrictive and can be altered without departing from the broader spirit and scope of the invention. For instance, in some other embodiments, any instance of the frame specification application 170 can iteratively optimize the locations of the frames in a frame system (not shown) based on any type of design for a structure of a building, any type of grid, any number of lateral loading directions, and any number and/or types of optimization criteria.

As shown, in some embodiments, the frame specification application 170 includes, without limitation, a wind direction allocation engine 510, frame partitioning engines 530(1)-530(W), a genetic algorithm 550, and a frame selection engine 580. The wind direction allocation engine 510 generates potential frame location sets 514(1)-514(W) based on the frame grid 158(1), the gravity design 148(1), and the wind directions 164(1)-164(W), respectively. For explanatory purposes only, the potential frame location sets 514(1)-514(W) are also referred to herein individually as "the potential frame location set 514" and collectively as "the potential frame location sets 514"

In some embodiments, each of the potential frame location sets 514 includes, without limitation, a different set of locations, where each location is within a tolerance amount of a different grid line in the frame grid 158 and corresponds to a different potential frame with respect to the gravity design 148. In some other embodiments, prior to executing the frame specification application 170 during the first design optimization iteration, the iterative optimization application 172 regenerates the layout of the gravity design 148 based on the frame grid 158. As a result, each of the locations included in the potential frame location sets 514 matches a different grid line in the frame grid 158 and corresponds to a different potential frame with respect to the gravity design 148.

As referred to herein, a "potential" frame with respect to the gravity design 148 refers to a group of the structural members included in the gravity design 148 that can be connected via moment-resisting joints to form a frame that resists both vertical and lateral loads. In some embodiments, each potential frame in the gravity design 148 includes, without limitation, a group of one or more beams and one or more columns from the gravity design 148 that can be interconnected via any number and/or types of rigid joints, any number and/or type of semi-rigid joints, or any combination thereof. The locations included in the potential frame location sets 514 are also referred to herein as "potential frame locations."

In the same or other embodiments, the potential frame location sets 514(1)-514(W) include, without limitation, any number of locations corresponding to potential frames that primarily resist wind loads associated with the wind directions 164(1)-164(W), respectively, when the constituent structural members are intra-connected via moment-resisting joints. In some embodiments, each of the grid lines is associated with at most one of the locations in the potential frame location sets 514. The wind direction allocation engine 510 can generate the potential frame location sets 514 in any technically feasible fashion.

For instance, in some embodiments, the wind direction allocation engine 510 determines any number of potential frames with respect to the gravity design 148 that each have a location that is within a tolerance amount of a different associated grid line in the frame grid 158. In the same or other embodiments, the tolerance amount is equal to zero and each of the potential frames is on a different grid line in the frame grid 158. The wind direction allocation engine 510 then computes the projection of each of the wind directions 164 onto each of the potential frames. For each of potential frames that is associated with at least one non-zero projection, the wind direction allocation engine 510 adds the associated location to the potential frame location set 514 corresponding to the wind direction 164 having the greatest projection onto the potential frame.

As shown, in some embodiments, the wind direction allocation engine 510 computes a building load centroid 520 based on the gravity design 148. The wind direction allocation engine 510 can define and/or compute the building load centroid 520 in any technically feasible fashion. In some embodiments, the building load centroid 520 is a building load centroid that the wind direction allocation engine 510 sets equal to the centroid of the total dead load and live load across all the floors in the building based on the gravity design 148. In the same or other embodiments, the frame specification application 170 configures the frame partitioning engines 530(1)-530(W) to bifurcate the potential frame location sets 514(1)-514(W) into left frame groups 542(1)-542(W) and right frame groups 544(1)-544(W) based on the building load centroid 520.

Each of the frame partitioning engines 530(1)-530(W) is a different instance of a frame partitioning engine 530 (not explicitly shown). For explanatory purposes only, the frame partitioning engines 530(1)-530(W) are also referred to herein individually as "the frame partitioning engine 530" and collectively as "the frame partitioning engines 530." The left frame groups 542(1)-542(W) are also referred to herein individually as "the left frame group 542" and collectively as "the left frame groups 542." The right frame groups 544(1)-544(W) are also referred to herein individually as "the right frame group 544" and collectively as "the right frame groups 544." The locations specified in the left frame group2 542 and the right frame groups 544 are also referred to herein as "potential frame locations."

In some embodiments, for each of the wind directions 164, the frame specification application 170 inputs the wind direction 164(w), where w is an integer from 1 to W, the potential frame location set 514(w), and the building load centroid 520 into the frame partitioning engine 530(w). In response, the frame partitioning engine 530(w) sets the left frame group 542(w) equal to the subset of the locations specified in the potential frame location set 514(w) that are to the left of the building load centroid 520 with respect to the wind direction 164(w). The frame partitioning engine 530(w) sets the right frame group 544(w) equal to the subset of the locations specified in the potential frame location set 514(w) that are to the right of the building load centroid 520 with respect to the wind direction 164(w). The frame partitioning engine 530(w) then outputs the left frame group 542(w) and the right frame group 544(w).

In some other embodiments, the frame specification application 170 configures any number of instances of the frame partitioning engine 530 to bifurcate the potential frame location sets 514(1)-514(W) based on the building load centroid 520 sequentially, concurrently, or in any combination thereof. For instance, in some embodiments, the frame specification application 170 configures a single instance of the frame partitioning engine 530 to sequentially bifurcate the potential frame location sets 514(1)-514(W) based on the building load centroid 520.

In some embodiments, to generate the genetic algorithm 550, the frame specification application 170 configures a metaheuristic to iteratively and collectively optimize left frame counts 572(1)-572(W) and right frame counts 574(1)-574(W) based on the building objective value 186(1,1). The frame specification application 170 therefore defines the left frame counts 572(1)-572(W) and the right frame counts 574(1)-574(W) as integer design variables of the genetic algorithm 550. The left frame counts 572(1)-572(W) are also referred to herein individually as "the left frame count 572" and collectively as "the left frame counts 572." The right frame counts 574(1)-574(W) are also referred to herein individually as "the right frame count 574" and collectively as "the right frame counts 574." The left frame counts 572 and the right frame counts 574 are also referred to herein as "location counts."

The left frame count 572(w), for an integer w from 1 to W, specifies the total number of the locations in the left frame group 542(w) that are to be frames in a frame system. As shown, in some embodiments, the frame specification application 170 configures the genetic algorithm 550 to set the left frame counts 572(1)-572(W) to integers within left frame count ranges 562(1)-562(W), respectively. For the left frame count ranges 562(1)-562((W), the frame specification application 170(1-1) sets the lower bounds to one and the upper bounds to the sizes of the left frame groups 542(1)-542(W), reactively. Each of the left frame count ranges 562(1)-562(2) is therefore an integer range.

Similarly, the right frame count 574(w), for an integer w from 1 to W, specifies the total number of the locations in the right frame group 544(w) that are to be frames in the frame system. As shown, in some embodiments, the frame specification application 170 configures the genetic algorithm 550 to set the right frame counts 574(1)-574(W) to integers within right frame count ranges 564(1)-564(W), respectively. For the right frame count ranges 564(1)-564((W), the frame specification application 170 sets the lower bounds to one and the upper bounds to the sizes of the right frame groups 544(1)-544(W), reactively. Each of the right frame count ranges 564(1)-564(W) is therefore an integer range.

After configuring the genetic algorithm 550, the frame specification application 170 causes the genetic algorithm 550 to determine the left frame counts 572 and the right frame counts 574 for the first design optimization iteration.

The genetic algorithm 550 can initially determine the left frame counts 572 and the right frame counts 574 in any technically feasible fashion. For instance, in some embodiments, the genetic algorithm 550 sets each of the left frame counts 572(1)-572(W) equal to a random integer within each of the left frame count ranges 562(1)-562(W), respectively, and each of the right frame counts 574(1)-574(W) equal to a random integer within each of the right frame count ranges 564(1)-564W), respectively. In some other embodiments, the genetic algorithm 550 sets each of the left frame counts 572(1)-572(W) and each of the right frame counts 574(1)-574(W) equal to one.

In some embodiments, after the genetic algorithm 550 determines or re-determines the left frame counts 572 and the right frame counts 574 for a given design optimization iteration, the frame selection engine 580 generates the frame system specification 178 for the design optimization iteration. As shown, in some embodiments, the frame selection engine 580 generates the frame system specification 178 based on the left frame counts 572, the left frame groups 542, the right frame counts 574, and the right frame groups 544. The frame selection engine 580 can generate the frame system specification 178 in any technically feasible fashion.

In some embodiments, the frame selection engine 580 implements a frame selection rule (not shown) that encapsulates design and structural engineering fundamentals to generate the frame system specification 178. As per design and structural engineering fundamentals, as the distance of a frame from the building load centroid 520 increases, the effectiveness with which the frame resists wind also increases. To optimize the effectiveness of the frame system, the frame selection engine 580 implements a frame selection rule specifying that locations for frames are to be selected from the left frame groups 542(w) and the right frame groups 544 frame in order of decreasing distance from the building load centroid 520.

In the same or other embodiments, for each of the left frame groups 542(w), where w is an integer from 1 to W, the frame selection engine 580 selects the left frame count 572(w) of the locations specified in the left frame group 542(w) based on the frame selection rule. Accordingly, the frame selection engine 580 selects the locations specified in the left frame group 542(w) that are furthest from the building load centroid 520. For example, if the left frame count 572(1) is two, then the frame selection engine 580 selects the two locations specified in the left frame group 542(w) that are furthest from the building load centroid 520.

Similarly, in some embodiments, for each of the right frame groups 544(w), where w is an integer from 1 to W, the frame selection engine 580 selects the right frame count 574(w) of the locations specified in the right frame group 544(w) based on the frame selection rule. Accordingly. the frame selection engine 580 selects the locations specified in the right frame group 544(w) that are furthest from the building load centroid 520. For example, if the right frame count 574(1) is three, then the frame selection engine 580 selects the three locations from the right frame group 544(w) that are furthest from the building load centroid 520.

Subsequently, the frame selection engine 580 generates the frame system specification 178 for the frame system that includes, without limitation, a different frame at each of the selected locations. The frame system specification 178 can specify the frame system in any technically feasible fashion. For instance, in some embodiments, the frame system specification 178 is a list of the selected locations.

In some embodiments, after the frame selection engine 580 generates the frame system specification 178, the frame specification application 170 transmits the frame system specification 178, to any number of other software applications in any technically feasible fashion. In the same or other embodiments, the frame specification application 170 stores the frame system specification 178 in a memory that is accessible to at least one other software application. In some embodiments, the frame specification application 170 stores the frame system specification 178 in a memory that is accessible to the iterative optimization application 172, and the iterative optimization application 172 inputs the frame system specification 178 into the iterative sizing application 180.

In some embodiments, after the frame specification application 170 generates the frame system specification 178 for a current design optimization iteration, the frame specification application 170 can re-generate the frame system specification 178 for a new design optimization iteration based on any number and/or type of optimization criteria. The frame specification application 170 can determine when to re-generate the frame system specification 178 and/or acquire any amount and/or type of data that is relevant to the optimization criteria in any technically feasible fashion.

As depicted with a dashed arrow, in some embodiments, the frame specification application 170 re-generates the frame system specification 178 for a new design optimization iteration upon receiving the building objective value 186 associated with the current design optimization iteration as an input. In response to receiving the building objective value 186, the frame specification application 170 inputs the building objective value 186 into the genetic algorithm 550.

In the same or other embodiments, the genetic algorithm 550 implements any number and/or types of search-based optimization operations based on the building objective value 186 to re-determine the left frame counts 572 and the right frame counts 574. The frame selection engine 580 then re-generates the frame system specification 178 based on the left frame counts 572, the left frame groups 542, the right frame counts 574, and the right frame groups 544.

The frame specification application 170 can determine when to cease operating in any technically feasible fashion. For instance, in some embodiments, the frame specification application 170 ceases to operate in response to a termination command from the iterative optimization application 172 or the structural design application 120. In the same or other embodiments, the frame specification application 170 ceases to operate when the amount of time that has elapsed since the frame specification application 170 last received an input exceeds a maximum wait time.

Optimizing Sizing of Structural Members for Vertical and Lateral Loads

Figure 6:
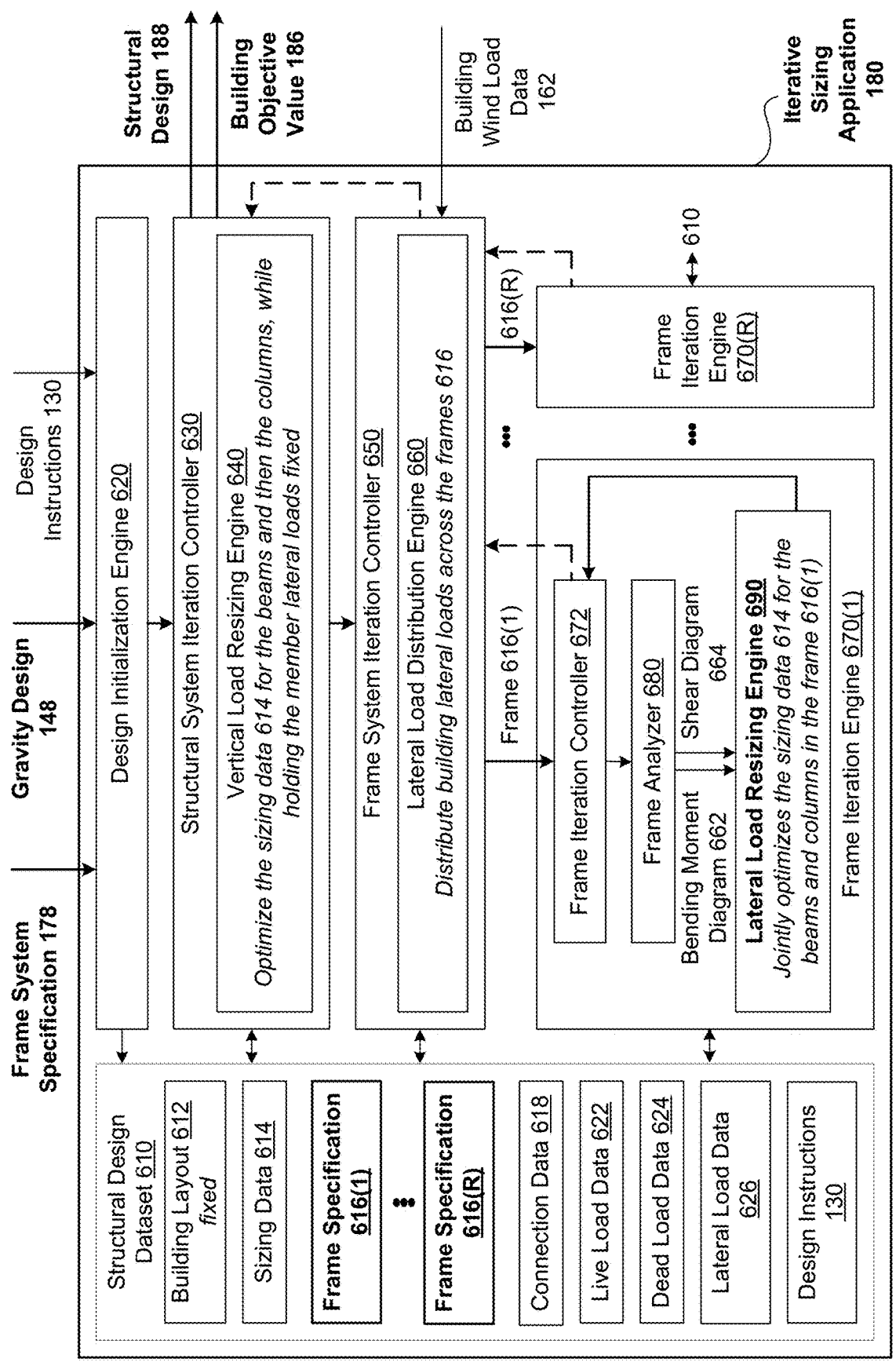
FIG. 6 is a more detailed illustration of the iterative sizing application of FIG. 1, according to various embodiments.

FIG. 6 is a more detailed illustration of the iterative sizing application 180 of FIG. 1, according to various embodiments. For explanatory purposes only, in the embodiment depicted in FIG. 6, the functionality of the iterative sizing application 180 is described in the context of solving the vertical and lateral load design optimization described previously herein in conjunction with FIG. 1. More specifically, the iterative sizing application 180 adds or modifies the connections between and sizing of the columns and beams in the gravity design 148 based on the frame system specification 178 and the objective function 134 to generate the structural design 188 that resists dead loads, live loads, and the building wind load(s) included in the building wind load data 162.

Note that the techniques described herein are illustrative rather than restrictive and can be altered without departing from the broader spirit and scope of the invention. In general, any number of instances of the iterative sizing application 180 can be executed in any technically feasible fashion. The iterative sizing application 180 can modify the connections between and/or the sizing of any types of structural members in any type of design for a structural system of a building to generate the structural design 188 that resists any number and/or types of loads. The iterative sizing application 180 can modify the connections and/or sizing in a design for a structural system based on any amount (including none) of data, any number and/or types of optimization criteria, and any number and/or types of the constraints 132.

As shown, in some embodiments, the iterative sizing application 180 generates the structural design 188 and the building objective value 186 based on the gravity design 148, the frame system specification 178, the design instructions 130, and the building wind load data 162. The gravity design 148, the design instructions 130, and the building wind load data 162 were described previously herein in conjunction with FIG. 1. The frame system specification 178 was described in detail previously herein in conjunction with FIG. 5.

In the same or other embodiments, the iterative sizing application 180 includes, without limitation, a design initialization engine 620, a structural system iteration controller 630, a frame system iteration controller 650, and frame iteration engines 670(1)-670(R). Each of the frame iteration engines 670(1)-670(R) is a different instance of a frame iteration engine 670 (not explicitly shown). For explanatory purposes only, the frame iteration engines 670(1)-670(R) are also referred to herein individually as "the frame iteration engine 670" and collectively as "the frame iteration engines 670." As described in greater detail below, in some embodiments, R is a positive integer that the design initialization engine 620 determines based on the frame system specification 178. In some other embodiments, the iterative sizing application 180 can include, without limitation, any number (including one) of instances of the frame iteration engine 670.

As shown, in some embodiments, the design initialization engine 620 initializes a structural design dataset 610 based on the gravity design 148, the frame system specification 178, and the design instructions 130. For explanatory purposes only, at any given point in time, the structural design dataset 610 is also referred to herein as a "current structural design" of the building associated with the gravity design 148.

The structural design dataset 610 can include, without limitation, any amount and/or types of data relevant to generating the structural design 188 and/or computing the building objective value 186. In some embodiments, the structural design dataset 610 includes, without limitation, a building layout 612, sizing data 614, frame specifications 616(1)-616(R), connection data 618, live load data 622, dead load data 624, lateral load data 626, and the design instructions 130, where R can be any positive integer.

The building layout 612 specifies, without limitation, locations, types, and materials of structural members included in the current structural design. In some embodiments, the structural members include, without limitation, any number of slabs, any number of beams, and any number of columns. As depicted in italics, in some embodiments, the building layout 612 is fixed and is therefore not modified by the iterative sizing application 180. The sizing data 614 specifies, without limitation, any amount and/or type of sizing data for the structural members include in the current structural design.

The frame specifications 616(1)-616(R) are also referred to herein individually as "the frame specification 622" and collectively as "the frame specifications 622." In some embodiments, each of the frame specification 616 specifies a different frame (not shown), and the frames are collectively referred to herein as a "frame system" (not shown). In the same or other embodiments, the frame system corresponds to the frame system specifications 178(1,1). Accordingly, and as described in greater detail below, in some embodiments, R is a positive integer that the design initialization engine 620 determines based on the frame system specification 178(1,1).

Each of the frames specifications 616 specifies, without limitation, a different group of the structural members of the current design that are interconnected via moment-resisting joints to form the corresponding frame. For instance, in some embodiments, each of the frame specifications 616 specifies, without limitation, any number of beams and any number of columns that are interconnected via rigid joints.

The connection data 618 specifies any amount and/or type of data associated with connections between the structural members of the current structural design. In some embodiments, the connection data 618 specifies, without limitation, any number and/or types of joints that are included in the current structural design. In the same or other embodiments, the connection data 618 specifies, without limitation, a rigid joint for each of the interconnections between the structural members specified in each of the frame specifications 616.

The live load data 622 includes, without limitation, any number and/or types of live loads associated with the current structural design. The live load data 622 is fixed and is therefore not modified by the iterative sizing application 180. The dead load data 624 includes, without limitation, any number and/or types of dead loads associated with the current structural design. The lateral load data 626 includes, without limitation, any number and/or types of lateral loads associated with the current structural design. In some embodiments, the live loads, the dead loads, and the lateral loads included the live load data 622, the dead load data 624, and the lateral load data 626, respectively, can be specified at any level of granularity with respect to the current structural design. For instance, in some embodiments, the live loads and the dead loads are specified as distributed loads with respect to horizontal areas (e.g., rooms).

In the same or other embodiments, the lateral load data 626 includes, without limitation, any number and/or types of member lateral loads (not shown). Each of the member lateral loads is associated with one of the structural members of the current structural design and specifies, without limitation, any type of lateral load associated with the structural member. In some embodiments, at any given time, the member lateral loads can reflect the distribution of any number and/or types of building lateral loads (not shown) to each of the structural members. Each of the building lateral loads is a lateral load associated with the current structural design and/or the associated building. In some embodiments, the building lateral loads include, without limitation, any number of building wind loads included in the building wind load data 162.

The design initialization engine 620 can initialize the structural design dataset 610 in any technically feasible fashion. In some embodiments, the design initialization engine 620 copies the design instructions 130 to the structural design dataset 610. As described previously herein, the design instructions 130 includes, without limitation, the constraints 132, the objective function 134, the design variable data 136, and the parameter data 138. In the same or other embodiments, the design initialization engine 620 copies any amount and/or types of data from the gravity design 148 to initialize the building layout 612 and the sizing data 614.

The design initialization engine 620 generates the frame specifications 616 based on the gravity design 148 and the frame system specification 178(1,1). The design initialization engine 620 can generate the frame specifications 616 in any technically feasible fashion. For instance, in some embodiments, the frame system specification 178 specifies a location for each group of structural members in the gravity design 148(1) that is to be interconnected via moment-resisting joints. For each of the locations specified in the frame system specification 178, the design initialization engine 620 identifies the corresponding group of structural members in the current structural design and generates the frame specification 616 specifying, without limitation, the identified group of structural members. Accordingly, the total number of the frame specifications 616 is equal to the number of locations specified in the frame system specification 178.

In the same or other embodiments, the design initialization engine 620 initializes the connection data 618 to specify, without limitation, any number and/or types of moment-resisting joints associated with the frames corresponding to the frame specifications 616. In some embodiments, for each of the frame specifications 616, the design initialization engine 620 specifies via the connection data 618 that each of the connections between the structural members specified in the frame specification 616 is a rigid joint. In the same or other embodiments, the design initialization engine 620 specifies via the connection data 618 that each connection between the structural members in the current structural design that is not specified in the frame specifications 616 is a pin joint or a hinged joint.

In some embodiments, the design initialization engine 620 copies data from the gravity design 148 to initialize the live load data 622 and the dead load data 624. In other embodiments, the design initialization engine 620 computes the live load data 622 and the dead load data 624 based on the building layout 612, the sizing data 614, and optionally the design instructions 130. In some embodiments, the design initialization engine 620 initializes the lateral load data 626 to specify initial values of zero for each of any number and/or types of member lateral loads.

As indicated with double arrows, in some embodiments, the structural system iteration controller 630, the frame system iteration controller 650, and the frame iteration engines 670(1)-670(R) can read from, write to, and/or modify the structural design dataset 610. In some other embodiments, the iterative sizing application 180 can route any amount and/or types of data between the structural design dataset 610, the structural system iteration controller 630, the frame system iteration controller 650, and the frame iteration engines 670(1)-670(R) in any technically feasible fashion.

In some embodiments, the iterative sizing application 180 defines and solves a nested optimization problem to generate the structural design 188(1,1). In some embodiments, solving the nested optimization problem corresponds to optimizing the sizing data 614 included in the current structural design based on the objective function 134 and the constraints 132 while taking into account gravity and any number and/or type of building lateral load(s). In some embodiments, one or more of the constraints 132 are safety design factors that ensures that the structural design 188 satisfactorily resists vertical loads and lateral loads.

In some embodiments, the structural system iteration controller 630 executes any number of iterations included in a top loop to solve a top layer of the nested optimization problem and thereby solve the nested optimization problem. As shown, in some embodiments, the structural system iteration controller 630 includes, without limitation, a structural system iteration controller 640. In the same or other embodiments, the structural system iteration controller 640 can read from, write to, and/or modify the structural design dataset 610. In some other embodiments, the structural system iteration controller 630 can route any amount and/or types of data between the structural design dataset 610 and the structural system iteration controller 640 in any technically feasible fashion.

In some embodiments, to initiate each "top loop iteration," the structural system iteration controller 630 configures the structural system iteration controller 640 to optimize the sizing data 614 based the objective function 134 and the constraints 132 while keeping the lateral load data 626 fixed. The structural system iteration controller 640 can optimize the sizing data 614 for any number and/or type of structural members of the current design in any technically feasible fashion.

In some other embodiments, the structural system iteration controller 640 iteratively optimizes the beams in the current structural design and then iteratively optimizes the columns in the current structural design, updating the dead load data 624 after each iteration while keeping the lateral load data 626 fixed. The structural system iteration controller 640 can implement any number and/or type of optimization algorithms and/or any number and/or types of fundamental rules that each encapsulate any number and/or types of design and/or structural engineering fundamentals. For instance, in some embodiments, the structural system iteration controller 640 implements fully-stressed design methods to optimize the sizing data 614 for the beams and/or the columns in the current structural design.

In some other embodiments, the structural system iteration controller 640 executes a bisection-based beam optimization algorithm that iteratively optimizes the sizing data 614 for the beams based on the objective function 134 and the constraints 132, updating the dead load data 624 after each iteration while keeping the lateral load data 626 fixed. Subsequently, in some embodiments, the structural system iteration controller 640 executes a bisection-based optimization algorithm to iteratively optimize the sizing data 614 for the columns based on the objective function 134 and the constraints 132, updating the dead load data 624 after each iteration while keeping the lateral load data 626 fixed.

In the same or other embodiments, after the structural system iteration controller 640 optimizes the sizing data 614 while keeping the lateral load data 626 fixed, the structural system iteration controller 630 configures the frame system iteration controller 650 to solve a middle layer of the nested optimization problem with respect to the top loop iteration. Solving the middle layer of the nested optimization problem corresponds to optimizing the sizing data 614 for the frames specified via the frame specifications 616 based on any number and/or type of building lateral loads. The sizing data 614 for the frames is the sizing data 614 for the structural members specified via the frame specifications 616. For explanatory purposes only, the sizing data 614 for each of the frames is also referred to herein as a "sizing dataset."

In some embodiments, the frame system iteration controller 650 includes, without limitation, a lateral load distribution engine 660. In some embodiments, the lateral load distribution engine 660 can read from, write to, and/or modify the structural design dataset 610. In some other embodiments, the frame system iteration controller 650 can route any amount and/or types of data between the structural design dataset 610 and the lateral load distribution engine 660 in any technically feasible fashion.

As shown, in some embodiments, the frame system iteration controller 650 executes any number of iterations included in a middle loop to solve the middle layer of the nested optimization problem with respect to the top loop iteration. In some embodiments, to initiate each "middle loop iteration," the frame system iteration controller 650 configures the lateral load distribution engine 660 to distribute any number and/or types of building lateral load(s) across the frames corresponding to the frame specifications 616.

For instance, as depicted in italics, in some embodiments, the frame system iteration controller 650 configures the lateral load distribution engine 660 to distribute any number of building wind loads (not shown) included in the building wind load data 162 across the frames corresponding to the frame specifications 616. In some embodiments, the building wind load data 162 includes, without limitation, a different building wind load for each of any number of directions (e.g., the wind directions 164(1)-164(W)).

The lateral load distribution engine 660 can distribute the building lateral load(s) specified by the frame system iteration controller 650 across the frames corresponding to the frame specifications 616 in any technically feasible fashion. In some embodiments, the lateral load distribution engine 660 applies any number and/or types of fundamental rules that each encapsulate any number and/or types or structural engineering fundamentals to the frame specifications 616 to distribute the building lateral load(s) across the corresponding frames. In the same or other embodiments, the lateral load distribution engine 660 distributes the building lateral load(s) across the frames based on the stiffnesses of the frames. In the same or other embodiments, for each of the frames, the lateral load distribution engine 660 generates one or more frame lateral loads (not shown) that are associated with the frame and correspond to the portions of the building lateral load(s) that the lateral load distribution engine 660 distributes to the frame. Consequently, for each of the frames specifications 616, the frame lateral load(s) specify the portions of the building lateral load(s) that the lateral load distribution engine 660 distributes to the corresponding frame. The frame lateral load(s) are also referred to herein as "the frame-based lateral load(s)."

In some embodiments, after the lateral load distribution engine 660 generates the frame lateral loads, the frame system iteration controller 650 configures any number of instances of the frame iteration engine 670 to solve a bottom layer of the nested optimization problem independently for each of the frames specifications 616(1)-616(R) with respect to the middle loop iteration. Solving the bottom layer of the nested optimization problem for each of the frame specifications 616 corresponds to optimizing the sizing data 614 for the corresponding frame while holding the associated frame lateral load(s) fixed.

As shown, in some embodiments, the frame system iteration controller 650 configures the frame iteration engines 670(1)-670(R) to independently solve the bottom layer of the optimization problem for each of the frame specifications 616(1)-616(R), respectively. In some other embodiments, the frame system iteration controller 650 configures less than R instances of the frame iteration engine 670 to independently solve the bottom layer of the optimization problem for each of the frame specifications 616(1)-

616(R), respectively. For instance, in some embodiments, the frame system iteration controller 650 configures a single instance of the frame iteration engine 670 to sequentially and solve the bottom layer of the optimization problem for each of the frame specifications 616(1)-616(R).

In some embodiments, each instance of the frame iteration engine 670 can read from, write to, and/or modify the structural design dataset 610. In some other embodiments, the frame system iteration controller 650 can route any amount and/or types of data between the structural design dataset 610 and each instance of the frame iteration engine 670 in any technically feasible fashion.

To solve the bottom layer of the optimization problem for the frame specification 616, the frame iteration engine 670 can optimize the sizing data 614 for the structural members specified in the frame specification 616 while holding the associated frame lateral loads fixed in any technically feasible fashion. As shown for the frame iteration engine 670(1), the frame iteration engine 670 includes, without limitation, a frame iteration controller 672, a frame analyzer 680, and a lateral load resizing engine 690.

In some embodiments, the frame iteration controller 672 initiates any number of iterations included in a bottom loop to optimize the sizing data 614 for the structural members specified in the frame specification 616 while holding the frame lateral load(s) associated with the frame specification 616 fixed. In some embodiments, to initiate each bottom loop iteration, the frame iteration controller 672 generates a bending moment diagram 662 and a shear diagram 664 for the frame corresponding to the frame specification 616 based, at least in part, on the frame lateral load(s). The frame analyzer 680 can generate the bending moment diagram 662 and the shear diagram 664 in any technically feasible fashion.

In some embodiments, the frame analyzer 680 executes any number and/or types of frame analysis operations based on any number and/or types of fundamental rules to generate the bending moment diagram 662 and the shear diagram 664. For instance, in some embodiments, the frame analyzer 680 applies any number and/or types of fundamental rules to the frame specification 616 based on the frame lateral load(s) to compute a partial bending moment diagram (not shown) and a partial shear diagram (not shown). More specifically, in some embodiments, the frame analyzer 680 applies the portal method, the equivalent column method, or the moment distribution method to the sizing data 614 for the structural members specified in the frame specification 616 based on the frame lateral load(s) to generate the partial bending moment diagram and the partial shear diagram.

Subsequently, in some embodiments, the frame analyzer 680 determines any number and/or types of vertical loads associated with the frame corresponding to the frame specification 616 based on the live load data 622 and the dead load data 624. The frame analyzer 680 then uses the method of superposition to generate the bending moment diagram 662 for the frame corresponding to the frame specification 616 based on the vertical loads associated with the frame and the partial bending moment diagram. In the same or other embodiments, the frame analyzer 680 uses the fundamental rule associated with the method of superposition to generate the shear diagram 664 for the frame corresponding to the frame specification 616 based on the vertical loads associated with the frame and the partial shear diagram.

In some embodiments, the lateral load resizing engine 690 optimizes the sizing data 614 for the structural members specified in the frame specification 616 based the bending moment diagram 662, the shear diagram 664, the objective function 134 and the constraints 132. The lateral load resizing engine 690 can optimize the sizing data 614 for the structural members specified in the frame specification 616 in any technically feasible fashion.

For instance, in some embodiments, the lateral load resizing engine 690 executes a bisection-based frame optimization algorithm that jointly optimizes the sizing data 614 for the beams and the columns specified in the frame specification 616. During each of any number of iterations, the bisection-based frame optimization algorithm updates the sizing data 614 for the beams and the columns based on the bending moment diagram 662, the shear diagram 664, the objective function 134 and the constraints 132. In the same or other embodiments, the lateral load resizing engine 690 can optimize the sizing data 614 for the structural members specified in the frame specification 616 while holding the associated frame lateral load(s) fixed in any technically feasible fashion.

In some embodiments, after the lateral load resizing engine 690 optimizes the sizing data 614 for the beams and the columns specified in the frame specification 616, the associated bottom loop iteration is complete. In some embodiments, the lateral load resizing engine 690 or the frame iteration controller 672 updates the dead load data 624 and the member lateral loads to reflect any changes to the sizing data 614 for the beams and the columns specified in the frame specification 616. The frame iteration controller 672 can determine whether to initiate another bottom loop iteration in any technically feasible fashion.

In some embodiments, if a maximum number of bottom loop iterations (not shown) has been reached for the frame specification 616, then the frame iteration controller 672 does not initiate another bottom loop iteration. In the same or other embodiments, the frame iteration controller 672 determines whether to initiate another bottom loop iteration based, at least in part, the magnitude of any changes to the sizing data 614 of the structural members specified in the frame specification 616 between bottom loop iterations.

In some embodiments, if the frame iteration controller 672 determines that the relevant sizing options have been explored, then the frame iteration controller 672 does not initiate another bottom loop iteration. The frame iteration controller 672 can determine whether the relevant sizing options have been explored in any technically feasible fashion. For instance, in some embodiments, the frame iteration controller 672 determines that the relevant sizing operations have been explored when each of the structural members specified in the frame specification 616 is at the maximum allowed size as per the design variable data 136.

As depicted with a dashed arrow, if the frame iteration controller 672 does not initiate another bottom loop iteration, then the frame iteration controller 672 indicates to the frame system iteration controller 650 that the bottom loop for the frame specification 616 is complete in any technically feasible fashion. In some embodiments, when the bottom loop for the frame specification 616 is complete, the frame iteration engine 670 has solved the bottom layer of the nested optimization problem for the frame corresponding to the frame specification 616 with respect to the middle loop iteration.

After the instances of the frame iteration engine 670 have completed the bottom loops for the frames specifications 616(1)-616(R), the frame system iteration controller 650 optionally executes any number of optimization and/or refinement operations on based on the frame specifications 616. For instance, as persons skilled in the art will recognize, if a centroid of the building wind loads does not align with a shear centroid of the current structural design, then the resulting eccentricity causes unbalanced torsional forces when the building wind load(s) are applied on the building. Accordingly, in some embodiments, the frame system iteration controller 650 implements one or more techniques to reduce the eccentricity of the building wind load(s) included in the building wind load data 162.

For instance, in some embodiments, the frame system iteration controller 650 implements a different instance of a proportional-integral-derivative ("PID") controller (not shown) for each of the floors in the building. The PID controller links the magnitude of unbalanced torsional forces with a safety factor correction of the beams and the columns specified in the frame specifications 616. More specifically, each instance of the PID controller corrects a design safety factor (not shown) included in the constraints 132 based on any unbalanced torsional force for the associated floor. Correcting the stiffness safety factor causes the lateral load resizing engine 690 to artificially strengthen some of the frames corresponding to the frame specifications 616 such that a distance between the centroid of the building wind loads and the shear centroid of the current structural design is reduced. In the same or other embodiments, the frame system iteration controller 650 implements a different instance of a PID controller for each level of each frame. For a given building wind load, the PID controllers overdesign frames that are located on the weaker side (e.g., in the left frame group 542 or the right frame group 544) of the building with respect to the building wind load.

After the frame system iteration controller 650 optionally executes any number of optimization and/or refinement operations on the frame specifications 616, the middle loop iteration is complete. The frame system iteration controller 650 then determines whether to initiate another middle loop iteration. The frame system iteration controller 650 can determine whether to initiate another middle loop iteration in any technically feasible fashion. For instance, in some embodiments, if a maximum number of middle loop iterations (not shown) has been reached, then the frame system iteration controller 650 does not initiate another top loop iteration. In the same or other embodiments, the frame system iteration controller 650 determines whether to initiate another middle loop iteration based, at least in part, the magnitude of any changes to the sizing data 614 of the structural members specified in the frame specifications 616 and/or the magnitude of any changes in the frame lateral loads between middle loop iterations. In some embodiments, if the frame system iteration controller 650 determines that the relevant sizing options have been explored, then the frame system iteration controller 650 does not initiate another bottom loop iteration.

As depicted with a dashed arrow, if the frame system iteration controller 650 does not initiate another middle loop iteration, then the frame system iteration controller 650 indicates to the structural system iteration controller 630 that the middle loop is complete. In some embodiments, when the middle loop is complete, then the frame system iteration controller 650 has solved the middle layer of the nested optimization problem for the frame system with respect to the top loop iteration.

The structural system iteration controller 630 then determines whether to initiate another top loop iteration. The structural system iteration controller 630 can determine whether to initiate another top loop iteration in any technically feasible fashion. For instance, in some embodiments, if a maximum number of top loop iterations (not shown) has been reached, then the structural system iteration controller 630 does not initiate another top loop iteration. In the same or other embodiments, the structural system iteration controller 630 determines whether to initiate another top loop iteration based, at least in part, the magnitude of any changes to the sizing data 614 between top loop iterations. In some embodiments, if the structural system iteration controller 630 determines that the relevant sizing options have been explored, then the frame system iteration controller 650 does not initiate another bottom loop iteration.

If the structural system iteration controller 630 does not initiate another top loop iteration, then the top loop is complete. In some embodiments, when the top loop is complete, the structural system iteration controller 630 has solved the nested optimization problem. As shown, the structural system iteration controller 630 then generates the structural design 188 based on the structural design dataset 610. In some embodiments, the structural system iteration controller 630 computes the building objective value 186 for the structural design 188 based on the objective function 134. In the same other embodiments, the structural system iteration controller 630 can compute any number and/or type of values for any number and/or types of other metrics associated with any number and/or types of design objectives.

In some embodiments, the iterative sizing application 180 transmits the structural design 188 and/or the building objective value 186 to any number of other software applications in any technically feasible fashion. In the same or other embodiments, the iterative sizing application 180 stores the structural design 188 and/or the building objective value 186 in a memory that is accessible to at least one other software application. In some embodiments, iterative sizing application 180 stores the building objective value 186 in a memory that is accessible to the iterative optimization application 172, and the iterative optimization application 172 inputs the building objective value 186 into the frame specification application 170(1,1).

Many modifications and variations will be apparent to those of ordinary skill in the art without departing from the scope and spirit of the described embodiments. For instance, in some embodiments, the gravity design 148 specifies a reinforced cement concrete frame structural system. As persons skilled in the art will recognize, the beams and columns in a reinforced concrete frame structural system are typically connected via rigid joints and therefore the frame system specification 178 is superfluous. In some embodiments, if the frame system specification 178 is not inputted into the iterative sizing application 180, then the design initialization engine 620 generates the frame specifications 616 specifying frames at all appropriate locations of the gravity design 148. In the same or other embodiments, if the frame system specification 178 is not inputted into the iterative sizing application 180 and the gravity design 148 specifies the vertical loads, then the iterative sizing application 180 does not execute the structural system iteration controller 630 prior to executing the first structural system design iteration.

It will be appreciated that the instance of the iterative sizing application 180 depicted in and described in conjunction with FIG. 6 is illustrative and that variations and modifications to the iterative sizing application 180 are possible. For example, the functionality provided by the iterative sizing application 180 as described herein may be integrated into or distributed across any number of components of the iterative sizing application 180. Further, the connection topology between the various components of the iterative sizing application 180 can be modified as desired.

For instance, in some embodiments, the iterative sizing application 180 omits the design initialization engine 620 and/or the structural design dataset 610, and the iterative sizing application 180 can determine and/or route any amount and/or types of data to, between, and from any number of components in any technically feasible fashion. In some embodiments, the iterative sizing application 180 receives the gravity design 148, the frame system specification 178, the design instructions 130, and any number and/or types of building lateral loads in any technically feasible fashion. In response, the iterative sizing application 180 generates an initial structural design (not shown) based on the gravity design 148 and the frame system specification 178. The iterative sizing application 180 then configures the structural system iteration controller 630, the frame system iteration controller 650 and the frame iteration engines 670 to collaboratively optimize the initial structural design based on the design instructions 130 and the building lateral load(s).

Figure 7A:
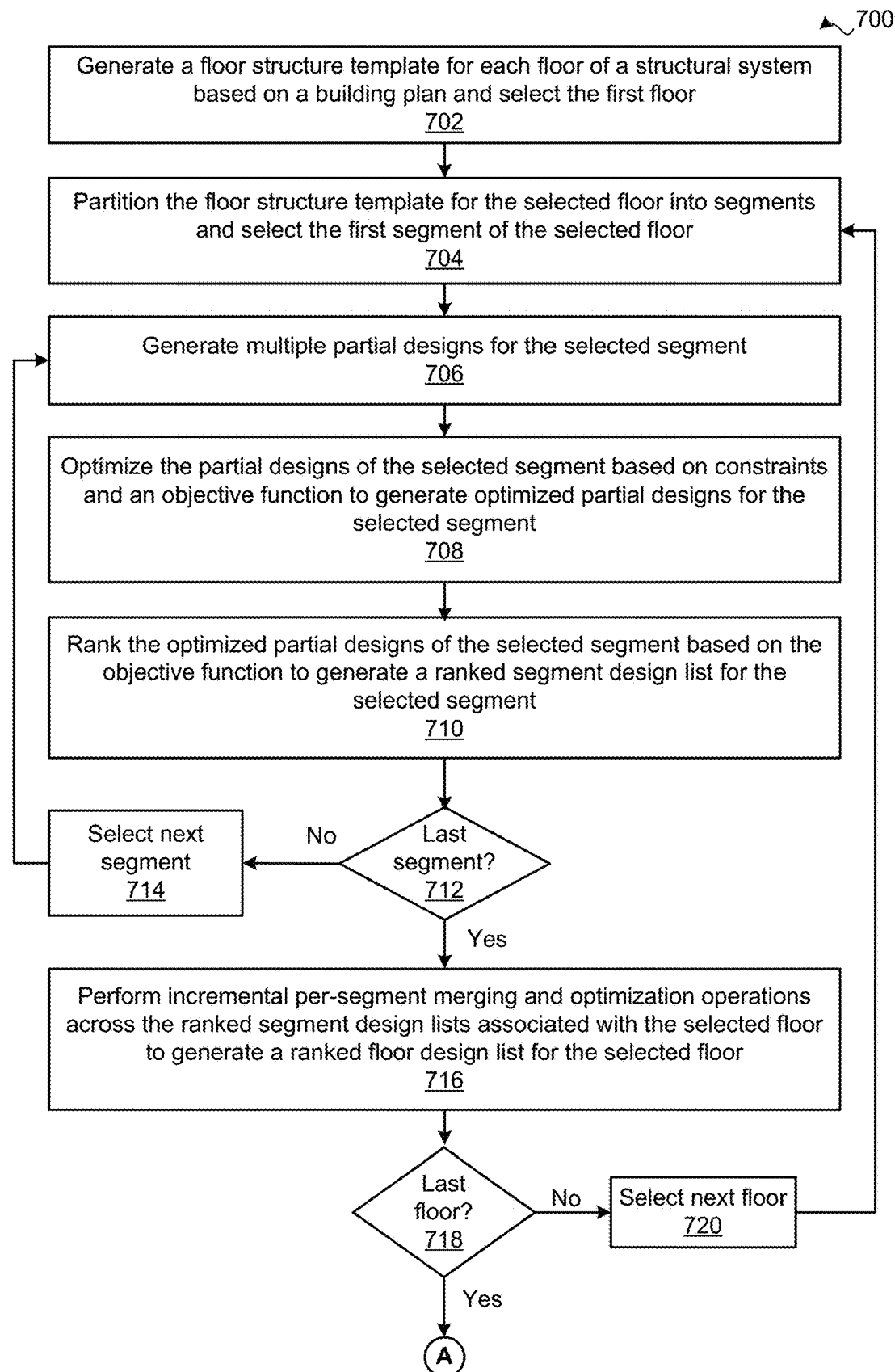
FIGS. 7A-7B set forth a flow diagram of method steps for generating a design for a structural system of a building, according to various embodiments.
Figure 7B:
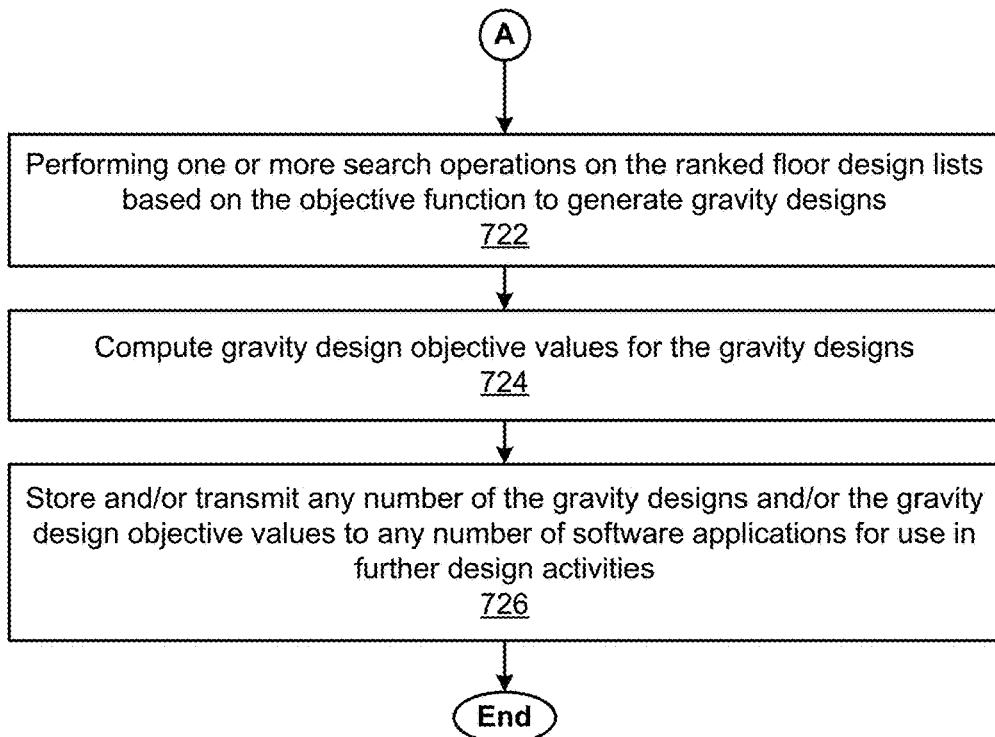

FIGS. 7A-7B set forth a flow diagram of method steps for generating at least one design of a structural system of a building, according to various embodiments. Although the method steps are described with reference to the systems of FIGS. 1-3, persons skilled in the art will understand that any system configured to implement the method steps, in any order, falls within the scope of the present invention.

As shown, a method 700 begins a step 702, where the design concept engine 220 generates the floor structure template 222 for each floor of the structural system of the building based on the building plan 124. The gravity design application 140 then selects the first floor. At step 704, the partitioning engine 224 partitions the floor structure template 222 for the selected floor into any number of the segments 230 and then selects the first of the segments 230 of the selected floor.

At step 706, the layout variation engine 250 generate multiple of the partial designs 258 for the selected segment 230. At step 708, the gravity design optimizer 260 optimizes the partial designs 258 of the selected segment 230 based on the constraints 132 and the objective function 134 to generate the optimized partial designs 268 for the selected segment 230. At step 710, the segment design ranking engine 270 ranks the optimized partial designs 268 for the selected segment 230 based on the objective function 134 generate the ranked segment design list 278 for the selected segment 230.

At step 712, the partitioning engine 224 determines whether the selected segment 230 is the last of the segments 230 that are associated with the selected floor. If, at step 712, the partitioning engine 224 determines that the selected segment 230 is not the last of the segments 230 that are associated with the selected floor, then the method 700 proceeds to step 714. At step 714, the partitioning engine 224 selects the next of the segments 230 that are associated with the selected floor, and the method 700 returns to the step 706, where the layout variation engine 250 generate multiple of the partial designs 258 for the selected segment 230.

If, however, at step 712, the partitioning engine 224 determines that the selected segment 230 is the last of the segments 230 that are associated with the selected floor, then the method 700 proceeds directly to step 716. At step 716, the incremental merging engine 280 performs incremental per-segment merging and optimization operations across the ranked segment design lists 278 associated with the selected floor to generate the ranked floor design list 288 for the selected floor At step 718, the gravity design application 140 determines whether the selected floor is the last floor. If, at step 718, the gravity design application 140 determines that the selected floor is not the last floor, then the method 700 proceeds to step 720. At step 720, the gravity design application 140 selects the next floor, and the method 700 returns to step 704, where the partitioning engine 224 partitions the floor structure template 222 for the selected floor.

If, however, at step 718, the gravity design application 140 determines that the selected floor is the last floor, then the method 700 proceeds directly to step 722. At step 722, the multi-floor optimizer 290 performs one or more search operations on the ranked floor design lists 288 based on the objective function 134 to generate the gravity designs 148. At step 724, multi-floor optimizer 290 computes the gravity design objective values 146 based on the gravity designs 148 and the objective function 134. At step 726, the gravity design application 140 stores and/or transmits any number of the gravity designs 148 and/or the gravity design objective values 146 to any number of software application for use in further design activities. The method 700 then terminates.

For explanatory purposes only, the method steps of the method 700 are depicted and described as occurring sequentially. However, as persons skilled in the art will recognize, the steps 704-720 can be performed sequentially, concurrently, or in any combination thereof for each of the floors Similarly, the steps 706-714 can be performed sequentially, concurrently, or in any combination thereof for each of the segments 230.

Figure 8A:
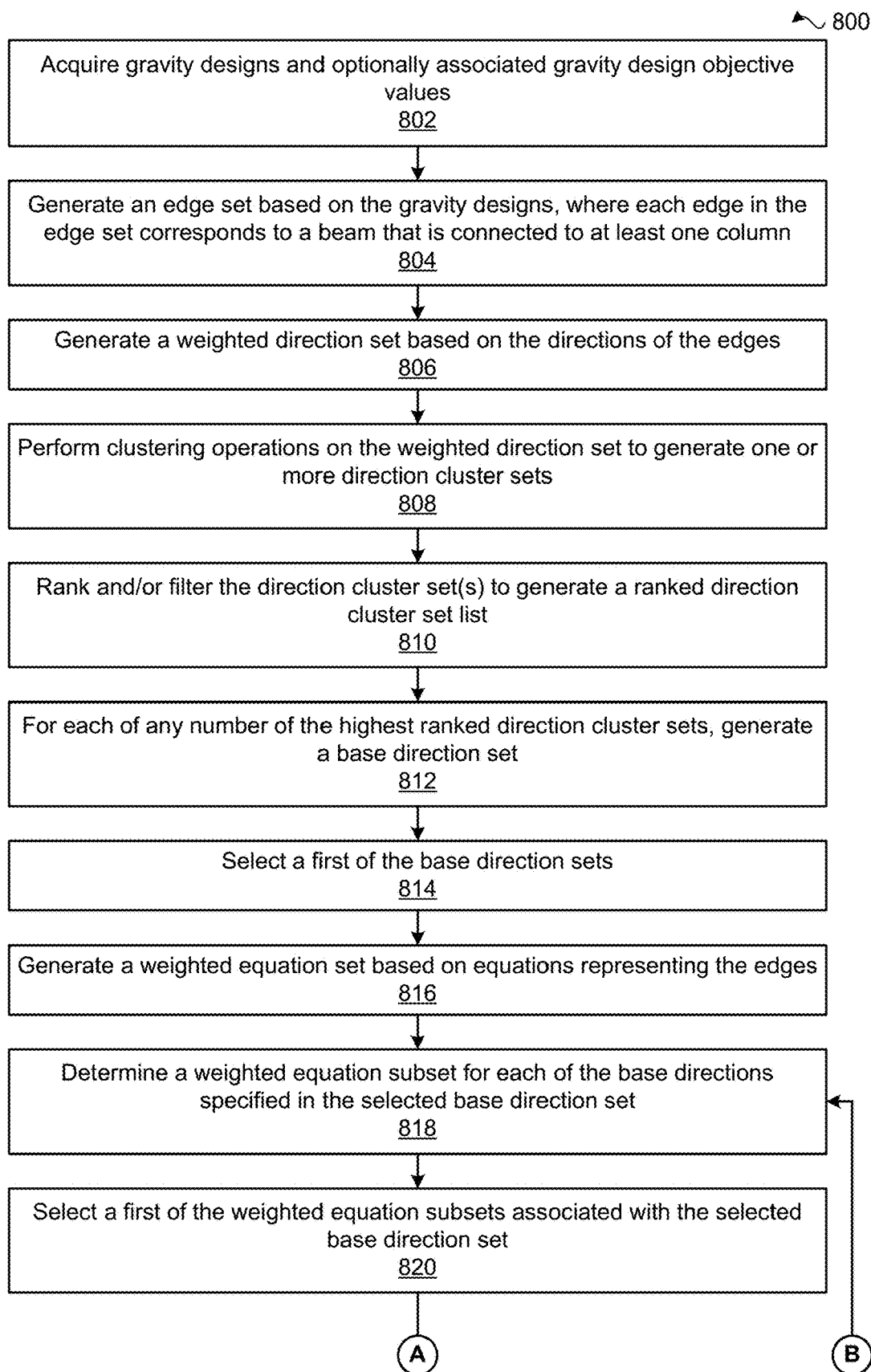
FIGS. 8A-8B set forth a flow diagram of method steps for generating a frame grid for a structural system of a building, according to various embodiments.
Figure 8B:
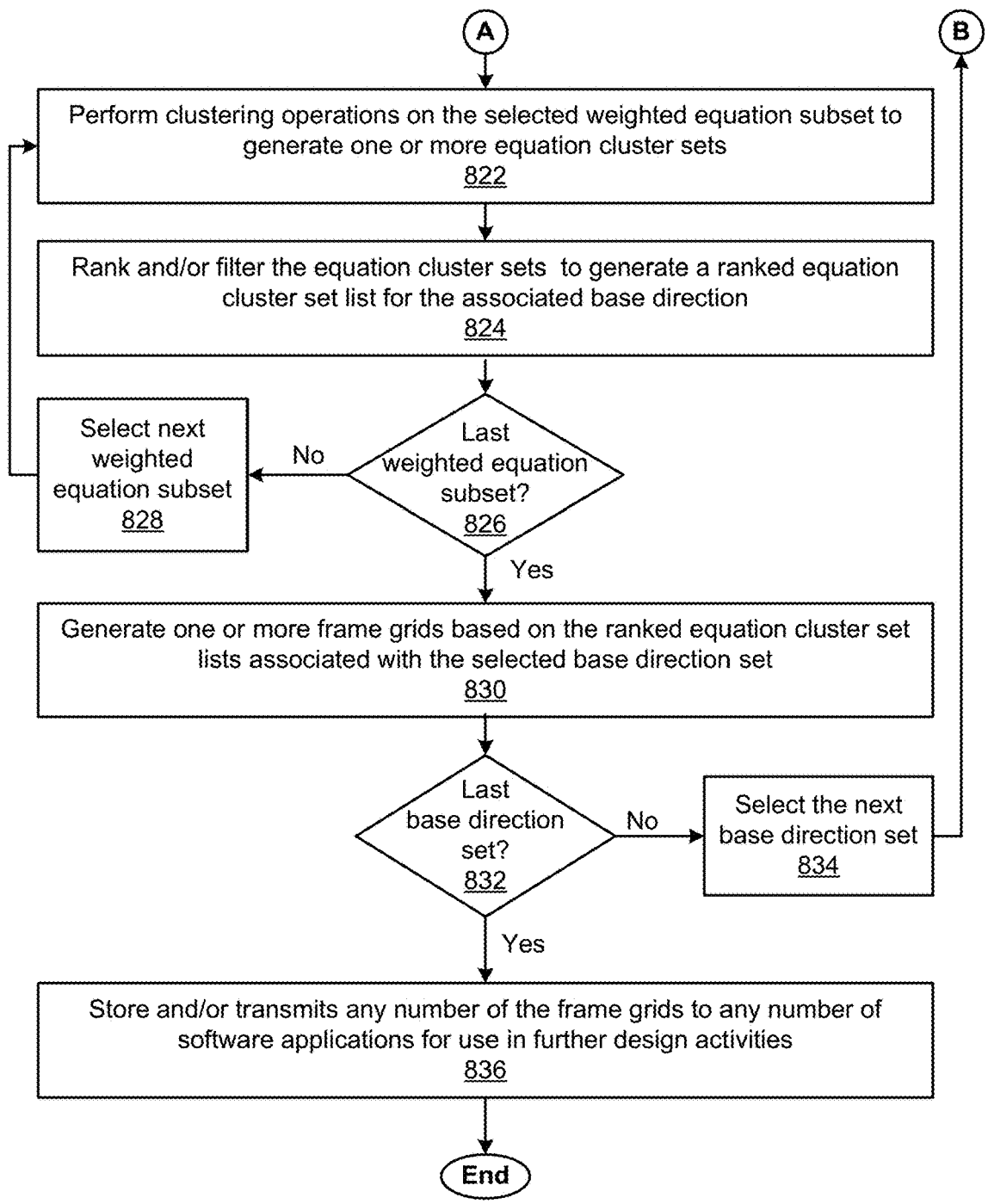

FIGS. 8A-8B set forth a flow diagram of method steps for generating a frame grid for a structural system of a building, according to various embodiments. Although the method steps are described with reference to the systems of FIGS. 1-4, persons skilled in the art will understand that any system configured to implement the method steps, in any order, falls within the scope of the present invention.

As shown, a method 800 begins a step 802, where the grid generation application 150 acquires the gravity designs 148 and optionally the gravity design objective values 146 that are associated with the gravity designs 148. At step 804, the grid generation application 150 generates the edge set 402 based on the gravity designs 148. Each of the edges included in the edge set 402 corresponds to a different beam that is connected to at least one column.

At step 806, the base direction engine 410 generates the weighted direction set 412 based on the directions of the edges included in the edge set 402. At step 808, the direction clustering engine 420 performs any number and/or types of clustering operations on the weighted directions included in the weighted direction set 412 to generate the direction cluster sets 428. At step 810, the direction clustering engine 420 performs any number and/or types of ranking and/or filtering operations on the direction cluster sets 428 to generate the ranked direction cluster set list 408.

At step 812, for each of any number of the direction cluster sets 428 having the highest ranking as per the ranked direction cluster set list 408, the grid generation application 150 generates the base direction set 436 based on the direction clusters included in the direction cluster set 428. At step 814, the grid generation application 150 selects a first of the base direction sets 436.

At step 816, the grid equation engine 440 generates the weighted equation set 442 based on equations representing the edges included in the edge set 402. At step 818, the equation partitioning engine 450 determines the weighted equation subset 458 from the weighted equation set 442 for each of the base directions 438 specified in the selected base direction set 436. At step 820, the grid equation engine 440 selects a first of the weighted equation subsets 458 that are associated with the selected base direction set 436.

At step 822, the grid equation engine 440 performs any number and/or types of clustering operations on the weighted equations included in the selected one of the weighted equation subsets 458 to generate one or more of the equation cluster sets. At step 824, the grid equation engine 440 performs any number and/or types of ranking and/or filtering operations on the equation cluster sets to generate the ranked equation cluster set list 468 for the base direction 438 that is associated with the selected one of the weighted equation subsets 458.

At step 826, the grid equation engine 440 determines whether the selected one of the weighted equation subsets 458 is the last of the weighted equation subsets 458 that is associated with the selected base direction set 436. If, at step 826, the grid equation engine 440 determines that the selected one of the weighted equation subsets 458 is not the last of the weighted equation subsets 458 that is associated with the selected base direction set 436, then the method 800 proceeds to step 828.

At step 828, the grid equation engine 440 selects the next of the weighted equation subsets 458 that are associated with the selected base direction set 436, and the method 800 returns to step 822, where the grid equation engine 440 generates one or more of new equation cluster sets. The method 800 continues to cycle though steps 822-828 until, at step 826, the grid equation engine 440 determines that the selected one of the weighted equation subsets 458 is the last of the weighted equation subsets 458 that is associated with the selected base direction set 436.

If, at step 826, the grid equation engine 440 determines that the selected one of the weighted equation subsets 458 is the last of the weighted equation subsets 458 that is associated with the selected base direction set 436, then the method 800 proceeds direction to step 830. At step 830, the grid specification engine 490 generates any number of the frame grids 158 based on the ranked equation cluster set list 468 for the selected one of the weighted equation subsets 458.

At step 832, the grid generation application 150 determines whether the selected base direction set 436 is the last of the base direction sets 436. If, at step 832, the grid generation application 150 determines that the selected base direction set 436 is not the last of the base direction sets 436, then the method 800 proceeds to step 834. At step 834, the grid generation application 150 selects the next of the base direction sets 436, and the method 800 returns to step 818, where the equation partitioning engine 450 determines the weighted equation subsets 458 based on the selected base direction set 436. The method 800 continues to cycle though steps 818-834 until, at step 822, the grid generation application 150 determines that the selected base direction set 436 is the last of the base direction sets 436.

If, at step 822, the grid generation application 150 determines that the selected base direction set 436 is the last of the base direction sets 436, then the method 800 proceeds direction to step 836. At step 836, the grid generation application 150 stores and/or transmits any number of the frame grids 158 to any number of software application for use in further design activities. The method 800 then terminates.

For explanatory purposes only, the method steps of the method 800 are depicted and described as occurring sequentially. However, as persons skilled in the art will recognize, the steps 814-834 can be performed sequentially, concurrently, or in any combination thereof for each of the base direction sets 436 Similarly, the steps 820-828 can be performed sequentially, concurrently, or in any combination thereof for each of the weighted equation subsets 458.

Figure 9:
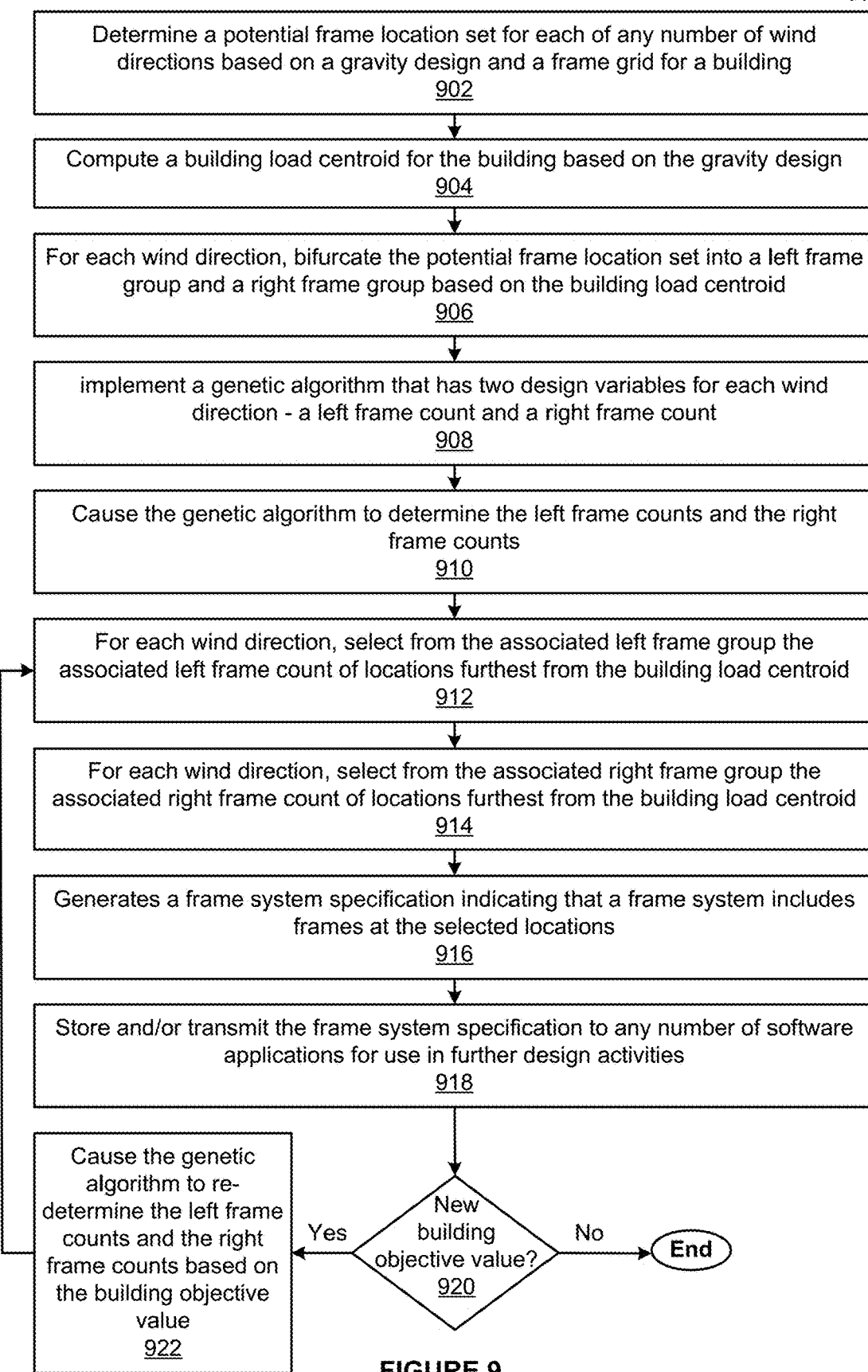
FIG. 9 is a flow diagram of method steps for generating a design for a frame system associated with a building, according to various embodiments.

FIG. 9 is a flow diagram of method steps for generating a design for a frame system associated with a building, according to various embodiments. Although the method steps are described with reference to the systems of FIGS. 1-5, persons skilled in the art will understand that any system configured to implement the method steps, in any order, falls within the scope of the present invention.

As shown, a method 900 begins a step 902, where the wind direction allocation engine 510 determines the potential frame location set 514 for each of the wind directions 164 based on the gravity design 148 for a building, the frame grid 158. At step 904, the wind direction allocation engine 510 computes the building load centroid 520 for the building based on the gravity design 148.

At step 906, for each of the wind directions 164(w), where w is an integer from 1 to W, the frame partitioning engine 530 bifurcates the potential frame location set 514(w) into the left frame group 542(w) and the right frame group 544(w) based on the building load centroid 520. At step 908, the frame specification application 170 implements the genetic algorithm 550 that has two design variables for each of the wind directions 164(w)—the left frame count 572(w) and the right frame count 574(w).

At step 910, the frame specification application 170 causes the genetic algorithm 550 to determine the left frame counts 572 and the right frame counts 574. At step 912, for each of the wind directions 164(w), the frame selection engine 580 selects from the left frame group 542(w) the left frame count 572(w) of locations furthest from the building load centroid 520. At step 914, for each of the wind directions 164(w), the frame selection engine 580 selects from the right frame group 544(w) the right frame count 574(w) of locations furthest from the building load centroid 520.

At step 916, the frame selection engine 580 generates the frame system specification 178 indicating that a frame system includes, without limitation, frames at the selected locations. At step 918, the frame specification application 170 stores and/or provides the frame system specification 178 to any number of software applications for use in further design activities.

At step 920, the frame specification application 170 determines whether the frame specification application 170 acquires the building objective value 186 associated with the frame system specification 178. If at step 920, the frame specification application 170 determines that the frame specification application 170 does not acquire the building objective value 186, then the method 900 terminates.

If, however, at step 920, the frame specification application 170 determines that the frame specification application 170 acquires the building objective value 186, then the method 900 proceeds to step 922. At step 922, the frame specification application 170 causes the genetic algorithm 550 to re-determine the left frame counts 572 and the right frame counts 574 based on the building objective value 186. The method 900 then returns to step 912, where the frame selection engine 580 selects locations from the left frame groups 542 and the right frame groups 544 based on the left frame counts 572 and the right frame counts 574.

The method 900 continues to cycle though steps 912-922 until, at step 920, the frame specification application 170 determines that the frame specification application 170 does not acquire the building objective value 186. The method 900 then terminates.

Figure 10A:
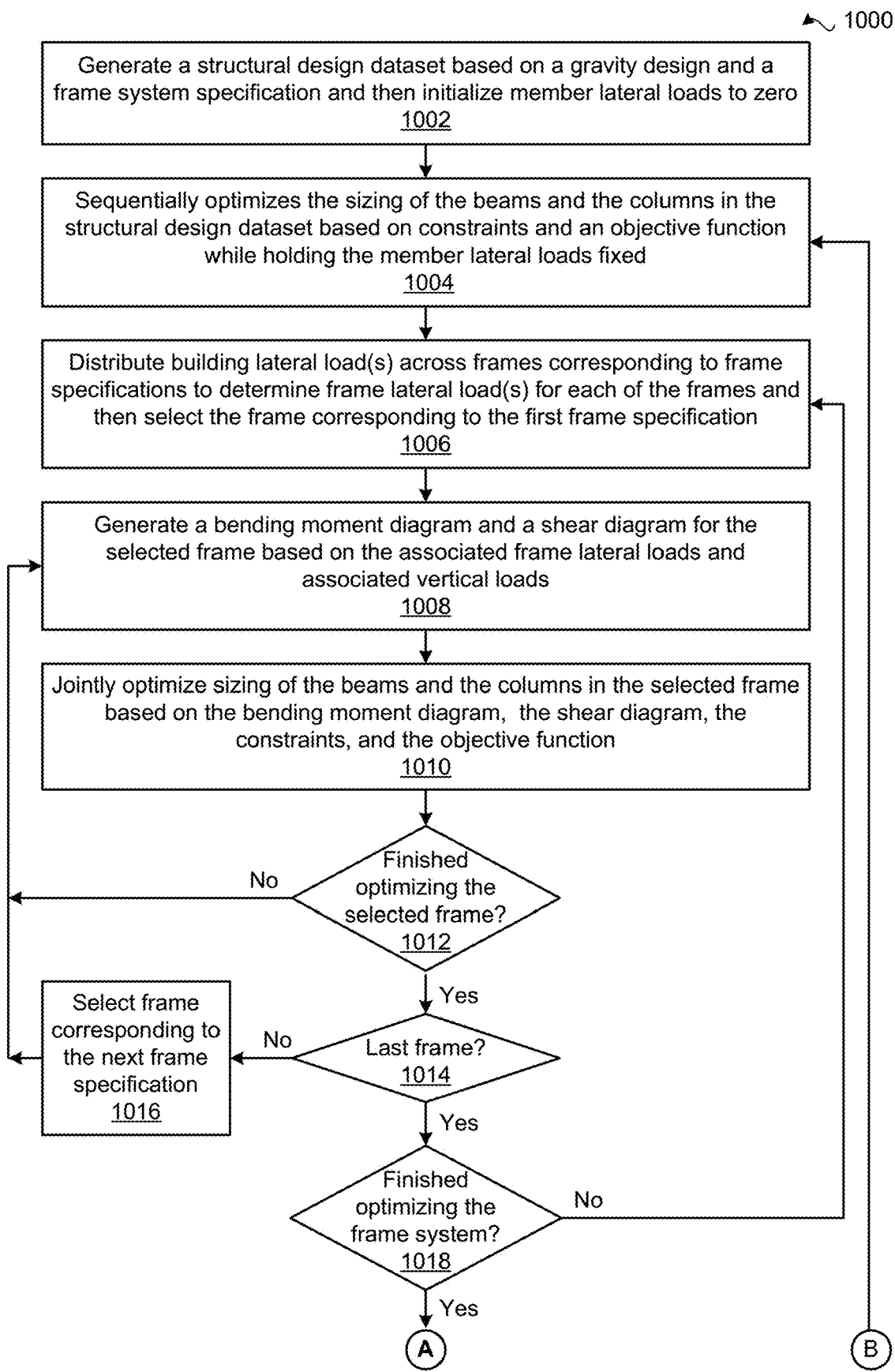
FIGS. 10A-10B set forth a flow diagram of method steps for designing a structural system of a building to resist a lateral load, according to various embodiments.
Figure 10B:
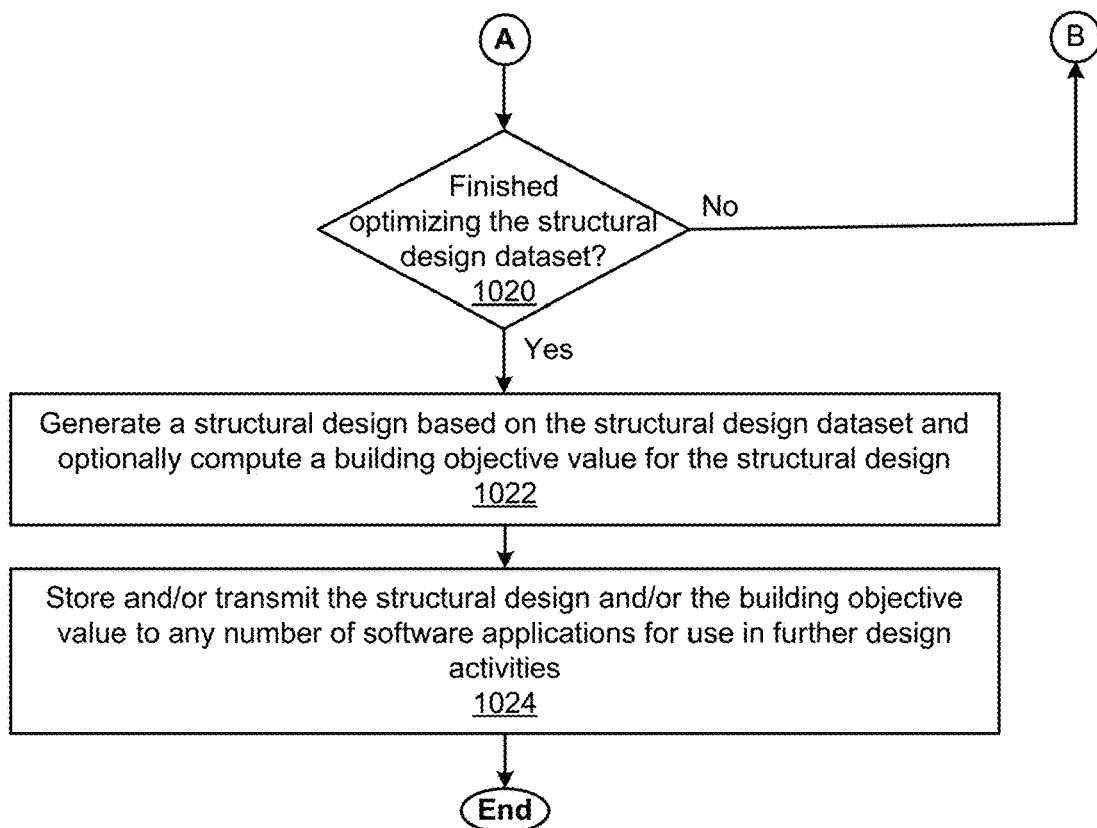

FIGS. 10A-10B set forth a flow diagram of method steps for designing a structural system of a building to resist a lateral load, according to various embodiments. Although the method steps are described with reference to the systems of FIGS. 1-6, persons skilled in the art will understand that any system configured to implement the method steps, in any order, falls within the scope of the present invention.

As shown, a method 1000 begins a step 1002, where the design initialization engine 620 generates the structural design dataset 610 that specifies, without limitation, the frame system based on the gravity design 148 and the frame system specification 178. The structural system iteration controller 630 then initializes the member lateral loads to zero. At step 1004, the structural system iteration controller 640 sequentially optimizes the sizing of the beams and the columns specified in the structural design dataset 610 based on the constraints 132 and the objective function 134 while holding the member lateral loads fixed.

At step 1006, the lateral load distribution engine 660 distributes one or more building lateral loads (e.g., the building wind loads included in the building wind load data 162) across the frames corresponding to the frame specifications 616 to determine any number of frame lateral loads for each of the frames. The frame system iteration controller 650 then selects the frame corresponding to the frame specification 616(1).

At step 1008, the frame analyzer 680 generates the bending moment diagram 662 and the shear diagram 664 for the selected frame based on the associated frame lateral load(s) and the associated vertical loads. At step 1010, the lateral load resizing engine 690 jointly optimizes the sizing of the beams and the columns in the selected frame based on the bending moment diagram 662, the shear diagram 664, the constraints 132 and the objective function 134.

At step 1012, the frame iteration controller 672 determines whether the frame iteration controller 672 has finished optimizing the selected frame. If, at step 1012, the frame iteration controller 672 determines that the frame iteration controller 672 has not finished optimized the selected frame, then the method 1000 returns to step 1008, where the frame analyzer 680 re-generates the bending moment diagram 662 and the shear diagram 664 for the selected frame.

If, however, at step 1012, the frame iteration controller 672 determines that the frame iteration controller 672 has finished optimized the selected frame, then the method 1000 proceeds direction to step 1014. At step 1014, the frame system iteration controller 650 determines whether the selected frame corresponds to the last of the frames specifications 616. If, at step 1014, the frame system iteration controller 650 determines that the selected frame does not correspond to the last of the frame specifications 616, then the method 1000 proceeds to step 1016.

At step 1016, the frame iteration controller 672 selects the frame corresponding to the next of the frame specifications 616. The method 1000 then returns to step 1008, where the frame analyzer 680 re-generates the bending moment diagram 662 and the shear diagram 664 for the selected frame. The method 1000 continues to cycle though steps 1008-1016 until, at step 1014, the frame iteration controller 672 determines that the selected frame corresponds to the last of the frame specifications 616.

If, at step 1014, the frame iteration controller 672 determines that the selected frame corresponds to the last of the frame specifications 616, then the method 1000 proceeds directly to step 1018. At step 1018, the frame system iteration controller 650 determines whether the frame system iteration controller 650 has finished optimizing the frame system.

If, at step 1018, the frame system iteration controller 650 determines that the frame system iteration controller 650 has not finished optimizing the frame system, then the method 1000 returns to step 1006, where the lateral load distribution engine 660 re-distributes the building lateral loads across the frames corresponding to the frame specifications 616. The method 1000 continues to cycle though steps 1006-1018 until, at step 1018, the frame system iteration controller 650 determines that the frame system iteration controller 650 has finished optimizing the frame system.

If, at step 1018, the frame system iteration controller 650 determines that the frame system iteration controller 650 has finished optimizing the frame system, then the method 1000 proceeds to step 1020. At step 1020, the structural system iteration controller 630 determines whether the structural system iteration controller 630 has finished optimizing the structural design dataset 610.

If, at step 1020, the structural system iteration controller 630 determines that the structural system iteration controller 630 has not finished optimizing the structural design dataset 610, then the method 1000 returns to step 1004, where the structural system iteration controller 640 sequentially optimizes the sizing of the beams and the columns in the structural design dataset 610 while holding the member lateral loads fixed. The method 1000 continues to cycle though steps 1004-1020 until, at step 1020, the structural system iteration controller 630 determines that the structural system iteration controller 630 has finished optimizing the structural design dataset 610, If, at step 1020, the structural system iteration controller 630 determines that the structural system iteration controller 630 has finished optimizing the structural design dataset 610, then the method 1000 proceeds to step 1022. At step 1022, the structural system iteration controller 630 generates the structural design 188 based on the structural design dataset 610 and optionally computes the building objective value 186 for the structural design 188. At step 1024, the iterative sizing application 180 stores and/or transmits the structural design 188 and/or the building objective value 186 to any number of other software applications in any technically feasible fashion. The method 1000 then terminates.

For explanatory purposes only, the method steps of the method 1000 are depicted and described as occurring sequentially. However, as persons skilled in the art will recognize, the steps 1008-1016 can be performed sequentially, concurrently, or in any combination thereof for each of the frames corresponding to the frame specifications 616.

Generating Structural Systems for Arbitrarily Shaped Floors

Referring back now to FIG. 1, in some embodiments, the structural design application 120 may include, without limitation, a grid-based design application 1100. In the same or other embodiments, the grid-based design application 1100 may reside in the memory 116 of the compute instance 110 and executes on the processor 112 of the compute instance 110.

As described in greater detail below in conjunction with FIGS. 11-14, in some embodiments, the grid-based design application 1100 automatically generates CAD designs for structural systems that enable arbitrarily shaped floors of arbitrarily shaped buildings to resist vertical loads (e.g., gravity). CAD designs for structural systems are also referred to herein as "structural system designs." The grid-based design application 1100 can be executed in a stand-alone fashion to generate structural systems designs for individual floors or can be integrated into any number and/or types of design flows in any technically feasible fashion.

In some embodiments, the gravity design application 140 is modified to use the grid-based design application 1100 instead of the floor design engine 210 to generate gravity designs 148 that enable arbitrarily shaped buildings to resist vertical loads. Although not shown, in the same or other embodiments, the iterative optimization application 172 can use any number of gravity designs 148 generated using the grid-based design application 1100 to generate structural designs 188 that enable arbitrarily shaped buildings to resist both vertical and lateral loads.

In general, relative to the floor design engine 210, the grid-based design application 1100 can generate designs for structural systems of floors having a wider variety of shapes and sizes. As described previously herein in conjunction with FIG. 2, in some embodiments, the floor design engine 210 independently generates partial designs 258 for segments 230. Each segment 230 represents a structural system for a relatively small rectangular-shaped portion of a floor. By contrast, in some embodiments, the grid-based design application 1100 generates structural grids and corresponding designs of structural systems for relatively large arbitrarily shaped portions of floors referred to herein as "regions."

In some embodiments, each structural grid includes, without limitation, a different arrangement of grid lines that indicates preferred locations of primary structural members (e.g., beams). In the same or other embodiments, each layout and each design for a structural system for a given region is associated with one of any number of structural grids associated with the region. In some embodiments, the grid-based design application 1100 and/or any number of other applications uses grid lines to facilitate the representation of arbitrarily shaped regions using a poly-quad data structure. In the poly-quad data structure, polygons can be represented by one to four grid lines, one or more parent edges for each grid line, and zero or more child edges for each parent edge.

In the same or other embodiments, the grid-based design application 1100 combines designs of structural systems for one or more regions to generate one or more structural system designs for any floor within any type of building. For instance, in some embodiments, the floor design engine 210 generates structural system designs for an arbitrarily shaped floor within a multi-story office building. In the same or other embodiments, the floor design engine 210 generates structural system designs for an arbitrarily shaped floor within a single-story residential building.

In some other embodiments, the grid-based design application 1100 can represent arbitrarily shaped floors and shapes in any technically feasible fashion. In the same or other embodiments, the gravity design application 140 and/or the iterative optimization application 172 use the poly-quad data structure or another data structure that is capable of efficiently representing polygon shapes to generate designs for structural systems associated with a least a portion of arbitrarily shaped buildings.

In some embodiments, because regions can be significantly larger than segments 230, the time required for the grid-based design application 1100 to generate structural designs for a given floor can be substantially reduced relative to the time that would be required for the floor design engine 210 to generate structural designs for the floor. In some embodiments, the grid-based design application 1100 but not the floor design engine 210 can successfully generate structural designs for floors of a large building (e.g. a large factory) within the time allocated for design activities. Furthermore, relative to the floor design engine 210, because users are often familiar with designing based on structural grids, users can more readily and efficiently perform further design activities using designs generated by the grid-based design application 1100.

Figure 11:
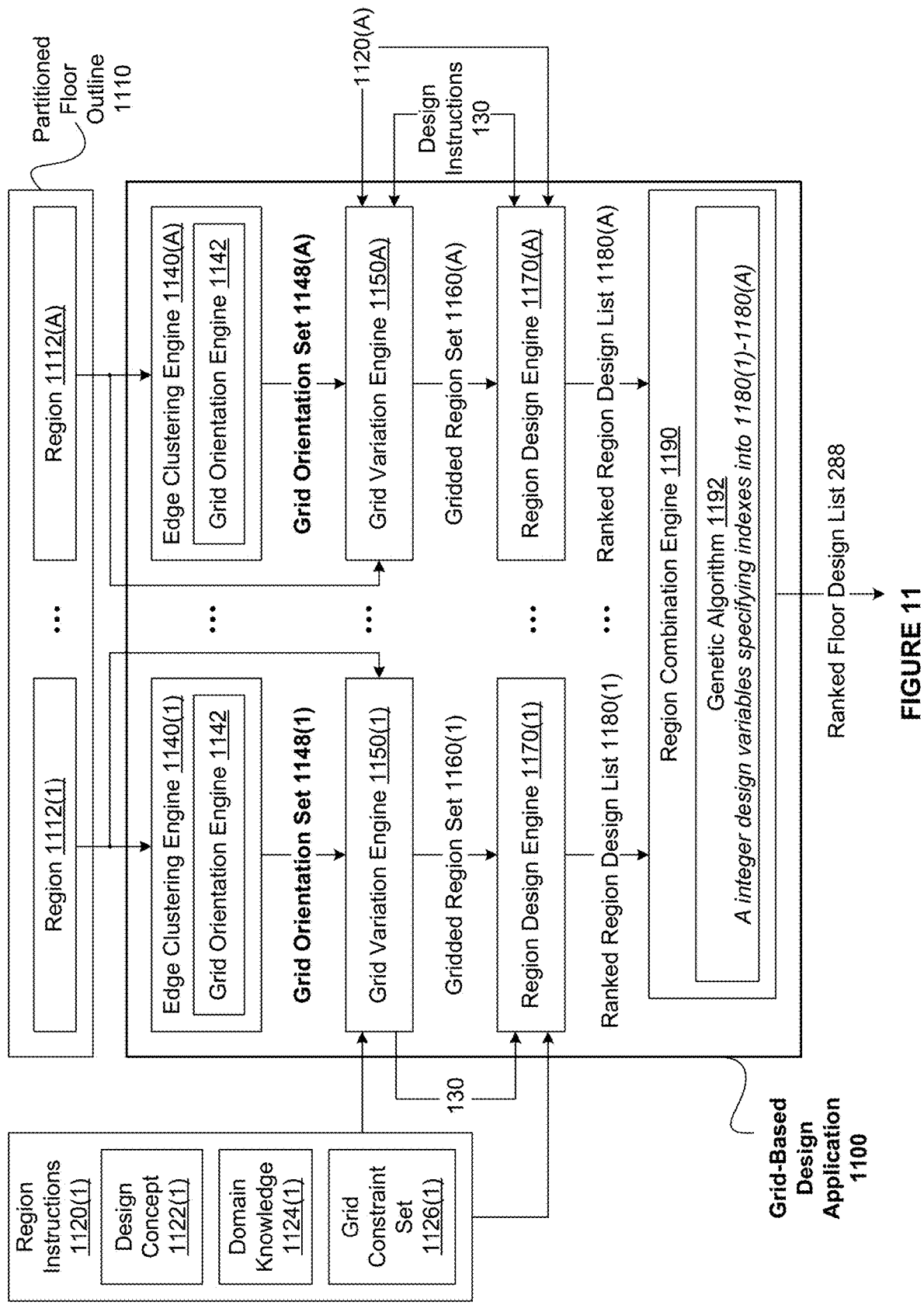
FIG. 11 is a more detailed illustration of the grid-based design application of FIG. 1, according to various embodiments.

FIG. 11 is an illustration of the grid-based design application 1100 of FIG. 1, according to various embodiments. Referring back to FIG. 1, in some embodiments, the grid-based design application 1100 resides in the memory 116 of the compute instance 110 and executes on the processor 112 of the compute instance 110. As shown, in some embodiments, the grid-based design application 1100 generates the ranked floor design list 288 based on regions 1112(1)-1112(A) included in a partitioned floor outline 1110, design instructions 130, and region instructions 1120(1)-1120(A), where A can be any positive integer.

In some embodiments, the regions 1112(1)-1112(A) are associated with the region instructions 1120(1)-1120(A), respectively. Each of regions 1112(1)-1112(A) can specify any number and/or types of shapes representing any number and/or types of objects and/or areas having any sizes. Each region 1112 is associated with any number of boundary edges that define a boundary of the region 1112. In some embodiments, the boundaries of the regions 1112(1)-1112(A) are non-overlapping and an aggregation of the regions 1112(1)-1112(A) represents a floor of any type of building. In some embodiments, the building is a low-rise building, a mid-rise building, or a large factory.

The regions 1112 can be determined in any technically feasible fashion. For instance, in some embodiments, the regions 1112 are specified by a user via the GUI 106. In some other embodiments, the grid-based design application 1100 can determine the regions 1112 in any technically feasible fashion. For instance, in some embodiments, the grid-based design application 1100 compares variations in floor plans of different floors to determine the regions 1112. In the same or other embodiments, the grid-based design application 1100 clusters the edge directions of architectural features to identify regions 1112 having similar architectural feature orientations.

As described previously herein in conjunction with FIG. 1, in some embodiments, the design instructions 130 include, without limitation, constraints 132, objective function 134, design variable data 136, and parameter data 138 associated with the building. As shown explicitly for region instructions 1120(1), in some embodiments, the region instructions 1120(1)-1120(A) include, without limitation, design concepts 1122(1)-1122(A), respectively, domain knowledge 1124(1)-1124(A), respectively, and grid constraint sets 1126(1)-1126(A), respectively. In some embodiments, any number amount and/or types of region instructions 1120(1)-1120(A) can override any number and/or types of design instructions 130.

The region instructions 1120(1)-1120(A) are also referred to herein individually as "the region instruction 1120" and collectively as "the region instructions 1120." The design concepts 1122(1)-1122(A) are also referred to herein individually as "the design concept 1122" and collectively as "the design concepts 1122." The domain knowledge 1124(1)-1124(A) is also referred to herein individually and collectively as "the domain knowledge 1124." The grid constraint sets 1126(1)-1126(A) are also referred to herein individually as "the grid constraint set 1126" and collectively as "the grid constraint sets 1126."

The design concepts 1122(1)-1122(A) specify, without limitation, any amount and/or types of data that defines properties of the portion of the structural system that is to be designed for the regions 1112(1)-1112(A), respectively of the floor of the building. One example of design concept 1122 is a two-way spanning in-situ concrete floor structure with steel I sections for beams and hollow box sections for columns. Another example of design concept 1122 is an oriented strand board floor structure with rectangular Glulam timber sections. Yet another example of design concept 1122 is a two-way reinforced concrete slab with reinforced concrete beams.

The domain knowledge 1124(1)-1224(A) can include, without limitation, any amount and/or types of knowledge that is relevant to the design and analysis of structural systems. For instance, in some embodiment, each domain knowledge 1124(1)-1124(A) includes, without limitation, any number and/or types of knowledge-based rules that can be used to determine the slab spanning type (e.g., one-way spanning, two-way spanning, cantilever, etc.) for each slab. The grid constraint sets 1126(1)-1126(A) specify, without limitation, any number and/or types of constraints for structural grids for the regions 1112(1)-1112(A), respectively. For instance, in some embodiments, the grid constraint set 1126(1) specifies, without limitation, a minimum spacing, a maximum spacing, and a maximum cantilever length associated with structural grids for the region 1112(1).

The ranked floor design list 288 corresponds to the floor that includes, without limitation, the regions 1112(1)-1112(A). In some embodiments, the ranked floor design list 288 includes, without limitation, any number of designs for the structural system of the corresponding floor and objective values for the designs. The objective values for the designs determine the ordering of the designs within the ranked floor design list 288. As noted previously herein in conjunction with FIG. 2, a structural system for a floor is also referred to herein as a "floor structure."

In some embodiments, each design of a floor structure specifies, without limitation, any number and/or types of horizontal structural members associated with the corresponding floor and any number and/or types of vertical structural members that are designed as part of the floor structure. In the same or other embodiments, the vertical structural members that are designed as part of a given floor structure include, without limitation, any number and/or type of vertical members that extend down from the floor to an immediately lower floor (if one exists) or a foundation. In some embodiments, each layout and each design of a floor structure specifies, without limitation, locations, types, and materials for any number of slabs, any number of beams, and any number of columns, and optionally any number of grid lines.

As shown, in some embodiments, the grid-based design application 1100 includes, without limitation, edge clustering engines 1140(1)-1140(A), grid orientation sets 1148(1)-1148(A), grid variation engines 1150(1)-1150(A), gridded region sets 1160(1)-1160(A), region design engines 1170(1)-1170(A), ranked region design lists 1180(1)-1180(A), and a region combination engine 1190. The edge clustering engines 1140(1)-1140(A), the grid orientation sets 1148(1)-1148(A), the grid variation engines 1150(1)-1150(A), the gridded region sets 1160(1)-1160(A), the region design engines 1170(1)-1170(A), and the ranked region design lists 1180(1)-1180(A) are associated with the regions 1112(1)-1112(A), respectively.

The edge clustering engines 1140(1)-1140(A) are different instances of a single software application referred to herein as "the edge clustering engine 1140" and are also referred to herein individually as "the edge clustering engine 1140" and collectively as "the edge clustering engines 1140." The grid variation engines 1150(1)-1150(A) are different instances of a single software application referred to herein as "the grid variation engine 1150" and are also referred to herein individually as "the grid variation engine 1150" and collectively as "the grid variation engines 1150." The region design engines 1170(1)-1170(A) are different instances of a single software application referred to herein as "the region design engine 1170" and are also referred to herein individually as "the region design engine 1170" and collectively as "the region design engines 1170."

In some embodiments, the number of instances of the edge clustering engine 1140, the grid variation engine 1150, the region design engine 1170, or any combination thereof can differ from the total number of regions 1112, and the techniques described herein are modified accordingly. The instances of the edge clustering engine 1140 can execute sequentially, concurrently, or in any combination thereof. The instances of the grid variation engine 1150 can execute sequentially, concurrently, or in any combination thereof. The instances of the region design engine 1170 can execute sequentially, concurrently, or in any combination thereof.

For explanatory purposes only, the grid orientation sets 1148(1)-1148(A) are also referred to herein individually as "the grid orientation set 1148" and collectively as "the grid orientation sets 1148." The gridded region sets 1160(1)-1160(A) are also referred to herein individually as "the gridded region set 1160" and collectively as "the gridded region sets 1160." The ranked region design lists 1180(1)-1180(A) are also referred to herein individually as "the ranked region design list 1180" and collectively as "the ranked region design lists 1180."

For explanatory purposes only, in the context of FIG. 11, a variable x denotes an integer from 1 through A, inclusive. In some embodiments, any instance of edge clustering engine 1140 can generate the grid orientation set 1148(x) in any technically feasible fashion based on the region 1112(x) and any amount (including none) and/or types of additional data. In the same or other embodiments, any instance of the grid variation engine 1150 can generate the grid region set 1160(x) in any technically feasible fashion based on the region 1112(x), the grid orientation set 1148(x), and any amount (including none) and/or types of additional data. In some embodiments, any instance of the region design engine 1170 can generate the ranked region design list 1180(x) in any technically feasible fashion based on the gridded region set 1160(x), the design instructions 130, and any amount (including none) and/or types of additional data.

As shown, in some embodiments, the edge clustering engine 1140(x) generates the grid orientation set 1148(x) based on the region 1112(x). The grid orientation set 1148(x) specifies, without limitation, one or more grid orientations (not shown), where each grid orientation is a different direction that characterizes corresponding structural grids. More precisely, a structural grid corresponding to a given grid orientation includes, without limitation, zero or more grid lines having the grid orientation and zero or more grid lines that are perpendicular to the grid orientation.

In some embodiments, the arrangement of grid lines in a structural grid indicates potential locations of primary structural members (e.g., beams, columns, etc.). Notably, each grid orientation represents a pair of orthogonal directions and each pair of orthogonal directions is represented by a single grid orientation. For example, the pair of orthogonal directions 0 degrees and 90 degrees could be represented as a single grid orientation of 0 degrees or 90 degrees.

As shown, in some embodiments, the edge clustering engine 1140 includes, without limitation, a grid orientation engine 1142. The grid orientation engine 1142 implements, without limitation, any number and/or types of unsupervised clustering operations and/or algorithms and optionally any number and/or types of ranking operations and/or filtering operations to determine one or more grid orientations based on the boundary edges of the region 1112(x).

In some embodiments, the grid orientation engine 1142 implements clustering operations and algorithms that are similar to the clustering operations and algorithms implemented by the base direction engine 410 described previously herein in conjunction with FIG. 4. Notably, however, while the base direction engine 410 determines any number of directions, the grid orientation engine 1142 determines any number of grid orientations that each represent a different orthogonal pair of directions.

More specifically, in some embodiments, to determine the grid orientation set 1148(x) for the region 1112(x), the grid orientation engine 1142 determines the unique grid orientations represented by the boundary edges and optionally any number and/or types of internal architectural features (e.g., floor openings, partition walls, etc.) of the region 1112(x). In the same or other embodiments, each of the grid orientations is a different angle from 0 degrees through 180 degrees. The grid orientation engine 1142 weights each of the grid orientations based on the total length of the associated boundary edges and associated architectural features. Subsequently, the grid orientation engine 1142 executes multiple instances of a K-means clustering algorithm on the weighted grid orientations based on different combinations of a value of K (i.e., the number of the clusters to generate) and seeding to generate multiple grid orientation cluster sets. Each grid orientation cluster set specifies, without limitation, a different distribution of the weighted grid orientations across any number of grid orientation clusters.

The grid orientation engine 1142 then executes an elbow method heuristic to determine an elbow point based on the grid orientation cluster sets. The grid orientation engine 1142 ranks the grid orientation cluster sets based on increasing distances to the elbow point to determine the highest-ranked grid orientation cluster set. Subsequently, the grid orientation engine 1142 generates the grid orientation set 1148(x) that includes, without limitation, one or more grid orientations, where each grid orientation specifies the centroid of a different grid orientation cluster in the highest-ranked grid orientation cluster set.

As shown, in some embodiments, the grid variation engine 1150(x) generates the gridded region set 1160(x) based on the region 1112(x), the grid orientation set 1148(x), the region instructions 1120(x), and the design instructions 130. The gridded region set 1160(x), includes, without limitation, one or more gridded regions (not shown in FIG. 11), where each gridded region is a version of the region 1112(x) that is partitioned based on a different structural grid. More precisely, each gridded region included in the gridded region set 1160(x) is partitioned by a structural grid having one of the grid orientations included in the grid orientation set 1148(x).

As described in greater detail below in conjunction with FIG. 12, in some embodiments, the grid variation engine 1150(x) generates a different structural grid for any number of combinations of the grid orientation and any number and/or types of other grid variables. In some embodiments, the grid variables include, without limitation, grid orientation, grid spacing, grid aspect ratio, offset alignment, and feature snap. The grid variation engine 1150(x) individually applies each of the structural grids to the region 1112(x) to generate the gridded region set 1160(x). Accordingly, in some embodiments, the size of the gridded region set 1160(x) is greater than the size of the grid orientation set 1148(x).

As shown, in some embodiments, the region design engine 1170(x) generates the ranked region design list 1180(x) based on the gridded region set 1160(x), the region instructions 1120(x), and the design instructions 130. The ranked region design list 1180(x) includes, without limitation, one or more region designs (not shown in FIG. 11) and corresponding region objective value(s) (not shown in FIG. 11). Each region design is a different design of a structural system for the region 1112(x). Each region objective value is a value of the objective function for the corresponding region design. The ordering of the region designs within the ranked region design list 1180(x) reflects a ranking based on the corresponding region objective values.

The region design engine 1170(x) can generate the ranked region design list 1180(x) in any technically feasible fashion. In some embodiments, and as described in greater detail below in conjunction with FIG. 13, the region design engine 1170(x) generates a different region layout for each of the gridded regions included in the gridded region set 1160(x), The region design engine 1170(x) generates each region layout based on a different gridded region, the design concept 1122(x), the domain knowledge 1124(x), and any amount and/or types of other relevant data. Each region layout specifies, without limitation, locations, types, materials, and optionally initial sizing for any number and/or types of structural members.

In some embodiments, the region design engine 1170(x) derives one or more region designs from each region layout. In some embodiments, each region design specifies, without limitation, locations, types, materials, and sizing for the structural members specified in the associated region layout. The region design engine 1170(x) can derive each region design from the associated region layout in any technically feasible fashion.

As described in greater detail below in conjunction with FIG. 13, in some embodiments, for each region layout, the region design engine 1170(x) generates a corresponding initial region design that specifies the locations, the types, the materials, and initial sizing for the structural members specified in the region layout. In the same or other embodiments, for each initial region design, the region design engine 1170(x) performs any number and/or types of optimization operations on the sizing of the structural members based on the constraints 132 and the objective function 134 to generate a corresponding region design. In some embodiments, the region design engine 1170(x) uses the objective function to compute the region objective value for each region design. Subsequently, the region design engine 1170 (x) performs any number and/or types of ranking operations and/or filtering operations on the region designs based on the region objective values to generate the ranked region design list 1180(x).

As shown, in some embodiments, the region combination engine 1190 generates a ranked floor design list 288 based on the ranked region design lists 1180(1)-1180(A). The ranked floor design list 288 includes, without limitation, any number of floor designs and optionally the corresponding floor objective values. Each floor design is a different design for a structural system that enables the floor to resist vertical loads. In some embodiments, each floor design specifies, without limitation, locations, types, materials, and sizing for each of any number of structural members included in the structural system for the floor. Each floor objective value is a value of the objective function for the corresponding floor design. The ordering of the floor designs within the ranked floor design list 288 reflects a ranking based on the corresponding floor objective values.

The region combination engine 1190 can generate the floor designs and compute the floor objective values in any technically feasible fashion. In some embodiments, the region combination engine 1190 generates any number of region design combinations (not shown) based on the ranked region design lists 1180(1)-1180(A). Each region design combination specifies one region design from each of the ranked region design lists 1180(1)-1180(A).

The region combination engine 1190 can determine the region design combinations in any technically feasible fashion. As shown, in some embodiments, the region combination engine 1190 includes, without limitation, a genetic algorithm 1192. In some embodiments, the region combination engine 1190 configures the genetic algorithm 1192 to iteratively optimize selections of region design combinations from the ranked region design lists 1180(1)-1180(A) based on floor objective values associated with previously selected region design combinations.

As depicted in italics, in some embodiments, the region combination engine 1190 defines indices into the ranked region design lists 1180(1)-1180(A) as integer design variables of the genetic algorithm 1192. The region combination engine 1190 configures the genetic algorithm 1192 to set each of the integer design variables to integers within the index range of the region design list 1180 corresponding to the integer design variable. During each iteration, the region combination engine 1190 determines one or more sets of values for the integer design variables and outputs the corresponding region design combination(s).

In some embodiments, after the genetic algorithm 1192 outputs each region design combination, the region combination engine 1190 generates a corresponding floor design and computes the corresponding floor objective value. In the same or other embodiments, the region combination engine 1190 adds zero or more penalties associated with violating any number and/or types of constraints (e.g., minimum grid spacing, service zone height, etc.) to the floor objective value to generate a modified floor objective value. The region combination engine 1190 then inputs the floor objective value or the modified floor objective value into the genetic algorithm to enable the genetic algorithm to iteratively optimize selections of region design combinations. In some embodiments, upon determining that any type of termination criterion (e.g., a total number of iterations) has been satisfied, the region combination engine 1190 causes the genetic algorithm 1192 to cease iterating.

For each region design combination, the region combination engine 1190 aggregates the specified region designs and optionally performs any number and/or types of additional design and/or optimization operations to generate a corresponding floor design. Some examples of additional design operations include, without limitation, adjusting one or more structural members to comply with any number and/or types of constraints 132 (e.g., restrictions associated with building code).

The region combination engine 1190 can compute the floor objective values in any technically feasible fashion. In some embodiments, the region combination engine 1190 uses the objective function 134 to compute the floor objective value for each floor design. In some other embodiments, the region combination engine 1190 computes the floor objective value for each floor design based on the region objective values of the constituent region designs.

The region combination engine 1190 then performs any number and/or types of ranking and/or filtering operations on the floor designs based on the floor objective values to generate the ranked floor design list 288. For instance, in some embodiments, the region combination engine 1190 sets a variable R equal to the minimum of the number of floor designs and the maximum variation count (denoted as N) that is specified in the parameter data 138. The region combination engine 1190 then generates the ranked floor design list 288 that includes, without limitation, the top R floor objective values and the corresponding floor designs in descending order of degree of convergence with the design objectives as per the floor objective values.

In some embodiments, the grid-based design application 1100 and/or the structural design application 120 transmit any portion of the ranked floor design list 288 to any number of other software applications in any technically feasible fashion. In the same or other embodiments, the grid-based design application 1100 stores any portion of the ranked floor design list 288 in a memory that is accessible to at least one other software application. In some embodiments, the grid-based design application 1100 stores any portion of the ranked floor design list 288 in a memory that is accessible to the structural design application 120.

Advantageously, incorporating any amount (including all) of the functionality described herein in the context of the grid-based design application 1100 into a CAD application can increase the likelihood that the CAD application can generate a structural system for a floor that is convergent with the design objectives. Relative to conventional CAD applications, because the grid-based design application 1100 automatically decomposes the overall design problem into multiple constituent optimization problems, the grid-based design application 1100 can more efficiently and systematically explore the design space of the structural system. In that regard, in some embodiments, the grid-based design application 1100 solves constituent optimization problems to explore and optimize design choices associated with structural grids, spanning directions, sizing of structural members, and combining designs for different regions.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments.

Figure 12:
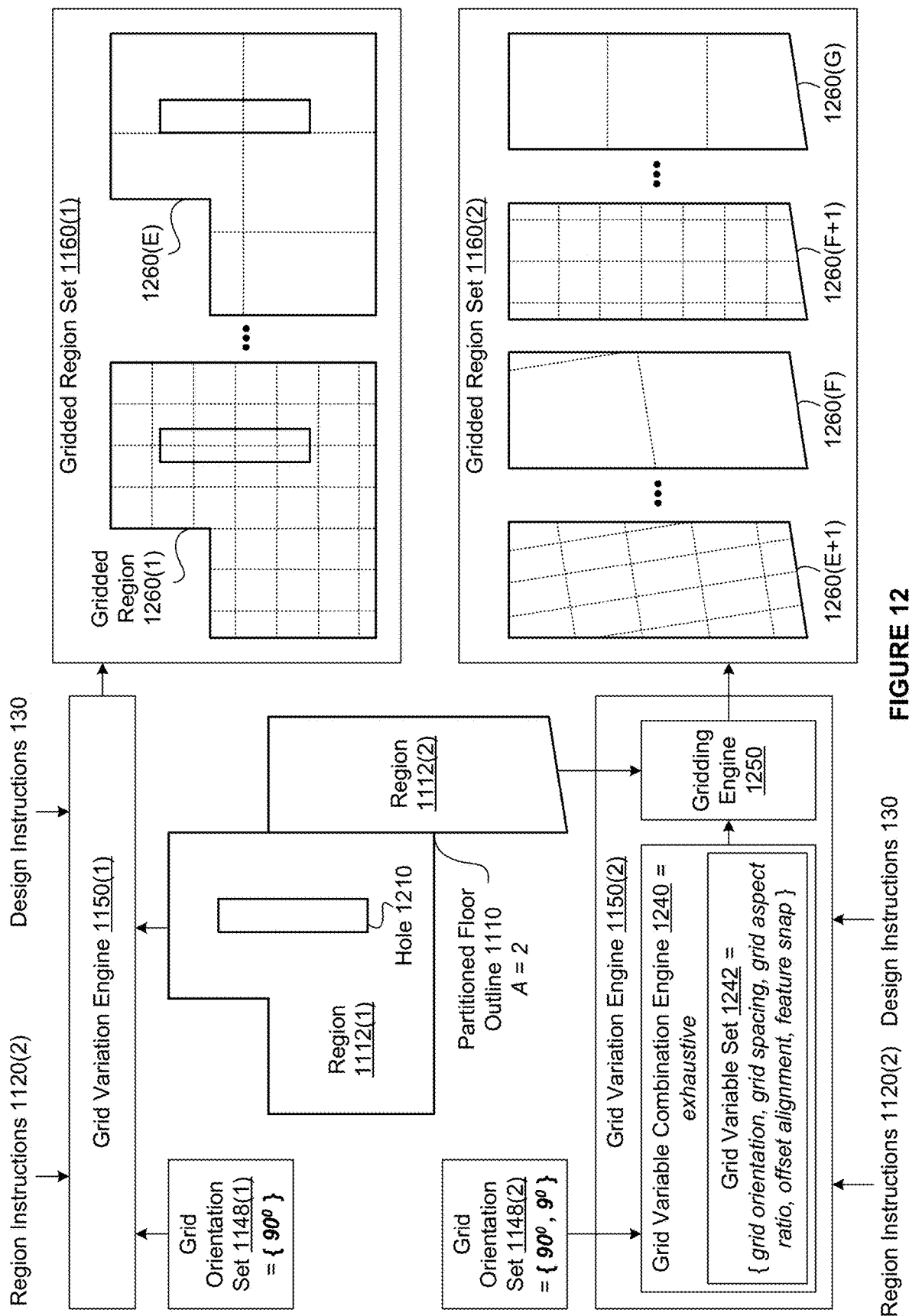
FIG. 12 is a more detailed illustration of the grid variation engines of FIG. 11, according to various embodiments.

FIG. 12 is a more detailed illustration of the grid variation engines 1150 of FIG. 11, according to various embodiments. In some embodiments, including the embodiment depicted in FIG. 12, the partitioned floor outline 1110 includes, without limitation, the regions 1112(1) and 1112(2). In the same or other embodiments, including the embodiment depicted in FIG. 2, the number of grid variation engines 1150 included in the grid-based design application 1100 is equal to the number of regions 1112 included in the partitioned floor outline 1110.

As shown, in some embodiments, the grid variation engine 1150(1) generates the gridded region set 1160(1) based on the region 1112(1), the grid orientation set 1148(1), the region instructions 1120(1), and the design instructions 130. In the same or other embodiments, the grid variation engine 1150(2) generates the gridded region set 1160(2) based on the region 1112(2), the grid orientation set 1148(2), the region instructions 1120(2), and the design instructions 130. The grid variation engines 1150(1) and 1150(2) can generate the gridded region sets 1160(1) and 1160(2), respectively, in any technically feasible fashion. For explanatory purposes only, in the context of FIG. 12, an integer variable x denotes 1 or 2.

As shown for the grid variation engine 1150(2), in some embodiments, each grid variation engine 1150($x$) includes, without limitation, a grid variable combination engine 1240 and a gridding engine 1250. The grid variable combination engine 1240 includes, without limitation, a grid variable set 1242 that specifies any number and/or types of grid variables. Each grid variable is associated with one or more properties of a structural grid. As depicted in italics, in some embodiments, the grid variable set 1242 specifies, without limitation, a grid orientation, a grid spacing, a grid aspect ratio, an offset alignment, and a feature snap. For explanatory purposes only, values for grid spacing are also referred to herein individually as "a grid spacing" and collectively as "grid spacings."

As used herein, "an offset" is a gap that occurs when a structural grid does not precisely align with the architectural features of the region 1112($x$). In some embodiments, the offset alignment indicates the alignment and/or distribution of the offset within the region 1112($x$). In the same or other embodiments, the valid values for the offset alignment include, without limitation, top/left, bottom/right, and equally distributed.

In some embodiments, feature snap is a boolean value that is associated with a "snap distance." When feature snap is true, if a grid line is within the snap distance of an architectural feature, then the gridding engine 1250 included in the grid variation engine 1150($x$) automatically snaps the grid line to the architectural feature and adjusts any other grid lines such that, collectively, the grid lines comply with the grid constraint set 1126($x$). In some embodiments, snapping grid lines to architectural features can result in an actual grid spacing that varies from the grid spacing included in the grid variable set 1242. In the same or other embodiments, the type of variations in grid spacing that the gridding engine 1250 can apply when snapping grid lines to architectural features can vary based on the design concept 1122. For instance, in some embodiments, for floors using timber, steel joists, or precast joists, reductions but not increases in the grid spacing included in the grid variable set 1242 are allowed when snapping grid lines to architecture features. In the same or other embodiments, for in-situ cast concrete floors, both reductions and increases in the grid spacing included in the grid variable set 1242 are allowed when snapping grid lines to architecture features.

In some embodiments, the grid variable combination engine 1240 generates one or more sets of values for the grid variable set 1242 that are viable for the design concept 1122($x$). Each set of values for the grid variable set 1242 that is viable for the design concept 1122($x$) is also referred to herein as "a grid variable combination." The grid variable combination engine 1240 can generate any number of grid variable combinations in any technically feasible fashion.

In some embodiments, to generate grid variable combinations, the grid variable combination engine 1240 selects different combinations of a valid grid orientation, a viable grid spacing/grid aspect ratio value pair, a valid offset alignment, and a valid feature snap. The grid orientations included in the grid orientation set 1148($x$) are the valid grid orientations. The grid variable combination engine 1240 can determine the viable grid spacing/grid aspect ratio value pairs in any technically feasible fashion. For instance, in some embodiments, the grid variable combination engine 1240 determines the viable grid spacing/grid aspect ratio value pairs based on the grid constraint set 1126, the domain knowledge 1124($x$), the design instructions 130, or any combination thereof. In the same or other embodiments, the valid offset alignments and the valid feature snaps are predefined.

The grid variable combination engine 1240 can select any number of combinations of a valid grid orientation, a viable grid spacing/grid aspect ratio value pair, a valid offset alignment, and a valid feature snap in any technically feasible fashion. As depicted in italics, in some embodiments, the grid variable combination engine 1240 exhaustively selects all possible combinations of a valid grid orientation, a viable grid spacing/grid aspect ratio value pair, a valid offset alignment, and a valid feature snap. In some other embodiments, the grid variable combination engine 1240 can execute any number and/or types of genetic algorithms, any number and/or types of harmony search algorithms, any number and/or types of integer optimization algorithms, any number and/or types of other optimization algorithms and/or optimization operations, or any combination thereof to generate any number of grid variable combinations.

As shown, in some embodiments, the gridding engine 1250 generates the gridded region set 1160($x$) based on the region 1112($x$) and the grid variable combinations associated with the region 1112($x$). In some embodiments, the gridding engine 1250 generates a different structural grid (not shown) for each of the grid variable combinations. For each grid variable combination, the gridding engine 1250 can generate a corresponding structural grid based on the region 1112($x$) in any technically feasible fashion.

In some embodiments, for each grid variable combination, the gridding engine 1250 generates a corresponding structural grid based on the boundary of the region 1112($x$) and the values of the grid orientation, the grid spacing, the grid aspect ratio, and the offset alignment specified in the grid variable combination. In the same or other embodiments, if the value of the feature snap specified in the grid variable combination is true, then the gridding engine 1250 determines whether any of the grid lines in the structural grid are within the snap distance of an architectural feature represented by the region 1112($x$). If any of the grid lines are within the snap distance of any architectural feature(s) represented by the region 1112($x$), then the gridding engine 1250 automatically snaps the proximate grid line(s) to the architectural feature(s) and adjusts any other grid lines included in the structural grid such that the structural grid complies with the grid constraint set 1126($x$) (e.g., the maximum spacing). The gridding engine 1250 can perform any number and/or types of alignment operations, spacing operations, any other types of operations, or any combination thereof to the grid lines included in the structural grid to ensure that the structural grid complies with the grid constraint set 1126($x$).

The gridding engine 1250 then applies each structural grid to the region 1112($x$) to generate the gridded region set 1160($x$). Accordingly, in some embodiments, the gridded region set 1160($x$) includes, without limitation, a number of gridded regions 1260 that is equal to the number of grid variable combinations associated with the region 1112($x$). The gridding engine 1250 can apply a given structural grid to the region 1112($x$) in any technically feasible fashion. For instance, in some embodiments, the gridding engine 1250 merges the region 1112($x$) and the structural grid to generate the gridded region 1260($x$) that specifies each shape included in the region 1112($x$) and each grid line included in the structural grid. In the same or other embodiments, the gridding engine 1250 partitions the region 1112(*x*) based on the grid lines included in the structural grid to generate the gridded region 1260(*x*) that includes, without limitation, any number of grid modules (not shown), where each of the grid modules represents a different, non-overlapping portion of the region 1112(*x*).

For explanatory purposes only, FIG. 12 depicts examples of the partitioned floor outline 1110, the region 1112(1), the region 1112(2), the grid orientation set 1148(1). the grid orientation set 1148(2), the gridded region set 1160(1), and the gridded region set 1160(2). In the example depicted in FIG. 12, the partitioned floor outline 1110 includes, without limitation, the region 1112(1) and the region 1112(2). The region 1112(1) has a hole 1210 and each of the boundary edges of the region 1112(1) has a direction of 0 or 90 degrees. Because 0 and 90 degrees are orthogonal, the boundary edges of the region 1112(1) can be represented by the same grid orientation. More specifically, in the example depicted in FIG. 12, the grid orientation set 1148(1) includes, without limitation, the grid orientation of 90 degrees.

In the example depicted in FIG. 12, the grid variation engine 1150(1) generates the gridded region set 1160(1) that includes, without limitation, gridded regions 1260(1)-1260(E), where E can be any integer greater than or equal to 2. Because the only valid value for the grid orientation is 90 degrees and 90 degrees corresponds to a vertical direction, each of the gridded regions 1260(1)-1260(E) is partitioned by zero or more vertical grid lines and zero or more horizontal grid lines. As depicted, the values of the grid spacing, grid aspect ratio, offset alignment, and feature snap can vary across the gridded regions 1260(1)-1260(E).

As described previously herein, in some embodiments, each of the gridded regions 1260(1)-1260(E) represents the region 1112(1) as a different collection of grid modules. As referred to herein, the "grid modules" of gridded region 1260 are the discrete portions of the gridded region 1260 that are delineated by the grid lines included in the gridded region 1260 and the boundary edges of the gridded region 1260. Any number of the grid modules can be partially cut (e.g., by boundary edges of the region 1112(1), hole 1210, etc.). In the example depicted in FIG. 12, the gridded region 1260(1) includes, without limitation, 43 grid modules. By contrast, the gridded region 1260(2) includes, without limitation, 6 grid modules. As illustrated by the gridded regions 1260(1) and 1260(2), the size and shape of the grid modules can vary within and across gridded regions 1260.

In the example depicted in FIG. 12, each of the boundary edges of the region 1112(2) has a direction of 0, 90, or 9 degrees. Because 0 and 90 degrees are orthogonal, the 0-degree boundary edge and the 90-degree boundary edges can be represented by the same grid orientation. The 9-degree boundary edge can be represented by a different grid orientation. In the example depicted in FIG. 12, the grid orientation set 1148(2) includes, without limitation, the grid orientation of 90 degrees and the grid orientation of 9 degrees.

In the example depicted in FIG. 12, the grid variation engine 1150(2) generates the gridded region set 1160(2) that includes, without limitation, gridded regions 1260(E+1)-1260(F) and gridded regions 1260(F+1)-1260(G), where F can be any integer greater than or equal to (E+2) and G can be any integer greater than or equal to (F+2). For explanatory purposes, each of the gridded regions 1260(E+1)-1260(F) corresponds to the grid orientation of 9 degrees and is therefore partitioned by zero or more grid lines having a direction of 9 degrees and zero or more grid lines having a direction of 99 degrees. As depicted, the values of the grid spacing, grid aspect ratio, offset alignment, and feature snap can vary across the gridded regions 1260(E+1)-1260(F). Also for explanatory purposes, each of the gridded regions 1260(F+1)-1260(G) corresponds to the grid orientation of 90 degrees and is therefore partitioned by zero or more vertical grid lines and zero or more horizontal grid lines. As depicted, the values of the grid spacing, grid aspect ratio, offset alignment, and feature snap can vary across the gridded regions 1260(F+1)-1260(G).

Each of the gridded regions 1260(E+1)-1260(G) represents the region 1112(2) as a different collection of grid modules. In the example depicted in FIG. 12, the gridded region 1260(E+1) includes, without limitation, 22 grid modules. The gridded region 1260(F) includes, without limitation, 3 grid modules. The gridded region 1260(F+1) includes, without limitation, 28 grid modules. The gridded region 1260(G) includes, without limitation, 3 grid modules.

The descriptions of the various embodiments have been presented for purposes of illustration but are not intended to be exhaustive or limited to the embodiments disclosed. In particular, as described previously herein in conjunction with FIG. 11, in some embodiments, the partitioned floor outline 1110 can include any number of regions 1112, the grid-based floor application 1100 can include any number of grid variation engines 1150, and the number of regions 1112 can be the same as or different from the number of grid variation engines 1150. Furthermore, in some embodiments, the grid variable set 1242 can include any number and/or types of variables that are relevant to generating structural grids.

As previously noted, for explanatory purposes only, FIG. 12 depicts an example of partitioned floor outline 1110 and associated examples of regions 1112, grid orientation sets 1148, gridded region sets 1160, and gridded regions 1260. In some other embodiments, the partitioned floor outline 1110 can be associated with any number of regions 1112, any number of grid orientation sets 1148 and any number of gridded region sets 1160. Furthermore, each grid orientation set 1148 can include any number of grid orientations, and each gridded region set 1160 can include any number of gridded regions 1260.

Figure 13:
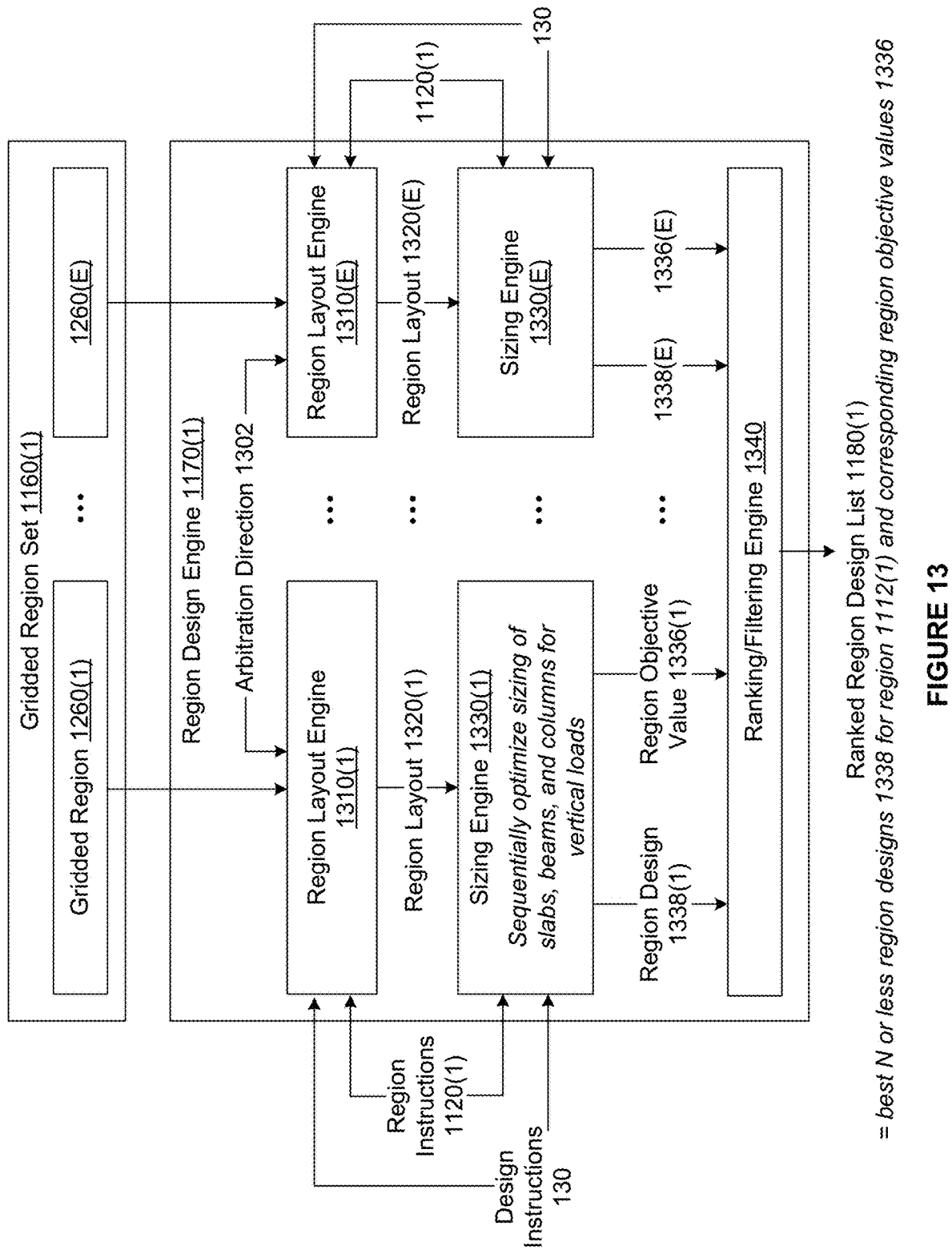
FIG. 13 is a more detailed illustration of one of the region design engines of FIG. 11, according to various embodiments.

FIG. 13 is a more detailed illustration of one of the region design engines 1170 of FIG. 11, according to various embodiments. More precisely, FIG. 13 depicts the region design engine 1170(1) that generates the ranked region design list 1180(1) based on the gridded region set 1160(1), the design instructions 130, and the region instructions 1120(1).

As described previously herein in conjunction with FIG. 12, in some embodiments, the gridded region set 1160(1) includes, without limitation, gridded regions 1260(1)-1260(E), where E can be any positive integer. In the same or other embodiments, the gridded regions 1260(1)-1260(E) are versions of the region 1112(1) that are partitioned based on different structural grids. In some embodiments, the grid orientation can vary across the structural grids.

As shown, in some embodiments, the region design engine 1170(1) includes, without limitation, region layout engines 1310(1)-1310(E), region layouts 1320(1)-1320(E), sizing engines 1330(1)-1330(E), region designs 1338(1)-1338(E), region objective values 1336(1)-1336(E), ranking/filtering engine 1340, and an arbitration direction 1302. In some other embodiments, the arbitration direction 1302 can be omitted from the region design engine 1170(1).

In some embodiments, the region layout engines 1310(1)-1310(E) generate the region layouts 1320(1)-1320(E)

based on the gridded regions 1260(1)-1260(E), respectively, the design instructions 130, the region instructions 1120(1), and the arbitration direction 1302. In the same or other embodiments, the sizing engines 1330(1)-1330(E) generate the region designs 1338(1)-1338(E), respectively, and the region objective values 1336(1)-1336(E), respectively, based on the region layouts 1320(1)-1320(E), respectively, the design instructions 130, and the region instructions 1120(1).

The region layout engines 1310(1)-1310(E) are different instances of a single software application referred to herein as "the region layout engine 1310" and are also referred to herein individually as "the region layout engine 1310" and collectively as "the region layout engine 1310." The sizing engines 1330(1)-1330(E) are different instances of a single software application referred to herein as "the sizing engine 1330" and are also referred to herein individually as "the sizing engine 1330" and collectively as "the sizing engines 1330."

In some embodiments, the number of instances of the region layout engine 1310 and/or the sizing engine 1330 can differ from the number of gridded regions 1260 included in the gridded region set 1160(1), and the techniques described herein are modified accordingly. The instances of the region layout engine 1310 can execute sequentially, concurrently, or in any combination thereof. The instances of the sizing engine 1330 can execute sequentially, concurrently, or in any combination thereof.

As described in greater detail below, in some embodiments, the arbitration direction 1302 specifies one or more spanning direction preferences in any technically feasible fashion. For instance, in some embodiments, the arbitration direction 1302 specifies 90 degrees and is associated with a "spanning direction" rule that determines a spanning direction for a slab with respect to structural elements that can provide secondary support. For explanatory purposes, as used herein, a "structural element" describes a component that can potentially be used in a structural system. By contrast, a "structural member" is a specific component that is included in a structural system. An example of a spanning direction rule is that if a slab has two spanning lengths that are within an arbitration range (e.g., 10%) of one another, then the spanning direction closest (in angle) to the arbitration direction 1302 is to be selected as the spanning direction for the slab with respect to joists.

Referring back now to FIG. 11, in some embodiments, the region design engines 1170(1)-1170(A) implement the same preferences for the arbitration direction 1302. As a result, the arbitration direction 1302 can increase the uniformity of spanning directions across the floor designs and therefore the uniformity of each floor design that is included in the ranked floor design list 288.

For explanatory purposes only, in the context of FIG. 13, a variable x denotes any integer from 1 through E, inclusive. In some embodiments, any instance of region layout engine 1310 can generate the region layout 1320(x) in any technically feasible fashion based on the gridded region 1260(x) and any amount (including none) and/or types of additional data. In the same or other embodiments, any instance of the sizing engine 1330 can generate the region design 1338(x) and optionally the region objective value 1336(x) in any technically feasible fashion based on the region layout 1320(x) and any amount (including none) and/or types of additional data.

As shown for the region layout engine 1310(1), in some embodiments, the region layout engine 1310(x) generates the region layout 1320(x) based on the gridded region 1260(x), the arbitration direction 1302, any portion (including none) of the design instructions 130, and any portion (including none) of the region instructions 1120(x). The region layout 1320(x) specifies a layout for a structural system for the region 1112(1). In some embodiments, the region layout 1320(x) specifies, without limitation, locations, types, materials, and optionally initial sizing for any number of structural members.

In some embodiments, the region layout engine 1310(x) determines that each grid module included in the gridded region 1260(x) represents a different slab in a structural system specified by the region layout 1320(x). For explanatory purposes only, in the context of FIGS. 11-17, the term "slab" can refer to, without limitation, an individual slab, a slab panel, or a portion of a slab, where the portion lies between two primary structural members (e.g., two beams). Notably, each of the grid modules is bounded by one to four (inclusive) grid lines and zero or more boundary edges of the gridded region 1260(x).

Accordingly, irrespective of the shape of a given grid module, the shape of a slab represented by the grid module can be represented using the poly-quad data structure described previously herein. In some embodiments, the region layout engine 1310(x) uses the poly-quad data structure to represent the locations of arbitrarily shaped structural members in the region layout 1320(x). In some other embodiments, the region layout engine 1310(x) can represent the locations of structural members in the region layout 1320(x) in any technically feasible fashion.

The region layout engine 1310(x) can determine the material and type of each slab in any technically feasible fashion. For instance, in some embodiments, the region layout engine 1310(x) determines the material of each slab based on the design concept 1122(x). In the same or other embodiments, to determine the type of each slab the region layout engine 1310(x) computes spanning lengths for the slabs with respect to the grid lines. As described previously herein, each grid line included in the gridded region 1260(x) has one of two orthogonal directions. For a given slab, if the slab has only one bounding grid line or all the bounding grid line(s) share the same direction, then the region layout engine 1310(x) computes one spanning length for the spanning direction that is orthogonal to the bounding grid lines. Otherwise, the region layout engine 1310(x) computes two spanning lengths for the two spanning directions orthogonal to the two directions of the bounding grid lines.

In some embodiments, the region layout engine 1310(x) determines the type for each slab based on the spanning length(s) associated with the slab, any amount (including none) of the region instructions 1120(x), and any amount (including none) of the design instructions 130. For instance, in some embodiments, the region instructions 1120(x) and/or the design instructions 130 include, without limitation, one or more knowledge-based rules that can be used to determine the slab spanning type (e.g., one-way spanning, two-way spanning, cantilever, etc.) for slabs associated with the design concept 1122(x). In some such embodiments, the region layout engine 1310(x) uses the relevant knowledge-based rule(s) to determine the slab spanning type for each slab based on the associated spanning length(s).

In some embodiments, if the region layout engine 1310(x) computes two spanning lengths for a given one way spanning slab, then the region layout engine 1310(x) selects one of the corresponding spanning directions as the spanning direction for the slab based, at least in part, on the spanning lengths. More specifically, the region layout engine 1310(x) analyzes the spanning lengths in conjunction with any amount (including none) of the region instructions $1120(x)$, any amount (including none) of the design instructions 130, the arbitration direction 1302, or any combination thereof to determine the spanning direction for the slab.

In some embodiments, if a spanning direction rule associated with the arbitration direction 1302 does not apply to a given one way spanning slab, then the region layout engine $1310(x)$ determines the spanning direction of the slab based on a default spanning direction rule for the corresponding type of the slab. For instance, in some embodiments, a default spanning direction rule is to set the spanning direction for a one way spanning slab without joists equal to the direction corresponding to the shorter spanning length associated with the slab. In the same or other embodiments, a default spanning direction rule is to set the spanning direction for a one way spanning slabs supported on joists equal to the direction corresponding to the longer spanning length associated with the slab, thereby causing the joists to span in the direction corresponding to the shorter spanning length.

The region layout engine $1310(x)$ can determine the locations, types, and materials of any number of other structural members in any technically feasible fashion. For instance, in some embodiments, the region layout engine $1310(x)$ determines the locations of beams and columns based on the grid lines and any amount and/or types of constraints specified in the region instructions $1120(x)$ and/or the design instructions 130. In the same or other embodiments, if the design concept $1122(x)$ indicates that the structural system for the region $1112(x)$ is to include joists, then the region layout engine $1310(x)$ determines the locations of the joists based on the spanning directions with respect to joists and the associated spanning lengths. After determining the locations, types, and materials for any number of structural members based on gridded region $1260(x)$, the region layout engine $1310(x)$ generates the region layout $1320(x)$.

In some embodiments, the sizing engine $1330(x)$ generates the region design $1338(x)$ and optionally the region objective value $1336(x)$ based on the region layout $1320(x)$, any portion (including none) of the design instructions 130, and any portion (including none) of the region instructions $1120(x)$. The region design $1338(x)$ specifies a structural system that enables the region $1112(x)$ to resist vertical loads. In some embodiments, the region design $1338(x)$ specifies, without limitation, locations, types, materials, and sizing for the structural members specified in the region layout $1320(x)$. In the same or other embodiments, the region objective value $1336(x)$ quantifies a degree of convergence of the region design $1338(x)$ with the design objectives.

The sizing engine $1330(x)$ can generate the region design $1338(x)$ and optionally compute the region objective value $1336(x)$ in any technically feasible fashion. In some embodiments, the sizing engine $1330(x)$ generates an initial region design (not shown) that specifies, without limitation, locations, types, materials, and initial sizing for the structural members specified in the region layout $1320(x)$. The sizing engine $1330(x)$ can determine the initial sizing for the structural members in any technically feasible fashion. For instance, in some embodiments, the sizing engine $1330(x)$ determines the initialize sizing based on any number and/or type of defaults.

In some embodiments, the sizing engine $1330(x)$ performs any number and/or types of optimization operations on the initial sizing for the structural members based on the constraints 132 and the objective function 134 without taking lateral loads into account to generate the region design $1338(x)$ and the region objective value $1336(x)$. The region design engine $1170(x)$ can optimize the sizing of the structural members specified in the initial region design in any technically feasible fashion to generate the region design $1338(x)$. In some embodiments, the sizing engine $1330(x)$ can implement any number of optimization techniques that are the same as or similar to optimization techniques implemented by the gravity design optimizer 260 in various embodiments. The gravity design optimizer 260 was described in detail previously herein in conjunction with FIG. 3.

As depicted in italics, in some embodiments, the sizing engine $1330(x)$ sequentially optimizes the sizing of the slabs, the beams, and the columns included in the initial region design based on the constraints 132 and the objective function 134 while taking into account vertical loads to generate the region design $1338(x)$. In some embodiments, the sizing engine $1330(x)$ uses the objective function 134 to compute the region objective value $1336(x)$ for the region design $1338(x)$. In the same or other embodiments, the sizing engine $1330(x)$ uses the objective function 134 to compute objective values for any number of partially optimized versions of the initial region design while optimizing the sizing of the structural members.

As shown, in some embodiments, the ranking/filtering engine 1340 generates the ranked region design list 1180(1) based on the region designs 1338(1)-1338(E) and the region objective values 1336(1)-1336(E). As described previously herein, each of the region designs 1338(1)-1338(E) is a different design for a structural system that enables the region 1112(1) to resist vertical loads. In some embodiments, the region objective values 1336(1)-1336(E) quantify degrees of convergence of the region designs 1338(1)-1338(E), respectively, with the design objectives.

The ranking/filtering engine 1340 can perform any number and/or types of ranking operations, any number and/or types of filtering operations, any number and/or types of other operations, or any combination thereof on the region designs 1338(1)-1338(E) based on the region objective values 1336(1)-1336(E) to generate the ranked region design list 1180(1). For instance, in some embodiments, the ranking/filtering engine 1340 sets a variable R equal to the minimum of the number of region designs 1338 and the maximum variation count (denoted as N) that is specified in the parameter data 138. The ranking/filtering engine 1340 ranks and optionally filters the region designs 1338(1)-1338(E) based on the region objective values 1336(1)-1336(E). The ranking/filtering engine 1340 then generates the ranked region design list 1180(1) that includes, without limitation, the R best of the region designs 1338 in order of descending convergence with the design criteria as per the region objective values 1336 and the corresponding R of the region objective values 1336.

Figure 14:
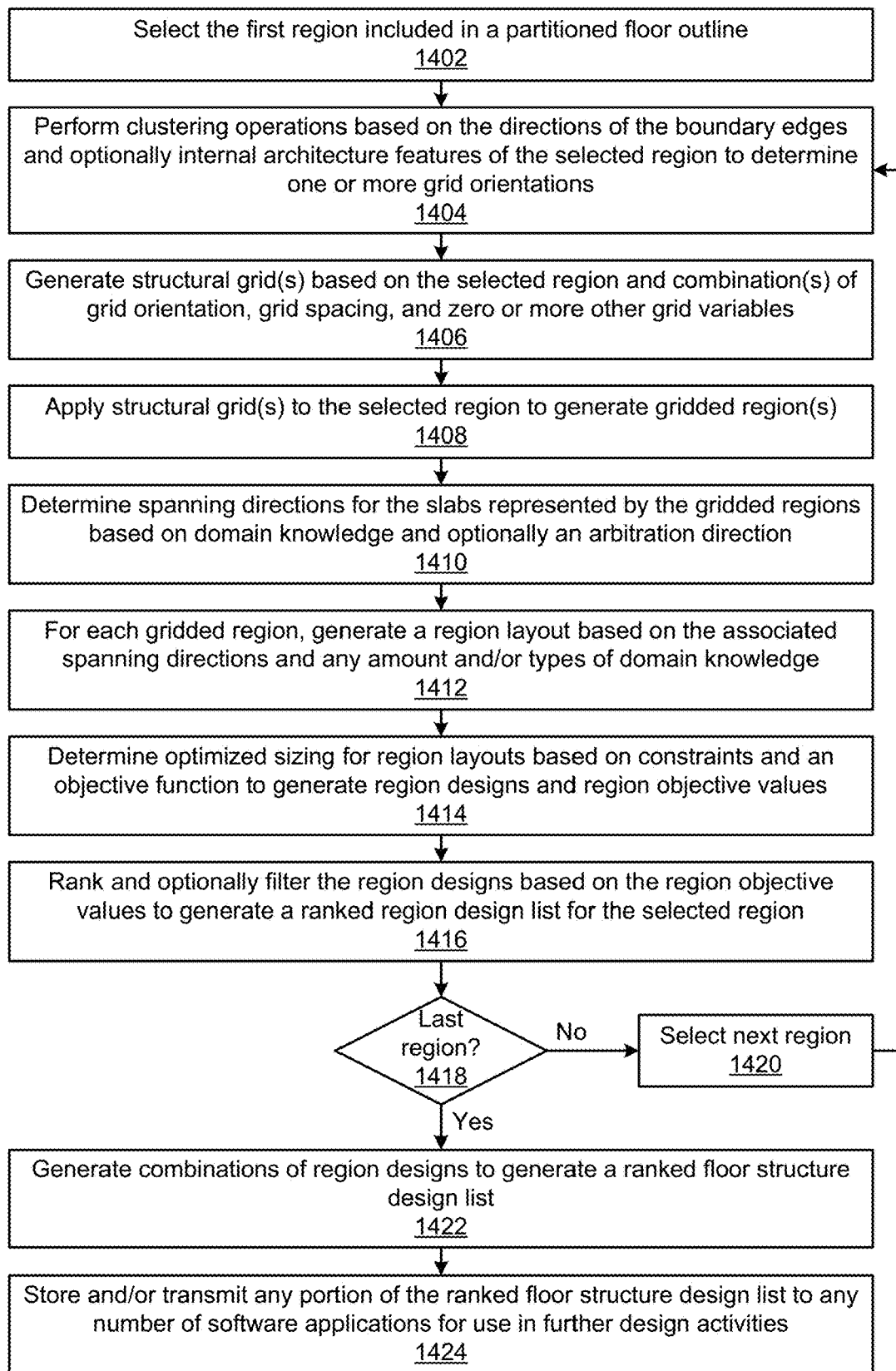
FIG. 14 is a flow diagram of method steps for generating structural system designs for an arbitrarily shaped floor within a building, according to various embodiments.

FIG. 14 is a flow diagram of method steps for generating structural system designs for an arbitrarily shaped floor within a building, according to various embodiments. Although the method steps are described with reference to the systems of FIGS. 1-6 and 11-13, persons skilled in the art will understand that any system configured to implement the method steps, in any order, falls within the scope of the present invention.

As shown, a method 1400 begins a step 1402, where the grid-based design application 1100 selects the region 1112(1) included in the partitioned floor outline 1110. At step 1404, the edge clustering engine 1140 performs any number and/or types of clustering operations based on the directions of the boundary edges and optionally the internal architectural features (e.g., floor openings, partition walls, etc.) of the selected region to determine one or more grid orientations.

At step 1406, the grid variation engine 1150 generates one or more structural grids based on the selected region and one or more combinations of grid orientation, grid spacing, and zero or more other grid variables. At step 1408, the grid variation engine applies the one or more structural grids to the selected region to generate one or more of gridded regions 1260. At step 1410, the region layout engine 1310 determines spanning directions for the slabs represented by the gridded regions 1260 based on any amount and/or types of domain knowledge and optionally the arbitration direction 1302. At step 1412, for each gridded region 1260, the region layout engine 1310 generates the region layout 1320 for the gridded region 1260 based on associated spanning direction and any amount and/or types of domain knowledge.

At step 1414, the sizing engine 1330 determines optimized sizing for the region layouts 1320 based on the constraints 132 and the objective function 134 to generate the region designs 1338 and the region objective values 1336. At step 1416, the ranking/filtering engine 1340 ranks and optionally filters the region designs 1338 based on the region objective values 1336 to generate the ranked region design list 1180 for the selected region. At step 1418, the edge clustering engine 1140 performs any number and/or types of clustering operations based on the directions of the boundary edges of the selected region to determine one or more grid orientations.

At step 1418, the grid-based design application 1100 determines whether the selected region is the last of the regions 1112. If, at step 1418, the grid-based design application 1100 determines that the selected region is not the last of the region 1112, then the method 1400 proceeds to step 1420. At step 1420, the grid-based design application 1100 selects the next of the regions 1112, and the method 1400 returns to step 1404, where the edge clustering engine 1140 determine one or more grid orientations for the selected region.

If, however, at step 1418, the grid-based design application 1100 determines that the selected region is the last of the regions 1112, then the method 1400 proceeds directly to step 1422. At step 1422, the region combination engine 1190 generates combinations of the region designs 1338 to generate the ranked floor design list 288.

At step 1424, the grid-based design application 1100 stores and/or transmit any portion of the ranked floor design list 288 to any number of software applications for use in further design activities, The method 1400 then terminates.

For explanatory purposes only, the method steps of the method 1400 are depicted and described as occurring sequentially. However, as persons skilled in the art will recognize, the steps 1404-1420 can be performed sequentially, concurrently, or in any combination thereof for each of the regions 1112.

Designing Floor Structures Based on Room Plans

Referring back now to FIG. 1, in some embodiments, the structural design application 120 of FIG. 1 may include, without limitation, a room-based design application 1500 instead of or in addition to the gravity design application 140 and/or the grid-based design application 1100. In some other embodiments, the room-based design application 1500 can be incorporated into any type of software application (e.g., a CAD application). In yet other embodiments, the room-based design application 1500 can execute as a stand-alone software application.

As described in greater detail below in conjunction with FIGS. 15-17, in some embodiments, the room-based design application 1500 automatically generates, without limitation, any number of CAD designs for a floor structure while taking into account any number of walls. CAD designs for a floor structure are also referred to herein as "floor structure designs" and "structural system designs for a floor." As described previously herein in conjunction with FIG. 2, a floor structure is a portion of a structural system corresponding to a floor of a building. Importantly, each floor structure design can incorporate zero or more walls of the specified rooms as load bearing walls.

Figure 15:
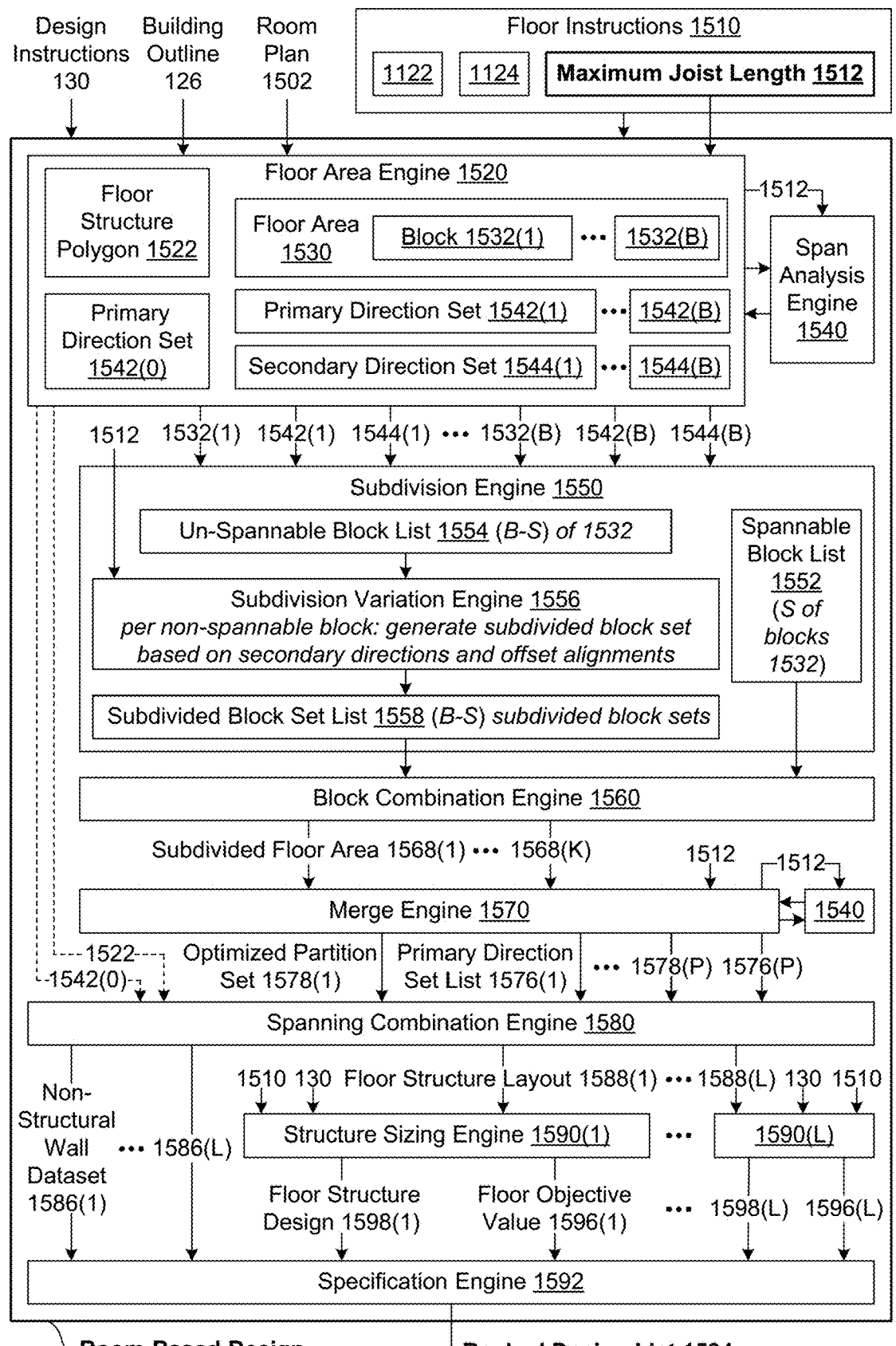
FIG. 15 is a more detailed illustration of the room-based design application of FIG. 1, according to various embodiments.

FIG. 15 is an illustration of the room-based design application 1500 of FIG. 1, according to various embodiments. Referring back to FIG. 1, in some embodiments, the room-based design application 1500 may reside in the memory 116 of the compute instance 110 and executes on the processor 112 of the compute instance 110. As shown, in some embodiments, the room-based design application 1500 generates a ranked design list 1594 based on the building outline 126, the design instructions 130, a room plan 1502, and floor instructions 1510.

As described previously herein in conjunction with FIG. 1, the building outline 126 is an outline of any type of building having any number of floors. In some embodiments, the building is a one-story residential house. In some other embodiments, the building can be any type of residential house. In yet other embodiments, the building can be any type of office building. The design instructions 130 include, without limitation, the constraints 132, the objective function 134, the design variable data 136, and the parameter data 138 associated with the building.

The room plan 1502 specifies, without limitation, any number of walls that define, without limitation, any number of rooms included in a floor of the building corresponding to the building outline 126. As shown, in some embodiments, the floor instructions 1510 include, without limitation, design concept 1122, domain knowledge 1124, and a maximum joist length 1512. In the same or other embodiments, any number and/or types of floor instructions 1510 can override any number and/or types of design instructions 130.

As described previously herein in conjunction with FIG. 11, the design concept 1122 specifies, without limitation, any amount and/or type of data that defines properties of the structural system that is to be designed for the floor of the building. One example of design concept 1122 is an oriented strand board floor structure with rectangular Glulam timber or softwood lumber sections. The domain knowledge 1124 can include, without limitation, any amount and/or types of knowledge that is relevant to designing and analyzing floor structures, such as checking the vibration of a timber floor.

The maximum joist length 1512 specifies the maximum length of joists that are available for use in the floor structure. In some embodiments, the maximum joist length 1512 reflects the design concept 1122 and/or the domain knowledge 1124. As described in greater detail below, in some embodiments the maximum joist length 1512 is a governing design criterion with respect to subdividing and merging discrete portions of a floor area 1530. In some other embodiments, any number and/or types of design criteria can be used as a governing design criterion instead of or in addition to the maximum joist length 1512.

In some embodiments, the ranked design list 1594 includes, without limitation, a subset of floor structure designs 1598(1)-1598(L), a corresponding subset of floor objective values 1596(1)-1596(L), and a corresponding subset of non-structural wall datasets 1586(1)-1586(L), where L can be any positive integer. For explanatory purposes only, the floor structure designs 1598(1)-1598(L) are also referred to individually as "the floor structure design 1598" and collectively as "the floor structure designs 1598." The floor objective values 1596(1)-1596(L) are also referred to herein individually as "the floor objective value 1596" and collectively as the floor objective values 1596." The non-structural wall datasets 1586(1)-1586(L) are also referred to herein individually as "non-structural wall dataset 1586" and collectively as the "non-structural wall datasets 1596."

Each of the floor structure designs 1598 is a different design of the floor structure that enables the floor associated with the room plan 1502 to resist vertical loads (e.g., gravity). In some embodiments, each of the floor structure designs 1598 specifies, without limitation, locations, types, materials, and sizing for any number and/or types of structural members included in the floor structure. In the same or other embodiments, the structural members include, without limitation, any number and/or types of horizontal structural members associated with the corresponding floor, and any number and/or types of vertical structural members that are designed as part of the floor structure. In the same or other embodiments, the vertical structural members that are designed as part of a given floor structure include, without limitation, any number and/or type of vertical members that extend down from the floor to an immediately lower floor (if one exists) or a foundation.

In some embodiments, the horizontal structural members include, without limitation, slabs, beams, and joists. In the same or other embodiments, the vertical structural members include, without limitation, columns and load bearing walls. Notably, each of the floor structure designs 1598(1)-1598(L) can incorporate zero or more of the walls defined in the room plan 1502 as load bearing walls.

In some embodiments, the building outline 126 can represent an arbitrarily shaped building, the room plan 1502 can represent an arbitrarily shaped floor, the room plan 1502 can specify any number of arbitrarily shaped rooms with zero or more openings or holes, or any combination thereof. In the same or other embodiments, the room-based design application 1500 can generate the floor structure designs 1598(1)-1598(L) having any number and/or types of arbitrary shapes and/or based on any number and/or types of arbitrary shapes in any technically feasible fashion. In some embodiments, the room-based design application 1500 generates and represents the floor structure designs 1598(1)-1598(L) using the poly-quad data structure described previously herein in conjunction with the grid-based design application 1100.

The floor objective values 1596(1)-1596(L) are values of the objective function 134 for the floor structure designs 1598(1)-1598(L), respectively. In some embodiments, the floor objective values 1596(1)-1596(L) correlate to a degree of convergence between the floor structure designs 1598(1)-1598(L), respectively, and the design objectives. In some embodiments, the room-based design application 1500 ranks and optionally filters the floor structure designs 1598, the floor objective values 1596, and the non-structural wall datasets 1586 based on the objective values 1596 to generate the ranked design list 1594.

The non-structural wall datasets 1586(1)-1586(L) specify, without limitation, any walls specified in the room plan 1502 that are not specified in the floor structure designs 1598(1)-1598(L), respectively. Accordingly, the non-structural wall datasets 1586(1)-1586(L) specify, without limitation, the non-load bearing walls for the floor structure designs 1598(1)-1598(L), respectively. The non-structural wall datasets 1586 can specify any amount (including none) and/or types of additional data associated with the non-load bearing walls. For instance, in some embodiments, the non-structural wall datasets 1586 can specify locations, materials, sub-types, or any combination thereof for non-load bearing walls.

In some embodiments, the room-based design application 1500 generates the floor structure designs 1598 and optionally generates floor objective values 1596, non-structural wall datasets 1586, ranked design list 1594, or any combination thereof. In the same or other embodiments, the room-based design application 1500 can rank and/or filter the floor structure designs 1598(1)-1598(L) based on any number and/or types of criteria in any technically feasible fashion.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments.

Figure 16A:
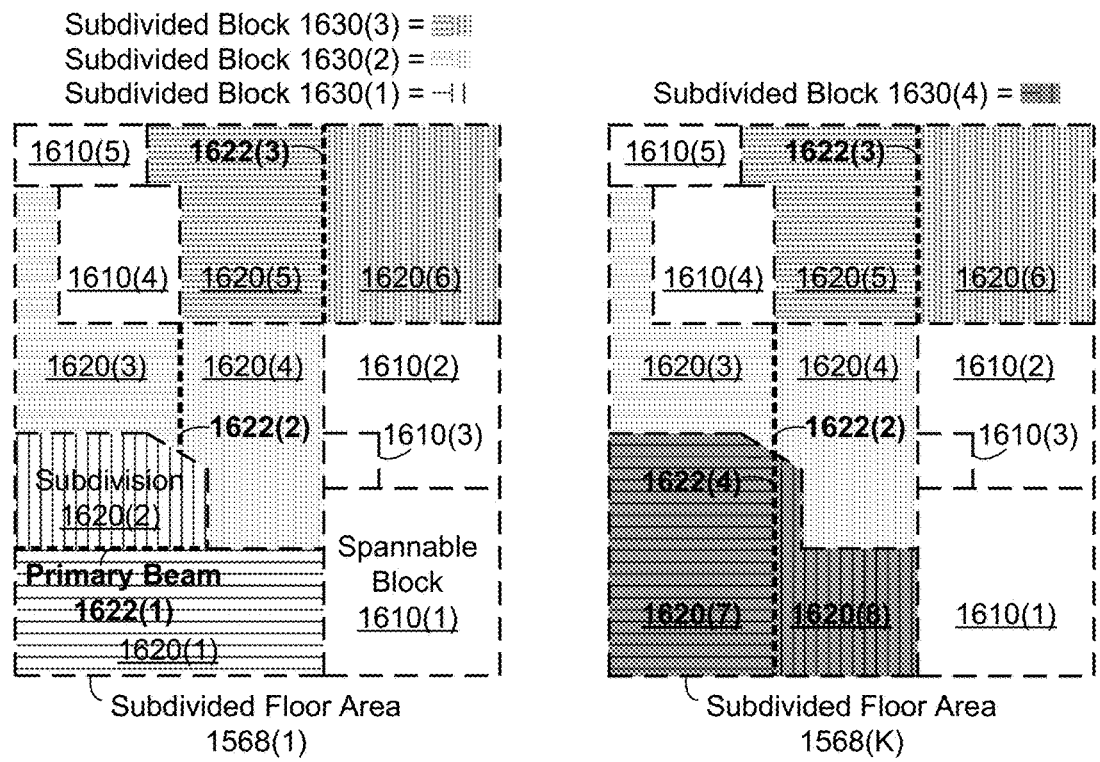
FIG. 16A is an exemplar illustration of two of the subdivided floor areas of FIG. 15, according to various embodiments.
Figure 16B:
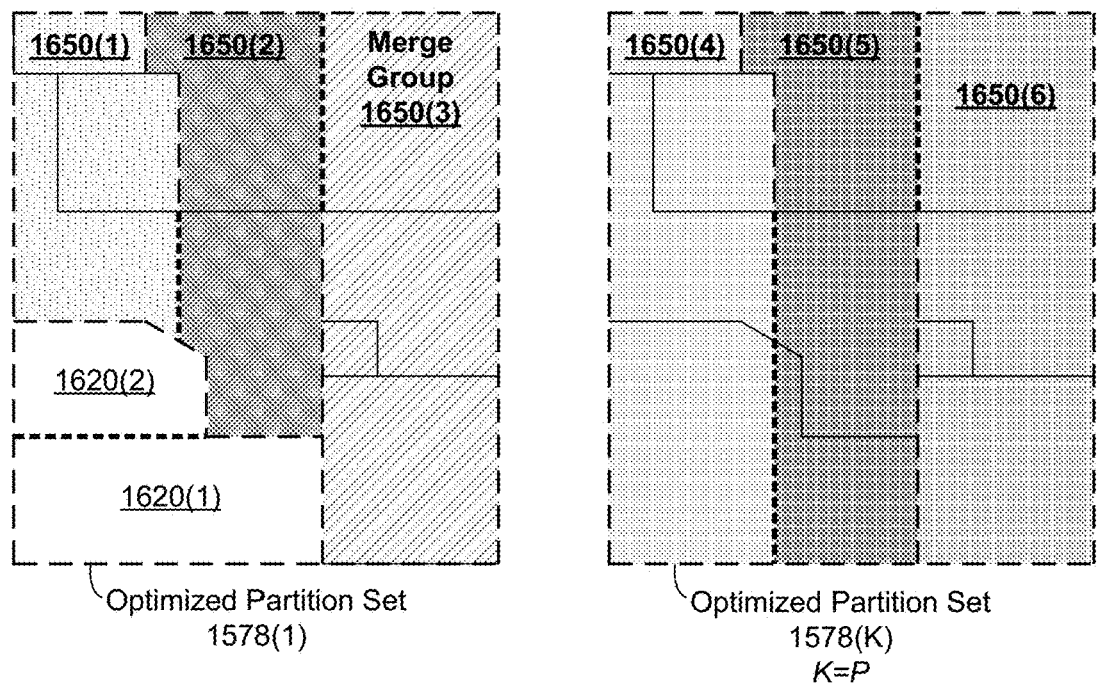
FIG. 16B is an exemplar illustration of two of the optimized partition sets of FIG. 15, according to various embodiments.
Figure 17:
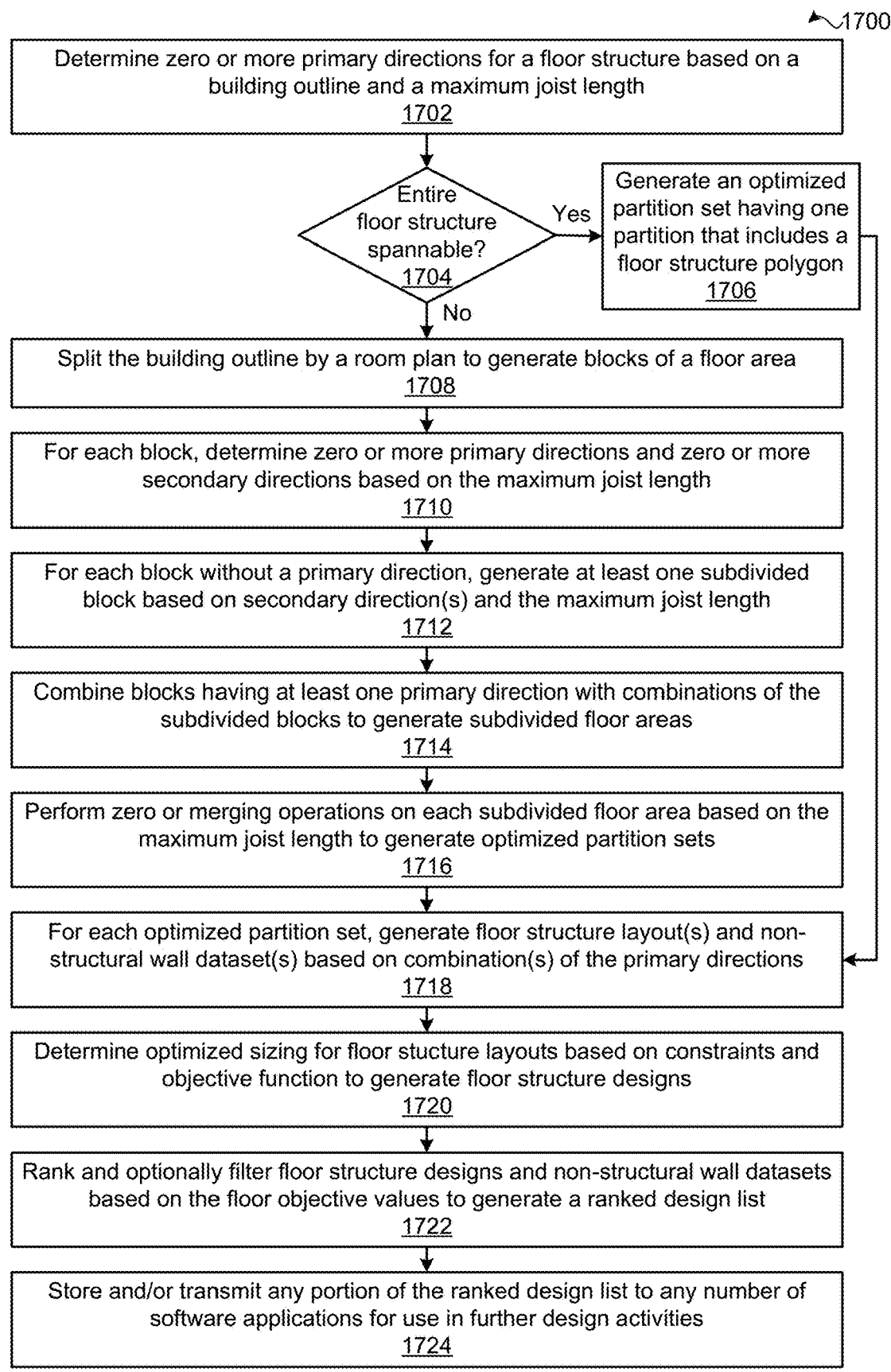
FIG. 17 is a flow diagram of method steps for generating floor structure designs for a building based on a room plan, according to various embodiments.

For explanatory purposes only, the functionality of the room-based design application 1500 is described in conjunction with FIGS. 15-17 in the context of generating any number of floor structure designs 1598 that include, without limitation, load bearing walls and joists based, at least in part, the maximum joist length 1512. Floor structures that include load bearing walls and joists, such as timber floor structures, are often used in residential buildings.

As persons skilled in the art will recognize, in some other embodiments, the techniques described herein can be modified to generate any types of floor structure designs 1598 that are supported on joists using any types of structural members and excluding any other types of structural members. In the same or other embodiments, the techniques described herein can be modified to generate floor structure designs 1598 based on any type of "governing design criterion" instead of or in addition to the maximum joist length 1512.

As shown, in some embodiments, the room-based design application 1500 includes, without limitation, a floor area engine 1520, a span analysis engine 1540, a subdivision engine 1550, a block combination engine 1560, a merge engine 1570, a spanning combination engine 1580, structure sizing engines 1590(1)-1590(L), and a specification engine 1592.

In some embodiments, the room-based design application 1500 decomposes an overall design optimization problem of optimizing the design of a floor structure that can incorporate any number of the walls defined by the room plan 1502 into simpler optimization problems. As described in greater detail below, in some embodiments, the simpler optimization problems involve subdividing portions of the floor structure that are un-spannable, combining different subdivision options, merging spannable portions of the floor structure into larger spannable portions of the floor structure, combining different spanning direction options, and optimizing the sizing of structural members.

In some embodiments, if a given object can be spanned by a joist in at least one direction, then the object and any representations of the object are referred to herein as "spannable," Otherwise, the object and any representations of the object are referred to herein as "un-spannable." In some embodiments, if the maximum extent (e.g., length, width, etc.) of the object in a given direction is less than or equal to the maximum joist length 1512, then the object can be spanned by joist in the direction. Otherwise, the object cannot be spanned by joist in the direction. For a given object, a direction along which the object can be spanned by joist is also referred to herein as a "spanning direction" for the object and any representations of the object.

In some other embodiments, the joist can be replaced by any type of structural element that can provide secondary support in any technically feasible fashion. In such embodiments, if a given object can be spanned by the structural element in at least one direction, then the object and any representations of the object are referred to herein as "spannable," Otherwise, the object and any representations of the object are referred to herein as "un-spannable." In some embodiments, the maximum joist length 1512 can be replaced by a maximum length of any type of structural element that can provide secondary support. In some embodiments, if the maximum extent (e.g., length, width, etc.) of a given object in a given direction is less than or equal to a maximum length of a structural element that can provide secondary support, then the object can be spanned by the structural element in the direction.

In some embodiments, the floor area engine 1520 represents the entire floor structure as a floor structure polygon 1522. Importantly, if the entire floor structure is spannable, then the floor structure polygon 1522 is an optimized solution for the optimization problems of subdividing the floor structure, combining different subdivision options, and merging portions of the floor structure into larger spannable portions of the floor structure. The floor area engine 1520 can determine whether the entire floor structure is spannable in any technically feasible fashion. As shown, in some embodiments, the floor area engine 1520 uses the span analysis engine 1540 to determine whether the floor structure is spannable.

For explanatory purposes only, FIG. 15 depicts a single instance of the span analysis engine 1540 that independently analyzes each of any number of input polygons based on an input maximum span (e.g., the maximum joist length 1512). In some embodiments, each input polygon represents an arbitrary shape of a different object (e.g., the shape of a room). The span analysis engine 1540 can analyze the input polygons sequentially, concurrently, or in any combination thereof in any technically feasible fashion. In some other embodiments, any software program (e.g., the room-based design application 1500, the floor area engine 1520, the merge engine 1570, etc.) can configure any number of instances of the span analysis engine 1540 to analyze any number of polygons sequentially, concurrently, or in any combination thereof in any technically feasible fashion.

In some embodiments, to analyze a given input polygon, the span analysis engine 1540 implements, without limitation, any number and/or types of unsupervised clustering operations and/or algorithms and optionally any number and/or types of ranking operations and/or filtering operations to determine one or more directions of boundary edges of the input polygon. In some embodiments, the span analysis engine 1540 implements clustering operations and algorithms that are similar to the clustering operations and algorithms implemented by the base direction engine 410 described previously herein in conjunction with FIG. 4 and/or the grid orientation engine 1142 described previously herein in conjunction with FIG. 11. Notably, the base direction engine 410 determines any number of directions of beams, the grid orientation engine 1142 determines any number of grid orientations, and the span analysis engine 1540 determines any number of edge directions of boundary edges.

More specifically, in some embodiments, to determine an edge direction set (not shown) for a given input polygon, the span analysis engine 1540 determines the unique edge directions represented by the boundary edges of the input polygon. The span analysis engine 1540 weights each of the edge directions based on the total length of the associated boundary edges. Subsequently, the span analysis engine 1540 executes multiple instances of a K-means clustering algorithm on the weighted edge directions based on different combinations of a value of K (i.e., the number of clusters to generate) and seeding to generate multiple edge direction cluster sets. Each edge direction cluster set specifies, without limitation, a different distribution of the weighted edge directions across any number of edge direction clusters.

The span analysis engine 1540 then executes an elbow method heuristic to determine an elbow point based on the edge direction cluster sets. The span analysis engine 1540 ranks the edge direction cluster sets based on increasing distances to the elbow point to determine the highest-ranked edge direction cluster set. Subsequently, the span analysis engine 1540 generates the edge direction set that includes, without limitation, one or more edge directions, where each edge direction specifies the centroid of a different edge direction cluster in the highest-ranked edge direction cluster.

In some embodiments, for each input polygon, the span analysis engine 1540 initializes an instance of a primary direction set 1542 (not explicitly shown) and an instance of a secondary direction set 1544 (not explicitly shown) to empty sets. For each edge direction in the edge direction set, the span analysis engine 1540 determines whether a joist having a length that is equal to the input maximum span (e.g., the maximum joist length 1512) and is perpendicular to the edge direction can span the entire input polygon. If the joist can span the entire input polygon, then the span analysis engine 1540 adds the edge direction to the instance of the primary direction set 1542 as a primary direction. Otherwise, the span analysis engine 1540 adds the edge direction to the instance of the secondary direction set 1544 as a secondary direction.

After analyzing each input polygon, the span analysis engine 1540 outputs the instance of the primary direction set 1542 and the instance of the secondary direction set 1544 associated with the input polygon. In some embodiments, if an instance of the primary direction set 1542 specifies at least one edge direction, then the associated object is spannable in the spanning direction(s) orthogonal to the edge direction(s) specified in the instance of the primary direction set 1542. Otherwise, the associated objective and the associated representation of the object is un-spannable.

In some embodiments, to use the span analysis engine 1540 to determine whether the entire floor structure is spannable, the floor area engine 1520 inputs the maximum joist length 1512 and the floor structure polygon 1522 into the span analysis engine 1540. In response, the span analysis engine 1540 generates an instance of the primary direction set 1542 that the floor area engine 1520 stores as the primary direction set 1542(0) and an instance of the secondary direction set 1544 that the floor area engine 1520 discards. If the primary direction set 1542(0) specifies at least one edge direction, then the floor area engine 1520 determines that the entire floor structure is spannable. Otherwise, the floor area engine 1520 determines that the entire floor structure is un-spannable.

If the floor area engine 1520 determines that the entire floor structure is spannable, then the floor area engine 1520 bypasses the subdivision engine 1550, the block combination engine 1560, and the merge engine 1570. As described in greater detail below, the subdivision engine 1550, the block combination engine 1560, and the merge engine 1570 solve optimization problems involving subdividing portions of the floor structure that are un-spannable, combining different subdivision options, and merging portions of the floor structure into larger spannable portions of the floor structure, respectively.

In some embodiments, to bypass the subdivision engine 1550, the block combination engine 1560, and the merge engine 1570, the floor area engine 1520 inputs the floor structure polygon 1522 and the primary direction set 1542(0) into the spanning combination engine 1580 as a single instance of an optimized partition set 1578 (not explicitly shown) and a single instance of a primary direction set list 1576 (not explicitly shown), respectively. In response, and as described in greater detail below in the context of any number of instances of the optimized partition set 1578 and associated instances of the primary direction set list 1576, the spanning combination engine 1580 generates floor structure layouts 1588(1)-1588(L).

If, however, the floor area engine 1520 determines that the entire floor structure is un-spannable, then the floor area engine 1520 splits the building outline 126 by the room plan 1502 to generate floor area 1530 that includes, without limitation, blocks 1532(1)-1532(B), where B is any positive integer. The floor area engine 1520 can split the building outline 126 by the room plan 1502 in any technically feasible fashion. For instance, in some embodiments, the floor area engine 1520 performs one or more partitioning operation on the building outline 126 based on one or more walls specified in the room plan 1502. In the same or other embodiments, the floor area engine 1520 can extend each of zero or more walls that end in the interior of a room (e.g., at a point that is not connected to any other walls) until the wall meets another wall or a boundary of the room plan 1502.

For explanatory purposes only, the blocks 1532(1)-1532(B) are also referred to herein individually as "the block 1532" and collectively as "the blocks 1532." The floor area 1530 is a template for the floor structure that specifies, without limitation, any number of unclassified walls. Each block 1532 represents a different and non-overlapping portion of the associated floor structure. In some embodiments, each block 1532 represents an arbitrarily shaped portion of the floor area 1530 as a polygon and specifies zero or more walls. In the same or other embodiments, at least one of the blocks 1532 represents a portion of the floor structure that has an arbitrary shape.

In some embodiments, the outline of the room plan 1502 matches the building outline 126, and each of the blocks 1532 corresponds to a different interior portion of the floor, such as a room, corridor, vestibule, etc. In the same or other embodiments, the outline of the room plan 1502 is smaller than the building outline 126, a subset of the blocks 1532 each corresponds to a different interior portion of the floor, and the remainder of blocks 1532 corresponds to other building features that require structural support (e.g., balconies, patios, etc.). In some embodiments, the floor area engine 1520 initializes classifications (not shown) associated with the walls to indicate that each wall is an unclassified wall.

The floor area engine 1520 generates primary direction sets 1542(1)-1542(B) and secondary direction sets 1544(1)-1544(B) based on the blocks 1532(1)-1532(B). The primary direction sets 1542(1)-1542(B) are instances of the primary direction set 1542 associated with the blocks 1532(1)-1532(B), respectively. The secondary direction sets 1544(1)-1544(B) are instances of the secondary direction set 1544 associated with the blocks 1532(1)-1532(B), respectively. For explanatory purposes only, instances of the primary direction set, including the primary direction sets 1542(0)-1542(B,) are also referred to herein individually as "the primary direction set 1542" and collectively as "the primary direction sets 1542." The secondary direction sets 1544(1)-1544(B) are also referred to herein individually as "the secondary direction set 1544" and collectively as "the secondary direction sets 1544."

The floor area engine 1520 can generate the primary direction sets 1542(1)-1542(B) and secondary direction sets 1544(1)-1544(B) in any technically feasible fashion. For instance, in some embodiments, the floor area engine 1520 inputs the maximum joist length 1512 and polygons representing the shapes of the blocks 1532(1)-1532(B), respectively, into the span analysis engine 1540. In response, the span analysis engine 1540 generates and outputs the primary direction sets 1542(1)-1542(B) and the secondary direction sets 1544(1)-1544(B).

As shown, in some embodiments, the subdivision engine 1550 generates a spannable block list 1552 and a subdivided block set list 1558 based on the maximum joist length 1512, the blocks 1532(1)-1532(B), the primary direction sets 1542(1)-1542(B) and the secondary direction sets 1544(1)-1544(B). In some embodiments, the subdivision engine 1550 includes, without limitation, the spannable block list 1552, an un-spannable block list 1554, a subdivision variation engine 1556, and the subdivided block set list 1558.

In some embodiments, the subdivision engine 1550 initializes the spannable block list 1552 and the un-spannable block list 1554 to empty sets. Subsequently, the subdivision engine 1550 adds each of the blocks 1532 to either the un-spannable block list 1554 or the spannable block list 1552. In particular, for an integer x from 1 though B, if the primary direction set 1542(x) is empty, then the subdivision engine 1550 adds the block 1532(x) to the un-spannable block list 1554. Otherwise, the subdivision engine 1550 adds the block 1532(x) to the spannable block list 1552. As shown in italics, S of the blocks 1532 are included in the spannable block list 1552, and (B-S) of the blocks 1532 are included in the un-spannable block list 1554, where S can be any integer from 0 through B.

For explanatory purposes, the blocks 1532 that are included in the spannable block list 1552 are also referred to herein individually as "a spannable block" (not shown in FIG. 15) and collectively as "spannable blocks." Each of the spannable blocks represents a portion of the floor structure that is spannable by joist. The blocks 1532 that are included in the un-spannable block list 1554 are also referred to herein individually as "an un-spannable block" (not shown in FIG. 15) and collectively as "un-spannable blocks." Each of the un-spannable blocks represents a portion of the floor structure that is un-spannable by joist.

As shown, in some embodiments, the subdivision variation engine 1556 generates the subdivided block set list 1558 based on the un-spannable block list 1554. The subdivided block set list 1558 includes, without limitation, a different subdivided block set (not shown) for each of the un-spannable blocks included in the un-spannable block list 1554. In some embodiments, the subdivision engine 1550 generates each subdivided block set independently of the other subdivided block sets. The subdivision variation engine 1556 can generate the subdivided block sets sequentially, concurrently, or in any combination thereof in any technically feasible fashion.

In some other embodiments, any software program (e.g., the room-based design application 1500, the subdivision engine 1550, etc.) can configure each of any number of instances of the subdivision variation engine 1556 to generate the subdivided block set(s) for a different subset of the un-spannable blocks in any technically feasible fashion. The instances of the subdivision variation engine 1556 can collectively generate the subdivided block sets for the un-spannable blocks sequentially, concurrently, or in any combination thereof in any technically feasible fashion. The instances of the subdivision variation engine 1556 and/or any software program can aggregate the subdivided block sets to generate the subdivided block sets list 1558 in any technically feasible fashion.

For each of the un-spannable blocks, the subdivision variation engine 1556 generates the associated subdivided block set (not shown) based on the maximum joist length 1512, the un-spannable block, and the secondary direction set 1544 associated with the un-spannable block. More precisely, for each block 1532(*x*) that is included in the un-spannable block list 1554, the subdivision variation engine 1556 generates a subdivided block set based on the maximum joist length 1512, the block 1532(*x*), and the secondary direction set 1544(*x*).

Each subdivided block set includes, without limitation, one or more subdivided blocks (not shown in FIG. 15), where each of the subdivided blocks specifies, without limitation, the floor structure represented by the associated un-spannable block and a different set of one or more structural members. In some embodiments, the set of one or more structural members included in a given subdivided block partition the subdivided block into a set of subdivisions that are each spannable by joist in the same direction.

In some embodiments, to generate the subdivided block sets, the subdivision variation engine 1556 generates one or more different sets of values for a set of one or more partitioning variables. Each set of values for the set of partitioning variables is also referred to herein as a "partitioning combination." In some embodiments, the subdivision variation engine 1556 generates one or more different partitioning combinations for each un-spannable block.

Each partitioning variable can be associated with any aspect of determining locations of a set of "partitioning" structural members that are to be used to partition un-spannable blocks. For instance, in some embodiments, the set of partitioning variables includes, without limitation, a partitioning direction and an alignment offset. The partitioning direction indicates an orientation of the partitioning structural members. In some embodiments, the valid values for the partitioning direction for a given un-spannable block are specified by the secondary direction set 1544 associated with the un-spannable block. The alignment offset indicates an alignment and/or distribution of an offset between the set of partitioning structural members and the boundary of the un-spannable block in a direction perpendicular to the partitioning direction. In some embodiments, the valid values for the offset alignment include, without limitation, top/left, bottom/right, and equally distributed.

The subdivision variation engine 1556 can determine any number of partitioning combinations in any technically feasible fashion. In some other embodiments, the subdivision variation engine 1556 exhaustively selects all valid sets of values for the sets of partitioning variables to generate the partitioning combinations. In some other embodiments, the subdivision variation engine 1556 can execute any number and/or types of genetic algorithms, any number and/or types of harmony search algorithms, any number and/or types of integer optimization algorithms, any number and/or types of other optimization algorithms and/or optimization operations, or any combination thereof to generate any number of partitioning combinations.

For each partitioning combination, the subdivision variation engine 1556 generates a different set of grid lines for the associated un-spannable block based on the maximum joist length 1512 and the specified values for the partitioning variables. In some embodiments, for a given partitioning combination, the subdivision variation engine 1556 generates an initial set of grid lines that includes, without limitation, any number of grid lines that are parallel to the value specified for the partitioning direction and are spaced uniformly apart at the maximum joist length 1512. The subdivision variation engine 1556 aligns the initial set of grid lines to the un-spannable block as per the value specified for the offset alignment. The subdivision variation engine 1556 adjusts the extent of each grid line to match the extent of the un-spannable block along each grid line.

In some embodiments, the subdivision variation engine 1556 adjusts one or more of the grid lines as per a snap distance associated with feature snap functionality. More precisely, for each grid line that is within the snap distance of an architectural feature (e.g., a wall) specified in the un-spannable block, the subdivision variation engine 1556 automatically snaps the grid line to the architectural feature and adjusts any other grid lines such that the spacing between adjacent grid lines does not exceed the maximum joist length 1512.

In some embodiments, for each set of grid lines for a given un-spannable block, the subdivision variation engine 1556 generates a different subdivided block that specifies, without limitation, the floor structure represented by the un-spannable block and a different set of one or more structural members. Each set of structural members partitions the portion of the floor structure represented by the un-spannable block into a different set of two or more subdivisions, where each subdivision represents a different portion of the floor structure represented by the subdivided block.

The subdivision variation engine 1556 can generate a subdivided block based on a set of grid lines and the associated un-spannable block in any technically feasible fashion. In some embodiments, the subdivision variation engine 1556 performs one or more copy operations to generate a copy of the un-spannable block. For each of the grid lines included in the set of grid lines, the subdivision variation engine 1556 specifies, via the copy of the un-spannable block, a spannable element that corresponds to the grid line. More precisely, for a given grid line, the subdivision variation engine 1556 specifies, via the copy of the un-spannable block, the location and length of a structural member (e.g., a primary beam) that is coincident with the linear portion of the un-spannable block represented by the grid line. After specifying the structural member(s) corresponding to the grid line(s), the subdivision variation engine 1556 partitions the copy of the un-spannable block based on structural members to generate a subdivided block that includes, without limitation, two or more subdivisions.

For each un-spannable block, the subdivision variation engine 1556 generates a subdivided block set that includes, without limitation, the subdivided blocks derived from the un-spannable block. The subdivision variation engine 1556 adds each of the subdivided block sets to the subdivided block set list 1558. Accordingly, as depicted in italics, in some embodiments, the subdivided block set list 1558 includes, without limitation (B-S) subdivided block sets corresponding to (B-S) un-spannable blocks. Importantly, because the subdivision variation engine 1556 ensures that the spacing between grid lines in each grid line set does not exceed the maximum joist length 1512, each subdivision of each subdivided block is spannable by joist.

As shown, in some embodiments, the block combination engine 1560 generates subdivided floor areas 1568(1)-1568(K) based on the spannable block list 1552 and the subdivided block set list 1558, where K is any positive integer. For explanatory purposes only, the subdivided floor areas 1568(1)-1568(K) are also referred to herein individually as "the subdivided floor area 1568" and collectively as "the subdivided floor areas 1568."

Each subdivided floor area 1568 is an aggregation of the spannable blocks included in the spannable block list 1552 and a different combination of one subdivided block from each of the subdivided block sets included in the subdivided block set list 1558. Accordingly, each subdivided floor area 1568 is a different representation of the floor structure that is partitioned into the spannable blocks and a different combination of subdivisions that are each spannable by joist.

The block combination engine 1560 can generate the subdivided floor areas 1568 in any technically feasible fashion. In some embodiments, to generate the subdivided floor areas 1568, the block combination engine 1560 determines any number of combinations of one subdivided block from each of the subdivided block sets included in the subdivided block set list 1558. For explanatory purposes only, each combination of one of the subdivided blocks from each of the subdivided block sets included in the subdivided block set list 1558 is also referred to herein as "a subdivided block combination." In some embodiments, the total number of un-spannable blocks is equal to (B-S), and therefore each subdivided block combination is a different combination of (B-S) subdivided blocks, where each of the subdivided blocks corresponds to a different un-spannable block.

The block combination engine 1560 can determine any number of different subdivided block combinations in any technically feasible fashion. In some embodiments, the block combination engine 1560 exhaustively selects all possible subdivided block combinations based on the subdivided block set list 1558 to generate all possible subdivided block combinations. In some other embodiments, the block combination engine 1560 can execute any number and/or types of genetic algorithms, any number and/or types of harmony search algorithms, any number and/or types of integer optimization algorithms, any number and/or types of other optimization algorithms and/or optimization operations, or any combination thereof to generate any number of subdivided block combinations.

For each subdivided block combination. the block combination engine 1560 can generate the subdivided floor areas 1568 that includes, without limitation, each of the spannable blocks and each of the subdivided blocks specified in the subdivided block combination in any technically feasible fashion. Notable, the portion (e.g., location and size) of the floor structure represented by each subdivided block within the floor area 1530 matches the portion of the floor structure represented by the corresponding un-spannable block.

In some embodiments, to generate the subdivided floor area 1568 corresponding to a given subdivided block combination, the block combination engine 1560 generates a copy of the floor area 1530. The block combination engine then replaces each of the un-spannable blocks in the copy of the floor area 1530 with the subdivided block corresponding to the un-spannable block as per the subdivided block combination. The block combination engine 1560 saves the modified copy of the floor area 1530 as the subdivided floor area 1568 corresponding to the subdivided block combination.

In some other embodiments, the block combination engine 1560 can perform any number and/or types of operations on the spannable blocks, the subset of the subdivided blocks specified in the subdivided block combination, the floor area 1530, the un-spannable blocks, or any combination thereof to generate the subdivided floor area 1568 corresponding to a given block combination. Some examples of types of operations that the block combination engine 1560 can perform to generate each subdivided floor area 1568 include, without limitation, copy operations, replacement operations, substitution operations, and aggregation operations.

As shown, in some embodiments, the merge engine 1570 generates the optimized partition sets 1578(1)-1578(P) and primary direction set lists 1576(1)-1576(P), where P can be any positive integer, based on the subdivided floor areas 1568(1)-1568(K) and the maximum joist length 1512. The primary direction set lists 1576(1)-1576(P) are associated with the optimized partition sets 1578(1)-1578(P), respectively. For explanatory purposes only, the optimized partition sets 1578(1)-1578(P) are also referred to herein individually as "the optimized partition set 1578" and collectively as "the optimized partitions sets 1578." The primary direction set lists 1576(1)-1576(P) are also referred to herein individually as "the primary direction set list 1576" and collectively as "the primary direction set lists 1576."

In some embodiments, including the embodiment depicted in FIG. 15, the room-based design application 1500 includes, without limitation, a single instance of the merge engine 1570 that generates at least one of optimized partition set 1578 and at least one of primary direction set list 1576 for each of the subdivided floor areas 1568. In the same or other embodiments, the merge engine 1570 can generate the optimized partition sets 1578(1)-1578(L) and the primary direction set lists 1576(1)-1576(L) sequentially, concurrently, or in any combination thereof in any technically feasible fashion.

In some other embodiments, the room-based design application 1500 can configure each of any number of instances of the merge engine 1570 to generate a subset of the optimized partition sets 1578 and a subset of the primary direction set lists 1576 corresponding to a different subset of the subdivided floor areas 1568 in any technically feasible fashion. The instances of the merge engine 1570 can collectively generate the optimized partition sets 1578 and the primary direction set lists 1576 sequentially, concurrently, or in any combination thereof in any technically feasible fashion.

As described previously herein, in some embodiments, each subdivided floor area 1568 is a representation of the floor structure that is partitioned into a different set of zero or more subdivisions that are each spannable by joist and the same set of zero or more spannable blocks. Each of the optimized partition sets 1578 is a representation of the floor structure that is partitioned into zero or more merge groups that are spannable by joist, zero or more subdivisions that are spannable by joist, and zero or more spannable blocks. For explanatory purposes only, merge groups, subdivisions, and spannable blocks are also referred to herein individually as a "partition" and collectively as "partitions." Accordingly, each of the optimized partition sets 1578 includes, without limitation, any number of partitions, where each partition is spannable by joist. The primary direction set lists 1576(1)-1576(P) specify, without limitation, the primary direction set 1542 for each partition included in the optimized partition sets 1578(1)-1578(P), respectively.

For each subdivided floor area 1568, the merge engine 1570 can generate any number of optimized partition sets 1578 based on the subdivided floor area 1568 in any technically feasible fashion. In some embodiments, for each of any number of the subdivided floor areas 1568, the merge engine 1570 sets one of the optimized partition sets 1578 equal to the subdivided floor area 1568. In the same or other embodiments, for each of any number of the subdivided floor areas 1568, the merge engine 1570 performs any number and/or types of merging operations on the subdivided floor area 1568 to generate any number of optimized partition sets 1578 that each includes, without limitation, at least one merge group that is spannable by joist.

Each merge group replaces a corresponding group of multiple subdivisions, multiple spannable blocks, or at least one subdivision and at least one spannable block. Therefore, each merge group represents the same contiguous portion of the floor structure as the corresponding group of multiple subdivisions, multiple spannable blocks, or at least one subdivision and at least one spannable block. In some embodiments, the merge engine 1570 can recursively merge each merge group with at least one subdivision or spannable block that is not included in any merge group to incrementally grow the merge group. For each subdivided floor area 1568, the merge engine 1570 can generate any number of optimized partition sets 1578 in any technically feasible fashion.

For instance, in some embodiments, for an integer x from 1 through P, the merge engine 1570 implements an iterative merging process to derive the optimized partition set 1578(x) from the subdivided floor area 1568(x) based on a greedy algorithm that forms spannable merge groups by aggregating neighboring partitions in order from smallest to largest. During an initialization phase, the merge engine 1570 copies the subdivided floor area 1568(x) to the optimized partition set 1578(x) and sets the primary direction set list 1576(x) equal to an empty list. The merge engine 1570 sorts the subdivisions and the spannable blocks included in the subdivided floor area 1568(x) into a ranked partition list in increasing order of area. For explanatory purposes only, at any point in time, the subdivisions and the spannable blocks that are included in the ranked partition list are referred to herein individually as an "available partition" and collectively as "available partitions."

To initiate the iterative merging process, the merge engine 1570 executes a "new merge group" Iteration. During each new merge group iteration, the merge engine 1570 selects and removes the smallest available partition from the ranked partition list. The merge engine 1570 then selects and removes from the ranked partition list the smallest available partition that is also a neighbor of the selected available partition. The merge engine 1570 merges the two selected available partitions to generate a potential merge group. The merge engine 1570 uses the span analysis engine 1540 and the maximum joist length 1512 to determine the primary direction set 1542 for the potential merge group.

If the merge engine 1570 determines that the primary direction set 1542 is empty, then the merge engine 1570 determines that the potential merge group is not spannable by joist and discards the potential merge group. The merge engine 1570 deselects the selected available partitions and then executes another new merge group iteration to generate a new potential merge group.

If, however, the merge engine 1570 determines that the primary direction set 1542 includes at least one primary direction, then the merge engine 1570 generates a new merge group that is equal to the potential merge group. The merge engine 1570 modifies the optimized partition set 1578(x) to specify the merge group instead of the selected available partitions. The merge engine 1570 also updates the primary direction set list 1576(x) to specify that the primary direction set 1542 is associated with the merge group. The merge engine 1570 selects the merge group instead of the selected available partitions and then executes an "expansion" iteration.

During each expansion iteration, the merge engine 1570 selects and removes from the ranked partition list the smallest available partition that is also a neighbor of the selected merge group. The merge engine 1570 merges the selected merge group and the selected available partition to generate an expanded potential merge group. The merge engine 1570 uses the span analysis engine 1540 and the maximum joist length 1512 to determine the primary direction set 1542 for the expanded potential merge group.

If the merge engine 1570 determines that the primary direction set 1542 is empty, then the merge engine 1570 determines that the expanded potential merge group is not spannable by joist and discards the expanded potential merge group. The merge engine 1570 deselects the selected available partition and the selected merge group and then executes another new merge group iteration to generate a new potential merge group.

If, however, the merge engine 1570 determine that the primary direction set 1542 includes at least one primary direction, then the merge engine 1570 generates a new merge group that is equal to the expanded potential merge group. The merge engine 1570 modifies the optimized partition set 1578(x) to specify the new merge group instead of the selected available partition and the selected merge group. The merge engine 1570 also updates the primary direction set list 1576(x) to specify that the primary direction set 1542 is associated with the new merge group. The merge engine 1570 selects the new merge group instead of the selected available partition and the selected merge group and then executes another "expansion" iteration. The merge engine 1570 continues to recursively grow the selected merge group in the fashion described above until the merge engine 1570 determines that the expanded potential merge group is not spannable by joist.

The merge engine 1570 can determine when to cease iterating based on any technically feasible criteria. For instance, in some embodiments, the merge engine 1570 ceases iterating after selecting all of the available partitions. After the merge engine 1570 ceases iterating, the optimized partition set 1578(x) includes, without limitation, zero or more merge groups, zero or more spannable blocks, and zero or more subdivisions.

In some other embodiments, the merge engine 1570 can implement any number and/or types of algorithm in any technically feasible fashion to derive any number of optimized partition sets 1578 from each subdivided floor area 1568. For instance, in some embodiments, the merge engine 1570 implements an exhaustive algorithm that generates and analyzes all possible merges to determine a single optimized set of merge groups. For example, suppose that the subdivided area 1568(x) included 26 partitions A-Z, and the partitions A-C could be combined into a single spannable merge group. The merge engine 1570 could generate and analyze all possible combinations of merge groups that include zero or more of partitions D-Z as well as none of A-C, all of A-C, A and neither B nor C, B and neither A nor C, C and neither A nor B, A and B but not C, A and C but not B, or B and C but not A, The merge engine 1570 can determine the primary direction set list 1576(x) in any technically feasible fashion. For instance, in some embodiments that implement the iterative merging process described above, the merge engine 1570 updates the primary direction set list 1576(x) to specify the primary direction sets 1542 for each of the merge groups included in the optimized partition set 1578(x) when generating the optimized partition sets 1578(x). In some such embodiments, the merge engine 1570 updates the primary direction set list 1576(x) to also specify the primary direction sets 1542 for each subdivision and each spannable block included in the optimized partition set 1578(x). The merge engine 1570 can determine the primary direction sets 1542 for any of the partitions in any technically feasible fashion. For instance, in some embodiments, the floor area engine 1520 previously computed the primary direction sets 1542 for each of the spannable, and the merge engine 1570 uses the span analysis engine 1540 and the maximum joist length 1512 to determine the primary direction set 1542 for each of the subdivisions included in the optimized partition set 1578(x).

In some embodiments, the merge engine 1570 determines classifications for any number of unclassified walls specified in the optimized partition set 1578(x) and updates the optimized partition set 1578(x) to specify the classifications. The merge engine 1570 can evaluate any number of the partitions, the primary direction sets 1542 for any number of the partitions, any amount and/or types of other data, or any combination thereof to classify any number of unclassified walls. For instance, in some embodiments, for each merge group, the merge engine 1570 classifies each unclassified wall that is in the interior of the merge group as a non-load bearing wall.

As shown, in some embodiments, the spanning combination engine 1580 generates floor structure layouts 1588(1)-1588(L) and the non-structural wall datasets 1586(1)-1586(L) based on the optimized partition sets 1578(1)-1578(P), the primary direction set lists 1576(1)-1576(P), any portion (including none) of the floor instructions 1510, and any portion (including none) of the design instructions 130. For explanatory purposes only, the floor structure layouts 1588(1)-1588(L) are also referred to herein individually as "the floor structure layout 1588" and collectively as "the floor structure layouts 1588."

In some embodiments, including the embodiment depicted in FIG. 15, the room-based design application 1500 includes, without limitation, a single instance of the spanning combination engine 1580. For an integer x from 1 through P, the spanning combination engine 1580 generates a subset of the floor structure layouts 1588 and a corresponding subset of the non-structural wall datasets 1586 based on the optimized partition set 1578(x) and the primary direction set list 1576(x). In the same or other embodiments, the spanning combination engine 1580 can generate the floor structure layouts 1588(1)-1588(L) and the non-structural wall datasets 1586(1)-1586(L) sequentially, concurrently, or in any combination thereof in any technically feasible fashion.

In some other embodiments, the room-based design application 1500 can configure each of any number of instances of the spanning combination engine 1580 to generate a different subset of the floor structure layouts 1588 and a corresponding subset of the non-structural wall datasets 1586 based on a different subset of the optimized partition sets 1578 and a corresponding subset of the primary direction set list 1576 in any technically feasible fashion. The instances of the spanning combination engine 1580 can collectively generate the floor structure layouts 1588(1)-1588(L) and the non-structural wall datasets 1586(1)-1586(L) sequentially, concurrently, or in any combination thereof in any technically feasible fashion.

Each of the floor structure layouts 1588 is a different layout of the floor structure that enables the floor associated with the room plan 1502 to resist vertical loads (e.g., gravity). In some embodiments, each of the floor structure layouts 1588 specifies, without limitation, locations, types, and materials for any number and/or types of structural members included in the floor structure. In some embodiments, the spanning combination engine 1580 uses the poly-quad data structure described previously herein to represent the locations of any number and/or types of arbitrarily shaped structural members. In the same or other embodiments, each of the floor structure layouts 1588 optionally includes, without limitation, any amount and/or type of initial sizing data for any number and/or types of the structural members.

For an integer x from 1 through P, the spanning combination engine 1580 can generate any number of floor structure layouts 1588 based on the optimized partition sets 1578(x) and the primary direction set list 1576(x) in any technically feasible fashion. For instance, in some embodiments, the spanning combination engine 1580 determines any number of different spanning combinations (not shown) based on the primary direction set list 1576(x). For each partition included in the optimized partition set 1578(x), each of the spanning combinations specifies a spanning direction (not shown) for the partition that is orthogonal to one of the primary directions for the partition.

The spanning combination engine 1580 can determine any number of spanning combinations for the optimized partition set 1578(x) in any technically feasible fashion. As described previously herein, in some embodiments, the primary direction set list 1576(x) specifies, without limitation, the primary direction set 1542 for each partition included in the optimized partition set 1578(x). In the same or other embodiments, to generate the spanning combinations for the optimized partition set 1578(x), the spanning combination engine 1580 exhaustively selects all possible combinations of one primary direction from each primary direction set 1542 that is included in the primary direction set list 1576(x) to generate all possible primary direction combinations. The spanning combination engine 1580 replaces each primary direction included in each primary direction combination with a spanning direction that is orthogonal to the primary direction to generate all possible spanning combinations.

In some other embodiments, the spanning combination engine 1580 can execute any number and/or types of genetic algorithms, any number and/or types of harmony search algorithms, any number and/or types of integer optimization algorithms, any number and/or types of other optimization algorithms and/or optimization operations, or any combination thereof to generate any number of spanning combinations for the optimized partition set 1578(x) based on the primary direction set list 1576(x).

The spanning combination engine 1580 can generate the floor structure layout 1588 for each spanning combination associated with the optimized partition set 1578(x) in any technically feasible fashion. For an integer y from 1 to L, the spanning combination engine 1580 generates the floor structure layout 1588(y) based on one of the optimized partition sets 1578 and a corresponding spanning combination. In some embodiments, the spanning combination engine 1580 initializes the floor structure layout 1588(y) to specify, without limitation, locations, types, and materials for any number and/or types of structural members that are specified in the partitions included in the optimized partition set 1578 associated with the floor structure layout 1588(y). Some examples of structural members that the spanning combination engine 1580 can specify when initializing the floor structure layout 1588(y) include, without limitation, primary beams used to subdivide un-spannable blocks and load bearing walls.

In the same or other embodiments, the spanning combination engine 1580 evaluates each partition associated with the floor structure layout 1588(y) in conjunction with the associated spanning direction specified via the spanning combination. In some embodiments, for each partition and the associated spanning direction, the spanning combination engine 1580 classifies zero or more unclassified walls that are coincident with at least a portion of the boundary of the partition as load bearing walls that are to be loaded by a slab. In the same or other embodiments, for each partition and the associated spanning direction, the spanning combination engine 1580 specifies any number and/or types of additional structural members via the floor structure layout 1588(y). For instance, in some embodiments, for each partition and the associated spanning direction, the spanning combination engine specifies, via the floor structure layout 1588(y), zero of more load bearing walls and zero or more joists along the spanning direction. Each of the joists spans between any two structural members (e.g., load bearing walls, primary beams, etc.). In some embodiments, for each load bearing wall that the spanning combination engine 1580 adds to the floor structure layout 1588(y), the spanning combination engine 1580 also adds at least one joist that rests on the load bearing wall to the floor structure layout 1588(y).

The spanning combination engine 1580 can determine the number and/or types of joists to add to the floor structure based on the floor instructions 1510, the design instructions 130, or any combination thereof. For instance, in some embodiments, the spanning combination engine 1580 can determine the joist spacing with which to span between two structural members based on the distance between the structural members in the spanning direction, the floor instructions 1510, the design instructions 130, or any combination thereof.

In the same or other embodiments, the spanning combination engine 1580 evaluates each partition associated with the floor structure layout 1588(y) in conjunction with the associated spanning direction to classify any remaining unclassified walls. The spanning combination engine 1580 can classify each unclassified wall based on the spanning direction, the floor instructions 1510, the design instructions 130, the structural members, or any combination thereof. As part of classifying an unclassified wall as a load bearing wall, the spanning combination engine 1580 specifies the load bearing wall via the floor structure layout 1588(y).

The spanning combination engine 1580 specifies each wall that is included in the room plan 1502 but is not included in the floor structure layout 1588(y) as a non-load bearing wall via the non-structural wall datasets 1586(y). In some embodiments, the spanning combination engine 1580 can specify, via the non-structural wall dataset 1586(y), any amount (including none) and/or types of additional data associated with the non-load bearing walls. For instance, in some embodiments, the spanning combination engine 1580 can specify, via the non-structural wall dataset 1586(y) any number of locations, materials, sub-types, or any combination thereof for each non-load bearing wall.

As shown, in some embodiments, the structure sizing engines 1590(1)-1590(L) generate the floor structure designs 1598(1)-1598(L) and optionally the floor objective values 1596(1)-1596(L), respectively, based on the floor structure layouts 1588(1)-1588(L), respectively, any portion (including none) of the design instructions 130, and any portion (including none) of the floor instructions 1510.

In some embodiments, the structure sizing engines 1590(1)-1590(L) are different instances of a single software application referred to herein as "the structure sizing engine 1590." For explanatory purposes only, the structure sizing engines 1590(1)-1590(L) are also referred to individually as "the structure sizing engine 1590" and collectively as "the structure sizing engines 1590." In some embodiments, the number of structure sizing engines 1590 can differ from the number of floor structure layouts 1588, and the techniques described herein are modified accordingly. In the same or other embodiments, any number of structure sizing engines 1590 can execute sequentially, concurrently, or in any combination thereof.

As described previously herein, each floor structure design 1598 specifies a design of a structural system that incorporates zero or more of the room walls as load bearing walls, and defines any room walls that are not incorporated into the structural system as non-load bearing walls. Each design of the structural system enables the floor associated with the room plan 1502 to resist vertical loads.

In some embodiments, the structure sizing engines 1590(1)-1590(L) add and/or optimize sizing for the structural members specified in the floor structure layouts 1588(1)-1588(L), respectively, to generate the floor structure designs 1598(1)-1598(L), respectively. In the same or other embodiments, the structure sizing engines 1590(1)-1590(L) compute the floor objective values 1596(1)-1596(L) that quantify degrees of convergence of the floor structure designs 1598(1)-1598(L), respectively, with the design objectives.

The structure sizing engine 1590(x), where x is an integer from 1 through L, can generate the floor structure design 1598(x) and optionally compute the floor objective value 1596(x) in any technically feasible fashion. In some embodiments, the structure sizing engine 1590(x) determines initial sizing for the structural members specified in the floor structure layout 1588(x) to generate an initial floor structure design (not shown). The structure sizing engine 1590(x) can determine the initial sizing for the structural members in any technically feasible fashion. For instance, in some embodiments, the structure sizing engine 1590(x) determines the initialize sizing based on any number and/or type of defaults.

In some embodiments, the structure sizing engine 1590(x) performs any number and/or types of optimization operations on the sizing for the structural members specified in the initial floor structure design based on the constraints 132 and the objective function 134 without taking lateral loads into account to generate the floor structure design 1598(x) and the floor objective value 1596(x). The structure sizing engine 1590(x) can optimize the sizing of the structural members specified in the initial floor structure design in any technically feasible fashion to generate the floor structure design 1598(x).

In some embodiments, the structure sizing engine 1590(x) can implement any number of optimization techniques that are the same as or similar to optimization techniques implemented by the gravity design optimizer 260 and/or the sizing engine 1330 in various embodiments. The gravity design optimizer 260 was described in detail previously herein in conjunction with FIG. 3. The sizing engine 1330 was described in detail previously herein in conjunction with FIG. 13.

For instance, in some embodiments, the structure sizing engine 1590(x) sequentially optimizes the sizing of any number of slabs, any number of beams, any number of joists, any number of columns, and any number of load bearing walls based on the constraints 132 and the objective function 134 while taking into account vertical loads. Accordingly, the floor structure design 1598(x) is a version of the initial floor structure design that is optimized to resist vertical loads based on the objective function 134.

In some embodiments, the floor objective value 1596(x) quantifies a degree of convergence of the floor structure design 1598(x) with the design objectives. The structure sizing engine 1590(x) can compute the floor objective value 1596(x) in any technically feasible fashion. In some embodiments, the structure sizing engine 1590(x) uses the objective function 134 to compute the floor objective value 1596(x) for the floor structure design 1598(x). In the same or other embodiments, the structure sizing engine 1590(x) uses the objective function 134 to compute objective values for any number of partially optimized versions of the initial floor structure design while optimizing the sizing of the structural members.

As shown, in some embodiments, the specification engine 1592 generates the ranked design list 1594 based on the floor structure designs 1598(1)-1598(L), the floor objective values 1596(1)-1596(L), and the non-structural wall datasets 1586(1)-1586(L). In some embodiments, the ranked design list 1594 specifies, without limitation, a subset of the floor structure designs 1598, a corresponding subset of the floor objective values 1596, and a corresponding subset of non-structural wall datasets 1586.

In some embodiments, the specification engine 1592 can perform any number and/or types of filtering operations, and number and/or types of ranking operations, any number and/or types of other operations, or any combination thereof on the floor structure designs 1598, the floor objective values 1596, and the non-structural wall datasets 1586 to generate the ranked design list 1594.

For instance, in some embodiments, the specification engine 1592 sets a variable R equal to the minimum of the number of floor structure designs 1598 and the maximum variation count (denoted as N) that is specified in the parameter data 138. The specification engine 1592 ranks the floor structure designs 1598 in order of descending convergence with the design criteria as per the floor objective values 1596. The specification engine 1592 then generates the ranked design list 1594 that includes, without limitation, the R best of the floor structure designs 1598 in order of descending convergence with the design criteria, the corresponding R of the floor objective values 1596, and the corresponding R of the non-structural wall datasets 1586.

In some embodiments, the structural design application 120, the specification engine 1592, the room-based design application 1500, or any combination thereof store and/or transmit any portions of the ranked design list 1594, any number of the floor structure designs 1598, any number of the floor objective values 1596, any number of the non-structural wall datasets 1586, or any combination thereof to any number and/or type of software applications in any technically feasible fashion.

Advantageously, incorporating any amount (including all) of the functionality described herein in the context of the room-based design application 1500 into a CAD application can increase the likelihood that the CAD application can generate a floor structure that is convergent with the design objectives. Relative to conventional CAD applications, because the room-based design application 1500 automatically decomposes the overall design problem into multiple constituent optimization problems, the structural design application 120 can more efficiently and systematically explore the design space of the structural system. In that regard, in some embodiments, the room-based design application 1500 solves constituent optimization problems to subdivide un-spannable blocks, combine subdivided blocks, merge subdivisions and spannable blocks, combine per-partition spanning directions, and optimize the sizing of structural members. Furthermore, the room-based design application 1500 automatically optimizes the classification of walls while solving the constituent optimization problems.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments.

FIG. 16A is an exemplar illustration of two of the subdivided floor areas 1568 of FIG. 15, according to various embodiments. More specifically, FIG. 16A depicts examples of the subdivided floor areas 1568(1) and 1568(K), where K is the total number of subdivided floor areas 1568. As shown, the walls of the subdivided floor areas 1568 are unclassified walls 1694.

As described previously herein in conjunction with FIG. 15, in some embodiments, the floor area 1530 includes, without limitation, any number of spannable blocks and any number of un-spannable blocks. Each of the subdivided floor areas 1568(1)-1568(K), includes, without limitation, the spannable blocks and a different combination of subdivided blocks, where each subdivided block replaces one of the un-spannable blocks. Each subdivided block includes, without limitation, any number of structural members that partition the subdivided block into at least two subdivisions, where each subdivisions is spannable by the joist as per the maximum joist length 1512.

Although not shown, for the example depicted in FIG. 16A, the floor area 1530 includes, without limitation, spannable blocks 1610(1)-1610(5) and three un-spannable blocks. As shown, the subdivided floor area 1568(1) includes, without limitation, the spannable blocks 1610(1)-1610(5), a subdivided block 1630(1), a subdivided block 1630(2), and a subdivided block 1630(3). The subdivided block 1630(1) specifies, without limitation, a primary beam 1622(1) that partitions the portion of the floor structure represented by the subdivided block 1630(1) horizontally into portions of the floor structure represented by subdivisions 1620(1) and 1620(2). The subdivided block 1630(2) specifies, without limitation, a primary beam 1622(2) that partitions the portion of the floor structure represented by the subdivided block 1630(2) vertically into portions of the floor structure represented by subdivisions 1620(3) and 1620(4). The subdivided block 1630(3) specifies, without limitation, a primary beam 1622(3) that partitions the portion of the floor structure represented by the subdivided block 1630(3) vertically into portions of the floor structure represented by subdivisions 1620(5) and 1620(6).

By contrast, the subdivided floor area 1568(K) includes, without limitation, the spannable blocks 1610(1)-1610(5), a subdivided block 1630(4), the subdivided block 1630(2), and the subdivided block 1630(3). The subdivided block 1630(4) specifies, without limitation, a primary beam 1622

(4) that is aligned with the primary beam 1622(2) and partitions the portion of the floor structure represented by the subdivided block 1630(4) vertically into portions of the floor structure represented by subdivisions 1620(7) and 1620(8). Notably, the only difference between the subdivided floor areas 1568(1) and 1568(K) is that an un-spannable block positioned in the lower left corner of the floor area 1530 is replaced by the subdivided block 1630(1) in the subdivided floor area 1568(1) and is replaced by the subdivided block 1630(4) in the subdivided floor area 1568(K).

FIG. 16B is an exemplar illustration of two of the optimized partition sets 1578 of FIG. 15, according to various embodiments. As described previously herein in conjunction with FIG. 15, the merge engine 1570 generates the optimized partition sets 1578(1)-1578(P) based on the subdivided floor areas 1568(1)-1568(K). In some embodiments, including the embodiment depicted in FIG. 16B, the merge engine 1570 generates the optimized partition sets 1578(1)-1578(K) based on the subdivided floor areas 1568(1)-1568(K), respectively. Accordingly, the total number of optimized partition sets 1578 (denoted as P in FIGS. 15 and 16B) is equal to the total number of subdivided floor areas 1568 (denoted as K in FIGS. 15, 16A, and 16B). For explanatory purposes only, the merge engine 1570 generates the optimized partition sets 1578(1) and 1578(K) depicted in FIG. 16B based on the subdivided floor areas 1568(1) and 1578(K), respectively, depicted in FIG. 16A.

For the subdivided floor area 1568(1), the merge engine 1570 merges the spannable blocks 1610(4) and 1610(5) and the subdivision 1620(3) to generate merge group 1650(1). Also for the subdivided floor area 1568(1), the merge engine 1570 merges the subdivisions 1620(4) and 1620(5) to generate merge group 1650(2). Still for the subdivided floor area 1568(1), the merge engine 1570 merges the spannable blocks 1610(1)-1610(3) and the subdivision 1620(6) to generate merge group 1650(3). Consequently, the optimized partition set 1578(1) includes, without limitation, the subdivisions 1620(1) and 1620(2) and the merge groups 1650(1)-1650(3). As also shown, the merge engine 1570 classifies the six unclassified walls 1694 that are inside one or more of the merge groups 1650(1)-1650(3) as non-load bearing walls 1696.

By contrast, for the subdivided floor area 1568(K), the merge engine 1570 merges the spannable blocks 1610(4) and 1610(5) and the subdivisions 1620(3) and 1620(7) to generate merge group 1650(4). Also for the subdivided floor area 1568(K), the merge engine 1570 merges the subdivisions 1620(4), 1620(5), and 1620(8) to generate merge group 1650(5). Still for the subdivided floor area 1568(K), the merge engine 1570 merges the spannable blocks 1610(1)-1610(3) and the subdivision 1620(6) to generate merge group 1650(6). Consequently, the optimized partition set 1578(2) includes, without limitation, the merge groups 1650(4)-1650(6). As also shown, the merge engine 1570 classifies the ten unclassified walls 1694 that are inside one of the merge groups 1650(4)-1650(6) as non-load bearing walls 1696.

As illustrated by FIGS. 16A and 16B, by decomposing the overall design optimization problem into multiple simpler optimization problems, the room-based design application 1500 can more efficiently and systematically explore the design space of the structural system for the floor.

FIG. 17 is a flow diagram of method steps for generating floor structure designs for a building based on a room plan, according to various embodiments. Although the method steps are described with reference to the systems of FIGS. 1-6, 11-13, and 15-16, persons skilled in the art will understand that any system configured to implement the method steps, in any order, falls within the scope of the present invention.

As shown, a method 1700 begins a step 1702, where the floor area engine 1520 determines zero or more primary directions for a floor structure based on the building outline 126 and the maximum joist length 1512. At step 1704, the floor area engine 1520 determines whether the entire floor structure is spannable based on the primary directions for the floor structure. If, at step 1704, the floor area engine 1520 determines that the entire floor structure is not spannable, then the method 1700 proceeds directly to step 1708.

At step 1708, the floor area engine 1520 splits the building outline 126 by the room plan 1502 to generate any number of blocks 1532 of a floor area 1530. At step 1710, for each block 1532, the floor area engine 1520 determines zero or more primary directions and zero or more secondary directions based on the maximum joist length 1512. At step 1712, for each block 1532 without a primary direction, the subdivision engine 1550 generates at least one subdivided block based on the associated secondary direction(s) and the maximum joist length 1512.

At step 1714, the block combination engine 1560 combines blocks 1532 having at least one primary direction with combinations of the subdivided blocks to generate subdivided floor areas 1568. At step 1716, the merge engine 1570 performs one or more merging operations on each subdivided floor area 1568 based on the maximum joist length 1512 to generate optimized partition sets 1578.

Referring back now to step 1704. If, at step 1704, the floor area engine 1520 determines that the entire floor structure is spannable, then the method 1700 proceeds to step 1706. At step 1706, the floor area engine 1520 generates an instance of the optimized partition set 1578 that includes the floor structure polygon 1522. The method 1700 then proceeds directly to step 1718.

At step 1718, for each optimized partition set 1578, the spanning combination engine 1580 generates any number of floor structure layouts 1588 and any number of non-structural wall datasets 1586 based on combination(s) of the primary directions. At step 1720, the structure sizing engine 1590 determines optimized sizing for the floor structure layouts 1588 based on the constraints 132 and the objective function 134 to generate floor structure designs 1598 and floor objective values 1596. At step 1722, the specification engine 1592 ranks and optionally filters the floor structure designs 1598 and the non-structural wall datasets 1586 based on the floor objective values 1596 to generate the ranked design list 1594. At step 1724, the room-based design application 1500 stores and/or transmits any portion of the ranked design list 1594 to any number of software applications for use in further design activities, The method 1700 then terminates.

In sum, the disclosed techniques can be used to efficiently generate designs for a structural system of a building based on a building plan, any number and type of constraints, an objective function that encapsulates any number and/or types of design objectives, and zero or more building wind loads. In some embodiments, a structural design application breaks the overall design optimization problem into multiple, less complex constituent optimization problems associated with different aspects of the structural system. The structural design application executes an overall design flow that dynamically self-adjusts based on results generating while solving the constituent optimization problems to generate a ranked structural design list for the structural system. The ranked structural design list specifies any number of structural designs for the structural system of the building and the corresponding values of the objective function or "building objective values." Each of the designs is optimized based on the constraints, the objective function, gravity, and the building wind loads. The structural designs are listed in the ranked structural design list in descending order of degree of convergence with the design objectives as per the building objective values.

To initiate the overall design flow, the structural design application configures a gravity design application to generate a specified number of gravity designs based on the building plan, the constraints, and the objective function. Each of the gravity designs specifies, without limitation, locations, types, materials, and sizing of any number of slabs, any number of beams, and any number of columns. Notably, each of the gravity designs is optimized based on the constraints, and the objective function while taking into account gravity but not the building wind loads.

The gravity design application implements a branch-merge design flow to generate the gravity designs. During the branching phase, the gravity design application partitions each floor of the structural system into multiple segments and then implements a rule-based expert system to generate a variety of segments layouts for each of the segments. Each of the segment layouts specifies, without limitation, locations, types, and materials for any number of slabs, any number of beams, and any number of columns.

The gravity design application configures a gravity design optimizer to independently optimize sizing data for each of the segment layouts to generate optimized segment designs. To optimize the sizing data for a given segment layout, the gravity design application sequentially optimizes the sizing data for the constituent slabs, beams, and columns based on the constraints and the objective function while taking into account gravity (as live loads and dead loads) but not the building wind loads. The gravity design application also computes objective values for each of the segment designs based on the objective function. For each segment, the gravity design application ranks the associated segment designs based on the objective values to generate a ranked segment design list. The ranked segment design list for a given segment includes, without limitation, the N highest ranked segment designs for the segment and the associated objective values, where N is a parameter value that can be any positive integer.

During the merging phase, the gravity design application generates multiple floor designs for each floor based on the associated ranked segment design lists. For a given floor, the gravity design application performs per-segment, incremental merging based on the associated ranked segment design lists. After each incremental merge, the gravity design application configures the gravity design optimizer to optimize the resulting merged design and compute the associated objective value. After performing the final per-segment incremental merge, the gravity design application generates a ranked floor design list for the floor that includes, without limitation, N designs for the associated floor and the associated objective values. The N designs for the associated floors are the N highest ranked optimized merged designs of the subset of the optimized merged layouts that represent the entire floor. The gravity design application then implements a genetic algorithm that searches the ranked floor design lists for the different floors to generate N different gravity designs for the structural system.

Subsequently, the structural design application configures a grid generation application to generate any number of frame grids based on the N gravity designs. Each frame grid includes, without limitation, any number of grid lines along which lateral load resisting frames are to be aligned. For each of the gravity designs, the grid generation application selects the beams that are connected to at least one column and generates an edge set that includes, without limitation, a different edge for each of the selected beams. The grid generation application then generates a weighted direction set based on the directions of the edges included in the edge set. The grid generation application executes a K-means clustering algorithm on the weighted direction set multiple times based on different combinations of seedings and number of clusters to generate different direction cluster sets. Subsequently, the grid generation application applies an elbow method heuristic to the direction cluster sets to determine an elbow point and ranks the direction cluster sets based on the distances to the elbow point to generate a ranked direction cluster set list. For each cluster included in the highest ranked direction cluster set, the grid generation application generates a base direction that is equal to the direction associated with the centroid of the cluster.

The grid generation application generates a weighted equation set based on the equations of the edges included in the edge set and the objective values of the associated gravity designs. For each of the base directions, the grid generation application determines a corresponding weighted equation subset that includes, without limitation, the weighted equations that are approximately parallel to the base direction. For each of the weighted equation subsets, the grid generation application uses the K-mean clustering algorithm and the elbow method heuristic to generate a ranked equation cluster set list. The grid generation application then generates any number of frame grids based on the ranked equation cluster set lists. For each of the base directions, each frame grid includes, without limitation, one or more grid lines that are approximately parallel to the base direction.

For each unique combination of one of the gravity designs and one of the frame grids, the structural design application configures a different instance of an iterative optimization application to generate a different structural design for the structural system and an associated building objective value. Each structural design for the structural system is optimized based on the constraints and the objective function while taking into account gravity and the building wind loads.

Each instance of the iterative optimization application includes, without limitation, a different instance of a frame specification application and a different instance of an iterative sizing application. In operation, the iterative optimization application executes any number of design optimization iterations via the frame specification application and the iterative sizing application.

To execute a first design optimization iteration, the iterative optimization application inputs a gravity design, a frame grid, and any number of wind directions into the frame specification application. In response, the frame specification application generates a frame system specification that specifies, without limitation, locations for at least one frame that provides lateral resistance for each wind direction. Subsequently, the iterative optimization application inputs the gravity design, the frame system specification, the building wind loads, the constraints, and the objective function into the iterative sizing application. In response, the iterative optimization application generates a first version of a structural design and computes the associated building objective value.

To execute each of any number of subsequent design optimization iterations, the iterative optimization application inputs the building objective value computed during the prior design optimization iteration into the frame specification application. In response, the frame specification application re-generates the frame system specification. Subsequently, the iterative optimization application inputs the gravity design, the re-generated frame system specification, the building wind loads, the constraints, and the objective function into the iterative sizing application. In response, the iterative optimization application generates a new version of the structural design and computes the associated building objective value.

During the first design optimization iteration, for each of the wind directions, the frame specification application generates a different potential frame location set based on the frame grid and the gravity design. Each of the potential frame location sets includes, without limitation, the locations of a different subset of potential frames with respect to the gravity design, where the subsets are mutually exclusive. Based on the gravity design, the frame specification application sets a building load centroid equal the total dead load across all the floors of the building. For each of the wind directions, the frame specification application then bifurcates the associated potential frame location set into a left frame group and a right frame group based on the building load centroid.

The frame specification application configures a genetic algorithm to iteratively and collectively optimize left frame counts and right frame counts for the left frame groups and the right frame groups, respectively, based on the building objective value associated with the prior iteration (and computed by the iterative sizing application). Each of the left frame counts is a design variable of the genetic algorithm that can range from 1 to the total number of locations in the associated left frame group. Similarly, each of the right frame counts is a design variable of the genetic algorithm that can range from 1 to the total number of locations in the associated right frame group.

Still during the first design iteration, the frame specification application causes the genetic algorithm to randomly determine the left frame counts and the right frame counts. For each of the left frame groups, the frame specification application selects the associated left frame count of locations from the left frame group in order of decreasing distance from the building load centroid. Similarly, for each of the right frame groups, the frame specification application selects the associated right frame count of locations from the right frame group in order of decreasing distance from the building load centroid. The frame specification application then generates the frame system specification that includes, without limitation, the selected locations.

During each subsequent design optimization iteration, the frame specification application receives the building objective value that is computed by the iterative sizing application during the prior design optimization iteration. The frame specification application inputs the building objective value into the genetic algorithm. In response, the genetic algorithm re-determines the left frame counts and the right frame counts. Based on the left frame counts and the right frame counts, the frame specification application re-generates the frame system specification.

During each design optimization iteration, the iterative sizing application generates a structural design based on the gravity design, the frame system specification associated with the design optimization iteration, the constraints, the objective function, and the building wind loads. The structural design specifies a structural system that resists live loads, dead loads, and the building wind loads as per any number of the constraints. The iterative sizing application also computes the building objective value for the structural design based on the objective function.

In operation, the iterative sizing application modifies the gravity design based on the frame system specification to generate a current structural design that includes, without limitation, a frame system. Each of any number of frames specifications derived from the frame system specifications specifies, without limitation, a group of one or more beams and one or more columns included in the current structural design that are interconnected via rigid joints. The iterative sizing application also initializes the member lateral loads for the slabs, beams, and columns of the current structural design to zero.

Subsequently, the iterative sizing application defines and solves a nested optimization problem to optimize the sizing of the beams and the columns included in the current structural design based on the objective function, the constraints, gravity, and the building wind loads. The iterative sizing application includes, without limitation, a structural system iteration controller, a frame system iteration controller, and a frame iteration engine.

The structural system iteration controller executes any number of top loop iterations to solve a top layer of the nested optimization problem and thereby solve the nested optimization problem. To initiate a top loop iteration, the structural system iteration controller executes a gradient-based beam optimization algorithm that iteratively optimizes the sizing data for the beams based on the objective function and the constraints, updating the dead loads after each iteration while keeping the member wind loads fixed. Subsequently, the structural system iteration controller executes a gradient-based column optimization algorithm that iteratively optimizes the sizing data for the columns based on the objective function and the constraints, updating the dead loads after each iteration while keeping the member wind loads fixed.

The frame system iteration controller then configures the frame system iteration controller to execute any number of middle loop iterations to solve a middle layer of the nested optimization problem with respect to the top loop iteration. Solving the middle layer of the nested optimization problem corresponds to optimizing the sizing of the columns and beams in the frame system based on the building wind loads.

To initiate each middle loop iteration, the frame system iteration controller distributes the building wind loads across the frames included in the current structural design to generate one or more frame lateral loads for each of the frames. For each of the frames, the frame system iteration controller configures a different instance of the frame iteration engine to independently solve a bottom layer of the nested optimization problem with respect to the middle loop iteration. Solving the bottom layer of the nested optimization problem for a given frame corresponds to optimizing the sizing of the beams and columns specified via the corresponding frame specification while holding the associated frame lateral loads fixed.

The frame iteration engine executes any number of bottom loop iterations to solve the bottom layer of the nested optimization for a given frame with respect to the middle loop iteration. To initiate each bottom loop iteration, the frame iteration engine generates a bending moment diagram and a shear diagram for the frame based on the frame lateral loads and the vertical loads associated with the frame. The frame iteration engine then iteratively and jointly optimizes the sizing of the beams and the columns in the frame based on the bending moment diagram, the shear diagram, the objective function, and the constraints. After the frame iteration engine optimizes the sizing of the beams and the columns, the bottom loop iteration is complete.

The frame iteration engine can determine whether to execute another bottom loop iteration in any technically feasible fashion. If the frame iteration engine does not execute another bottom loop iteration, then the frame iteration engine indicates to the frame system iteration controller that the frame iteration engine has solved the bottom layer of the nested optimization problem for the frame with respect to the middle loop iteration.

After the frame system iteration controller determines that the bottom layer of the nested optimization problem for each of the frames in the frame system with respect to the middle loop iteration is complete, the frame system iteration controller determines whether to execute another middle loop iteration. If the frame system iteration controller does not execute another middle loop iteration, then the frame system iteration controller indicates to the structural system iteration controller that the frame system iteration controller has solved the middle layer of the nested optimization problem with respect to the top loop iteration.

The structural system iteration controller can determine whether to execute another top loop iteration in any technically feasible fashion. If the structural system iteration controller does not execute another top loop iteration, then the structural system iteration controller sets the structural design for the design optimization iteration equal to the current structural design. The system iteration controller also computes the building objective value for the structural design. The iterative sizing application then provides the structural design and the building objective value to the iterative optimization application, and the design optimization iteration is complete.

In response, the iterative optimization application determines whether to execute another design optimization iteration. The iterative optimization application can determine when to execute another design optimization iteration in any technically feasible fashion (e.g., when the building objective value reaches a target value). If the iterative optimization application does not execute another design optimization application, then the iterative optimization application provides the most recent version of the structural design and the associated building objective value to the structural design application.

After all of the instances of the iterative optimization application have provided structural designs and associated building objective values to the structural design application, the structural design application generates the ranked structural design list. The structural design application then stores and/or transmits any portions of the ranked structural design to any number and/or type of software applications in any technically feasible fashion.

In some embodiments, the overall design flow described above can be used to automatically generate structural designs for buildings having rectangular shapes. In the same or other embodiments, the structural design application includes, without limitation, a grid-based design application that automatically generates structural systems for arbitrarily shaped floors. In some embodiments, the grid-based design application uses a poly-quad data structure to efficiently represent arbitrary shapes as quads and polygons. In the same or other embodiments, a floor outline is partitioned into one or more arbitrarily shaped regions, where each region is associated with region instructions. The region instructions for a given region specify, without limitation, a structure type for the region, domain knowledge for the structure type, and any number and/or types of grid constraints.

In some embodiments, a structural grid corresponding to a given grid orientation includes, without limitation, zero or more grid lines that are parallel to the grid orientation and zero or more grid lines that are perpendicular to the grid orientation. For each region, the grid-based design application generates a different structural grid for each valid permutation of grid orientation, grid spacing, grid aspect ratio, offset, and feature snap as per the region instructions. The grid-based design application applies each structural grid to the associated region to generate a gridded region, where the grid lines partition the gridded region into grid modules that represent slabs.

The grid-based design application selects a spanning direction for each slab represented by each gridded region based on associated domain knowledge and an arbitration direction that can increase the consistency of the selected spanning directions. For each gridded region, the grid-based design application generates a region layout based on the associated spanning directions and the associated domain knowledge. For each region layout, the grid-based design application initializes and optimizes the sizing of the structural members based on the constraints, the objective function, and optionally any other relevant data to generate a region design for the structural system and a corresponding region objective value.

For each region, the grid-based design application ranks and optionally filters the associated region designs based on the corresponding objective values to generate a ranked region design list. Subsequently, the grid-based design application implements a genetic algorithm to selects different combinations of the region designs. For each selected combination of the region designs, the grid-based design application aggregates the specified region designs to generate a corresponding floor design and then computes a corresponding floor objective value. Subsequently, the grid-based design application generates a ranked floor design list based on the floor designs and the associated floor objective values. The grid-based design application then stores and/or transmits any portions of the ranked floor design list to any number and/or type of software applications.

In some embodiments, the structural design application configures a room-based design application to generate floor structure designs and associated floor objective values for a floor of a building based on the design instructions, a building outline, a room plan, and floor instructions. The room plan specifies, without limitation, any number of walls defining any number of rooms. Each of the floor structure designs is a different design for the floor structure that enables the floor to resist vertical loads and can incorporate zero or more of the walls as load bearing walls. In some embodiments, the structural design application generates a different non-structural wall dataset for each floor structure design. Each non-structural wall dataset specifies, without limitation, zero or more non-load bearing walls, where each non-load bearing wall is specified in the room plan but is not specified in the associated floor structure design.

In operation, the room-based design application partitions the building outline based on the room plan to generate a floor area that includes, without limitation, any number of blocks. For each of the blocks, the room-based design application inputs a polygon representing the block and a maximum joist length into a span analysis engine to determine any number of primary directions and number of secondary directions for the block. Upon receiving an input polygon and an input maximum length, the span analysis engine performs clustering operations on the directions of the boundary edges of the input polygon to determine one or more edge directions. For each edge direction, if the maximum extent of the input polygon in a direction orthogonal to the edge direction is less than or equal to the maximum joist length, then the span analysis engine determines that the edge direction is a primary direction for the polygon. Otherwise, the span analysis engine determines that the edge direction is a secondary direction for the polygon.

For each block that is associated with at least one primary direction, the room-based design application determines that the block is spannable by joist and classifies the block as a spannable block. For each block that is not associated with any primary direction, the room-based design application determines that the block in not spannable by joist and classifies the block as an un-spannable block. For each of the un-spannable blocks, the room-based design application determines different combinations of the associated secondary directions and an offset alignment. The room-based design application subdivides each un-spannable block based on each associated combination to generate subdivided blocks. Each subdivided block includes, without limitation, any number of subdivisions that are each spannable by joist in at least one direction. Subsequently, the room-based design application implements a genetic algorithm to select different combinations of the subdivided blocks and the spannable blocks. For each combination of subdivided blocks and the spannable blocks, the room-based design application generates a different subdivided floor area.

For each subdivided floor area, the grid-based design application performs zero or more merge operations on the subdivisions and the spannable blocks to generate any number of optimized partition sets. Each optimized partition set includes, without limitation, any number of partitions, where each partition can be a merge group, a subdivision, or a spannable block and is associated with at least one primary direction. For each optimized partition set, the room-based design application generates one or more floor structure layouts based on combinations of the primary directions associated with partitions. The room-based design application classifies each of the walls of each of the floor structure layouts as load bearing or non-load bearing and generates any number of joists based on any amount and and/or types of domain knowledge. For each of the floor structure layouts, the room-based design application generates an associated non-structural wall dataset that specifies, without limitation, the non-load bearing walls.

The room-based design application independently optimizes sizing data for each floor structure layout based on the constraints, the objective function, and any number of other design instructions to generate a floor structure design and a corresponding floor objective value. The room-based design application generates a ranked design list that specifies, without limitation, the floor structure designs ranked and/or filtered based on the floor objective values, the corresponding floor objective values, and the corresponding non-structural wall datasets. The room-based design application stores and/or transmits any portions of the ranked design list to any number and/or type of software applications for use in further design activities.

At least one technical advantage of the disclosed techniques relative to the prior art is that the disclosed techniques can be incorporated into a CAD application to enable the CAD application to automatically explore a design space to identify regions where the structural system of a building is optimized for any number of design objectives. In that regard, with the disclosed techniques, a CAD application is able to break a complex overall design optimization problem into simpler optimization problems involving different aspects of a structural system design. Accordingly, the CAD application is able to explore the overall design in a far more efficient and systematic fashion. This functionality, which is not available in conventional CAD applications, increases the likelihood that an optimized design for the structural system that is convergent with building design objectives can be identified and generated. These technical advantages provide one or more technological improvements over prior art approaches.

1. In some embodiments, a computer-implemented method for automatically generating a design for a structural system of a building comprises generating a first structural grid based on a first region within a computer-aided design of the building; applying the first structural grid to the first region to generate a first gridded region; computing a plurality of spanning directions based on the first gridded region; and generating at least a portion of the design for the structural system based on the plurality of spanning directions and the first gridded region.

2. The computer-implemented method of clause 1, wherein the first region represents a first arbitrarily shaped portion of a floor of the building.

3. The computer-implemented method of clauses 1 or 2, wherein generating the first structural grid comprises performing one or more clustering operations based on a plurality of boundary edges associated with the first region to determine a grid orientation; and generating one or more grid lines that are parallel to the grid orientation and one or more grid lines that are perpendicular to the grid orientation based on the first region and at least one of a grid spacing, a grid aspect ratio, or an offset alignment.

4. The computer-implemented method of any of clauses 1-3, wherein generating the first structural grid comprises performing one or more clustering operations based on a plurality of boundary edges associated with the first region to determine a plurality of grid orientations; executing one or more optimization algorithms based on the plurality of grid orientations and a plurality of grid spacings to determine a first grid variable combination that specifies a first grid orientation included in the plurality of grid orientations and a first grid spacing included in the plurality of grid spacings; and generating a plurality of grid lines based on the first grid variable combination.

5. The computer-implemented method of any of clauses 1-4, wherein applying the first structural grid to the first region comprises partitioning the first region into a plurality of grid modules that are included in the first gridded region based on the first structural grid.

6. The computer-implemented method of any of clauses 1-5, wherein computing the plurality of spanning directions comprises determining that a first spanning length associated with a first edge of a first slab is shorter than a second spanning length associated with a second edge of the first slab; setting a first spanning direction associated with the first slab equal to a direction that is orthogonal to the first edge; and aggregating the first spanning direction and at least a second spanning direction associated with a second slab.

7. The computer-implemented method of any of clauses 1-6, wherein generating the at least a portion of the design for the structural system comprises generating an initial region design that specifies at least one slab and at least one joist based on the first gridded region and the plurality of spanning directions; and executing at least one optimization algorithm on the initial region design based on one or more constraints and one or more design objectives to generate a first portion of the design for the structural system.

8. The computer-implemented method of any of clauses 1-7, wherein the one or more design objectives include at least one of minimizing total weight, minimizing embodied carbon, minimizing material cost, or minimizing material waste.

9. The computer-implemented method of any of clauses 1-8, wherein the at least a portion of the design for the structural system comprises a first region design, and further comprising aggregating at least the first region design and a second region design associated both a second region within the computer-aided design of the building and a second structural grid to generate the design for the structural system.

10. The computer-implemented method of any of clauses 1-9, wherein the shape of a slab represented by a portion of the first gridded region is based on one or more grid lines included in the first structural grid.

11. In some embodiments, one or more non-transitory computer readable media include instructions that, when executed by one or more processors, cause the one or more processors to automatically generate a design for a structural system of a building by performing the steps of generating a first structural grid based on a first region within a computer-aided design of the building; applying the first structural grid to the first region to generate a first gridded region; computing a plurality of spanning directions based on the first gridded region; and generating at least a portion of the design for the structural system based on the plurality of spanning directions and the first gridded region.

12. The one or more non-transitory computer readable media of clause 11, wherein the first region represents a first arbitrarily shaped portion of a floor of the building.

13. The one or more non-transitory computer readable media of clauses 11 or 12, wherein generating the first structural grid comprises performing one or more clustering operations based on a plurality of boundary edges associated with the first region to determine a grid orientation; generating one or more grid lines that are parallel to the grid orientation and one or more grid lines that are perpendicular to the grid orientation; and modifying at least one of the one or more grid lines that are parallel to the grid orientation based on a first architectural feature represented by the first region.

14. The one or more non-transitory computer readable media of any of clauses 11-13, wherein generating the first structural grid comprises performing one or more clustering operations based on a plurality of boundary edges associated with the first region to determine a plurality of grid orientations; executing one or more optimization algorithms based on the plurality of grid orientations and a plurality of grid spacings to determine a first grid variable combination that specifies a first grid orientation included in the plurality of grid orientations and a first grid spacing included in the plurality of grid spacings; and generating a plurality of grid lines based on the first grid variable combination.

15. The one or more non-transitory computer readable media of any of clauses 11-14, wherein applying the first structural grid to the first region comprises partitioning the first region into a plurality of grid modules that are included in the first gridded region based on the first structural grid.

16. The one or more non-transitory computer readable media of any of clauses 11-15, wherein computing the plurality of spanning directions comprises determining that a first spanning length associated with a first edge of a first slab is within an arbitration range of a second spanning length associated with a second edge of the first slab; determining a first spanning direction based on a first direction associated with the first edge, a second direction associated with the second edge, and an arbitration direction; and aggregating the first spanning direction and at least a second spanning direction associated with a second slab.

17. The one or more non-transitory computer readable media of any of clauses 11-16, wherein generating the at least a portion of the design for the structural system comprises generating an initial region design that specifies at least one slab and at least one joist based on the first gridded region and the plurality of spanning directions; and executing at least one optimization algorithm on the initial region design based on one or more constraints and one or more design objectives to generate a first portion of the design for the structural system.

18. The one or more non-transitory computer readable media of any of clauses 11-17, wherein the one or more design objectives include at least one of minimizing total weight, minimizing embodied carbon, minimizing material cost, or minimizing material waste.

19. The one or more non-transitory computer readable media of any of clauses 11-18, wherein the at least a portion of the design for the structural system comprises a first region design, and further comprising generating a second region design based on the first region and a second structural grid; determining that a first degree of convergence between the first region design and one or more design objectives is higher than a second degree of convergence between the second region design and the one or more design objectives; and in response, aggregating at least the first region design and a third region design associated with a second region within the computer-aided design of the building to generate the design for the structural system.

20. In some embodiments, a system comprises one or more memories storing instructions and one or more processors coupled to the one or more memories that, when executing the instructions, perform the steps of generating a first structural grid based on a first region within a computer-aided design of a building; applying the first structural grid to the first region to generate a first gridded region; computing a plurality of spanning directions based on the first gridded region; and generating at least a portion of a design for a structural system of the building based on the plurality of spanning directions and the first gridded region.

Any and all combinations of any of the claim elements recited in any of the claims and/or any elements described in this application, in any fashion, fall within the contemplated scope of the embodiments and protection.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. Aspects of the present embodiments can be embodied as a system, method, or computer program product. Accordingly, aspects of the present disclosure can take the form of an entirely hardware embodiment, an entirely software embodiment (including firmware, resident software, micro-code, etc.) or an embodiment combining software and hardware aspects that can all generally be referred to herein as a "module," a "system," or a "computer." In addition, any hardware and/or software technique, process, function, component, engine, module, or system described in the present disclosure can be implemented as a circuit or set of circuits. Furthermore, aspects of the present disclosure can take the form of a computer program product embodied in one or more computer readable media having computer readable program codec embodied thereon.

Any combination of one or more computer readable media can be utilized. Each computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory, a read-only memory, an erasable programmable read-only memory, a Flash memory, an optical fiber, a portable compact disc read-only memory, an optical storage device, a magnetic storage device, or any suitable combination of the foregoing. In the context of this document, a computer readable storage medium can be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions can be provided to a processor of a general-purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams can represent a module, segment, or portion of code, which comprises one or more executable instructions for implementing the specified logical function (s). It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure can be devised without departing from the basic scope thereof, and the scope thereof is determined by the claims that follow.

What is claimed is:

1. A computer-implemented method for automatically generating a design for a structural system of a building, the method comprising:
    generating a first structural grid based on a first region within a computer-aided design of the building;
    applying the first structural grid to the first region to generate a first gridded region;
    computing a plurality of spanning directions for a plurality of slabs based on the first gridded region and based on whether the design for the structural system is to include at least one joist; and
    generating at least a portion of the design for the structural system based on the plurality of spanning directions for the plurality of slabs and the first gridded region.

2. The computer-implemented method of claim 1, wherein the first region represents a first arbitrarily shaped portion of a floor of the building.

3. The computer-implemented method of claim 1, wherein generating the first structural grid comprises:
    performing one or more clustering operations based on a plurality of boundary edges associated with the first region to determine a grid orientation; and
    generating one or more grid lines that are parallel to the grid orientation and one or more grid lines that are perpendicular to the grid orientation based on the first region and at least one of a grid spacing, a grid aspect ratio, or an offset alignment.

4. The computer-implemented method of claim 1, wherein generating the first structural grid comprises:
    performing one or more clustering operations based on a plurality of boundary edges associated with the first region to determine a plurality of grid orientations;
    executing one or more optimization algorithms based on the plurality of grid orientations and a plurality of grid spacings to determine a first grid variable combination that specifies a first grid orientation included in the plurality of grid orientations and a first grid spacing included in the plurality of grid spacings; and
    generating a plurality of grid lines based on the first grid variable combination.

5. The computer-implemented method of claim 1, wherein applying the first structural grid to the first region comprises partitioning the first region into a plurality of grid modules that are included in the first gridded region based on the first structural grid.

6. The computer-implemented method of claim 1, wherein computing the plurality of spanning directions for the plurality of slabs comprises:
    determining that a first spanning length associated with a first edge of a first slab of the plurality of slabs is shorter than a second spanning length associated with a second edge of the first slab of the plurality of slabs;
    setting a first spanning direction associated with the first slab of the plurality of slabs equal to a direction that is orthogonal to the first edge; and
    aggregating the first spanning direction and at least a second spanning direction associated with a second slab of the plurality of slabs.

7. The computer-implemented method of claim 1, wherein generating the at least a portion of the design for the structural system comprises:
    generating an initial region design that specifies at least one slab and at least one joist based on the first gridded region and the plurality of spanning directions for the plurality of slabs; and executing at least one optimization algorithm on the initial region design based on one or more constraints and one or more design objectives to generate a first portion of the design for the structural system.

8. The computer-implemented method of claim 7, wherein the one or more design objectives include at least one of minimizing total weight, minimizing embodied carbon, minimizing material cost, or minimizing material waste.

9. The computer-implemented method of claim 1, wherein the at least a portion of the design for the structural system comprises a first region design, and further comprising aggregating at least the first region design and a second region design associated with both a second region within the computer-aided design of the building and a second structural grid to generate the design for the structural system.

10. The computer-implemented method of claim 1, wherein a shape of a slab of the plurality of slabs represented by a portion of the first gridded region is based on one or more grid lines included in the first structural grid.

11. One or more non-transitory computer readable media including instructions that, when executed by one or more processors, cause the one or more processors to automatically generate a design for a structural system of a building by performing the steps of:
generating a first structural grid based on a first region within a computer-aided design of the building;
applying the first structural grid to the first region to generate a first gridded region;
computing a plurality of spanning directions for a plurality of slabs based on the first gridded region and based on whether the design for the structural system is to include at least one joist; and
generating at least a portion of the design for the structural system based on the plurality of spanning directions for the plurality of slabs and the first gridded region.

12. The one or more non-transitory computer readable media of claim 11,
wherein the first region represents a first arbitrarily shaped portion of a floor of the building.

13. The one or more non-transitory computer readable media of claim 11, wherein generating the first structural grid comprises:
performing one or more clustering operations based on a plurality of boundary edges associated with the first region to determine a grid orientation;
generating one or more grid lines that are parallel to the grid orientation and one or more grid lines that are perpendicular to the grid orientation; and
modifying at least one of the one or more grid lines that are parallel to the grid orientation based on a first architectural feature represented by the first region.

14. The one or more non-transitory computer readable media of claim 11, wherein generating the first structural grid comprises:
performing one or more clustering operations based on a plurality of boundary edges associated with the first region to determine a plurality of grid orientations;
executing one or more optimization algorithms based on the plurality of grid orientations and a plurality of grid spacings to determine a first grid variable combination that specifies a first grid orientation included in the plurality of grid orientations and a first grid spacing included in the plurality of grid spacings; and
generating a plurality of grid lines based on the first grid variable combination.

15. The one or more non-transitory computer readable media of claim 11, wherein applying the first structural grid to the first region comprises partitioning the first region into a plurality of grid modules that are included in the first gridded region based on the first structural grid.

16. The one or more non-transitory computer readable media of claim 11, wherein computing the plurality of spanning directions for the plurality of slabs comprises:
determining that a first spanning length associated with a first edge of a first slab of the plurality of slabs is within an arbitration range of a second spanning length associated with a second edge of the first slab;
determining a first spanning direction based on a first direction associated with the first edge, a second direction associated with the second edge, and an arbitration direction; and
aggregating the first spanning direction and at least a second spanning direction associated with a second slab of the plurality of slabs.

17. The one or more non-transitory computer readable media of claim 11, wherein generating the at least a portion of the design for the structural system comprises:
generating an initial region design that specifies at least one slab of the plurality of slabs and at least one joist based on the first gridded region and the plurality of spanning directions for the plurality of slabs; and
executing at least one optimization algorithm on the initial region design based on one or more constraints and one or more design objectives to generate a first portion of the design for the structural system.

18. The one or more non-transitory computer readable media of claim 17, wherein the one or more design objectives include at least one of minimizing total weight, minimizing embodied carbon, minimizing material cost, or minimizing material waste.

19. The one or more non-transitory computer readable media of claim 11, wherein the at least a portion of the design for the structural system comprises a first region design, and further comprising:
generating a second region design based on the first region and a second structural grid;
determining that a first degree of convergence between the first region design and one or more design objectives is higher than a second degree of convergence between the second region design and the one or more design objectives; and
in response, aggregating at least the first region design and a third region design associated with a second region within the computer-aided design of the building to generate the design for the structural system.

20. A system comprising:
one or more memories storing instructions; and
one or more processors coupled to the one or more memories that, when executing the instructions, perform the steps of:
generating a first structural grid based on a first region within a computer-aided design of a building;
applying the first structural grid to the first region to generate a first gridded region;
computing a plurality of spanning directions for a plurality of slabs based on the first gridded region and based on whether the design for the building is to include at least one joist; and
generating at least a portion of a design for a structural system of the building based on the plurality of spanning directions for the plurality of slabs and the first gridded region.

* * * * *